(12) United States Patent
Matsumoto et al.

(10) Patent No.: US 6,841,400 B2
(45) Date of Patent: Jan. 11, 2005

(54) METHOD OF MANUFACTURING SEMICONDUCTOR DEVICE HAVING TRENCH ISOLATION

(75) Inventors: Takuji Matsumoto, Tokyo (JP); Mikio Tsujiuchi, Tokyo (JP); Toshiaki Iwamatsu, Tokyo (JP); Shigenobu Maeda, Tokyo (JP); Yuuichi Hirano, Tokyo (JP); Shigeto Maegawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 17 days.

(21) Appl. No.: 10/216,363

(22) Filed: Aug. 12, 2002

(65) Prior Publication Data

US 2003/0153136 A1 Aug. 14, 2003

(30) Foreign Application Priority Data

Feb. 14, 2002 (JP) .................................... 2002-036563

(51) Int. Cl.[7] ............................................ H01L 21/762
(52) U.S. Cl. ................................................. 438/7; 438/9
(58) Field of Search ............................. 438/404, 7, 8, 438/9, 16, FOR 222; 257/E21.53

(56) References Cited

U.S. PATENT DOCUMENTS

| | | | | |
|---|---|---|---|---|
| 5,393,370 A | * | 2/1995 | Ohta et al. .................... | 438/8 |
| 5,399,233 A | * | 3/1995 | Murazumi et al. ............ | 438/7 |
| 6,190,949 B1 | * | 2/2001 | Noguchi et al. .............. | 438/149 |
| 6,372,655 B2 | * | 4/2002 | Khan et al. .................. | 438/714 |
| 6,642,066 B1 | * | 11/2003 | Halliyal et al. ............... | 438/16 |
| 6,656,755 B1 | * | 12/2003 | Ohkawa ....................... | 438/16 |
| 6,673,635 B1 | * | 1/2004 | Hellig et al. .................. | 438/7 |

FOREIGN PATENT DOCUMENTS

JP 2000-243973 9/2000

OTHER PUBLICATIONS

J. Y. Chen, Cmos Devices and Technology for Vlsi, pp. 266–267, "7.3.3 Retrograde Well Technologies to Improve Isolation", 1990.

* cited by examiner

*Primary Examiner*—George Fourson
(74) *Attorney, Agent, or Firm*—Oblon, Spivak, McClelland, Maier & Neustadt, P.C.

(57) ABSTRACT

The invention relates to improvements in a method of manufacturing a semiconductor device in which deterioration in a transistor characteristic is avoided by preventing a channel stop implantation layer from being formed in an active region. After patterning a nitride film (22), the thickness of an SOI layer 3 is measured (S2) and, by using the result of measurement, etching conditions (etching time and the like) for SOI layer 3 are determined (S3). To measure the thickness of SOI layer 3, it is sufficient to use spectroscopic ellipsometry which irradiates the surface of a substance with linearly polarized light and observes elliptically polarized light reflected by the surface of a substance. The etching condition determined is used and a trench TR2 is formed by using patterned nitride film 22 as an etching mask (S4).

7 Claims, 49 Drawing Sheets

F I G. 1
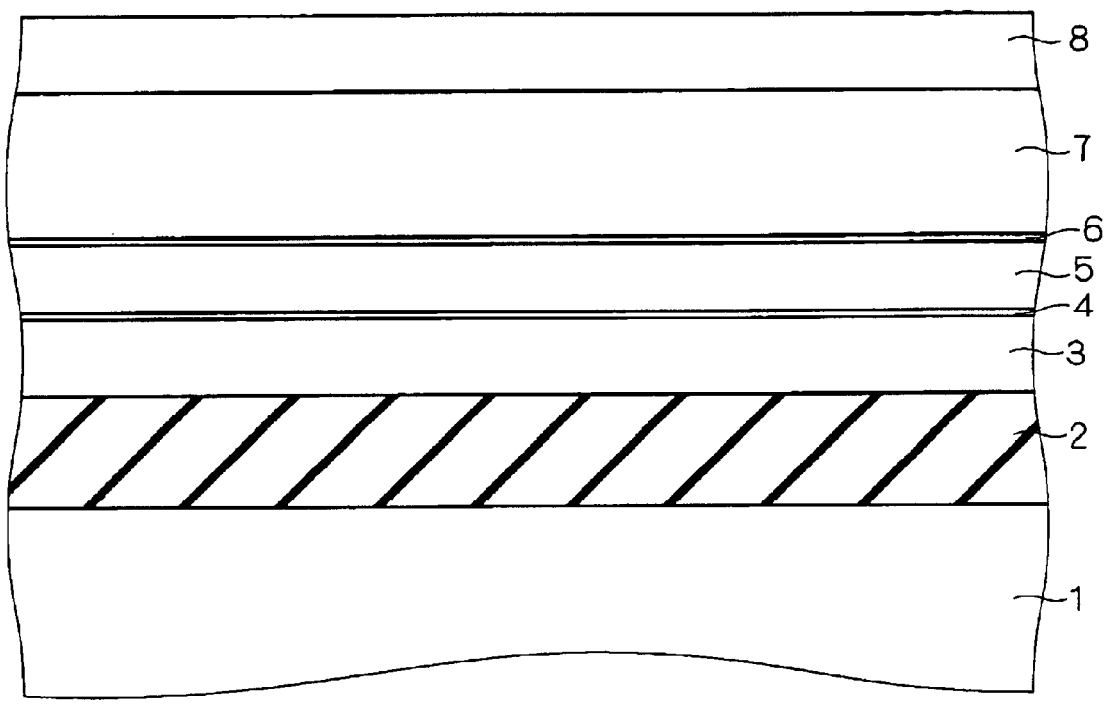

F I G. 2
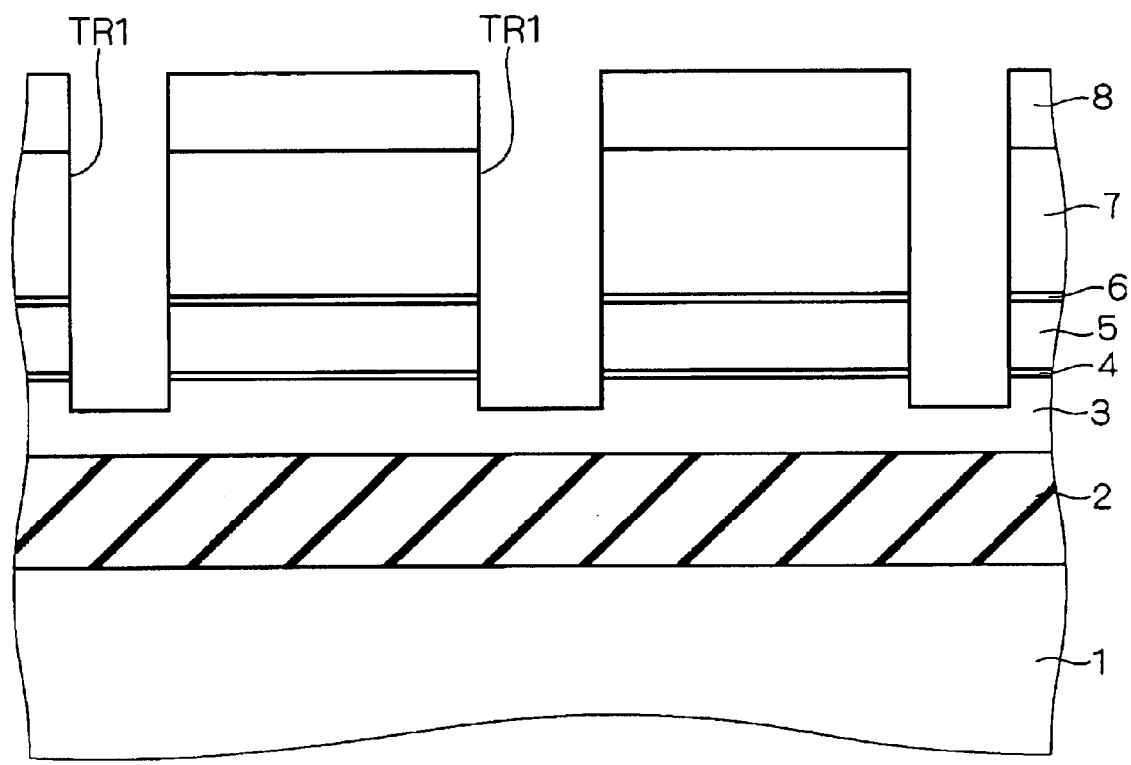

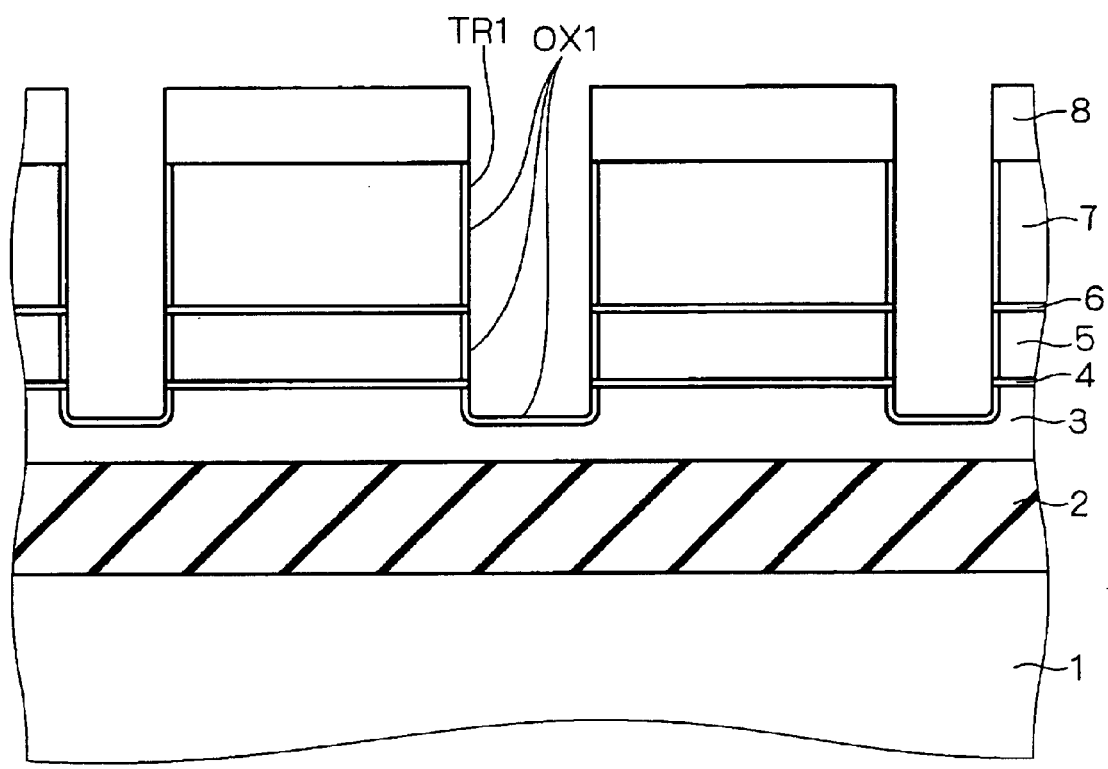
F I G . 3

F I G . 7
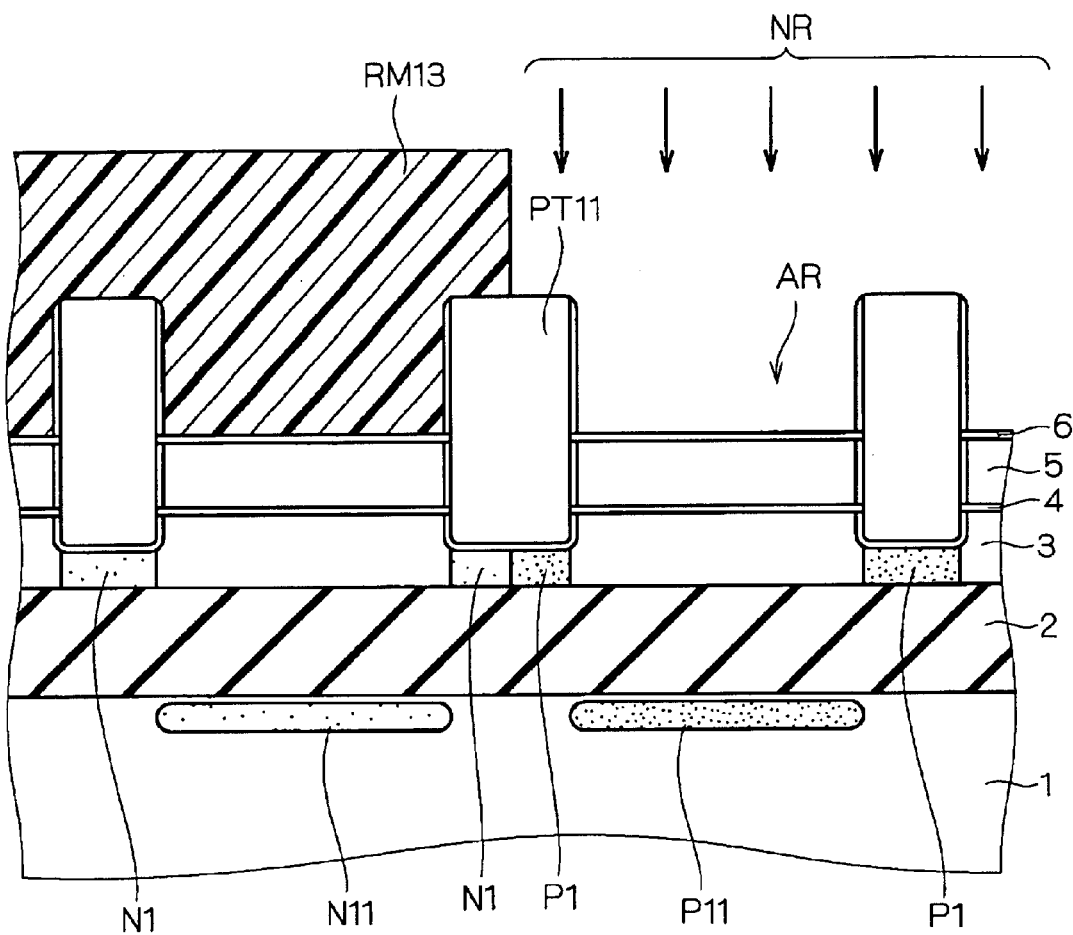

F I G . 2 1
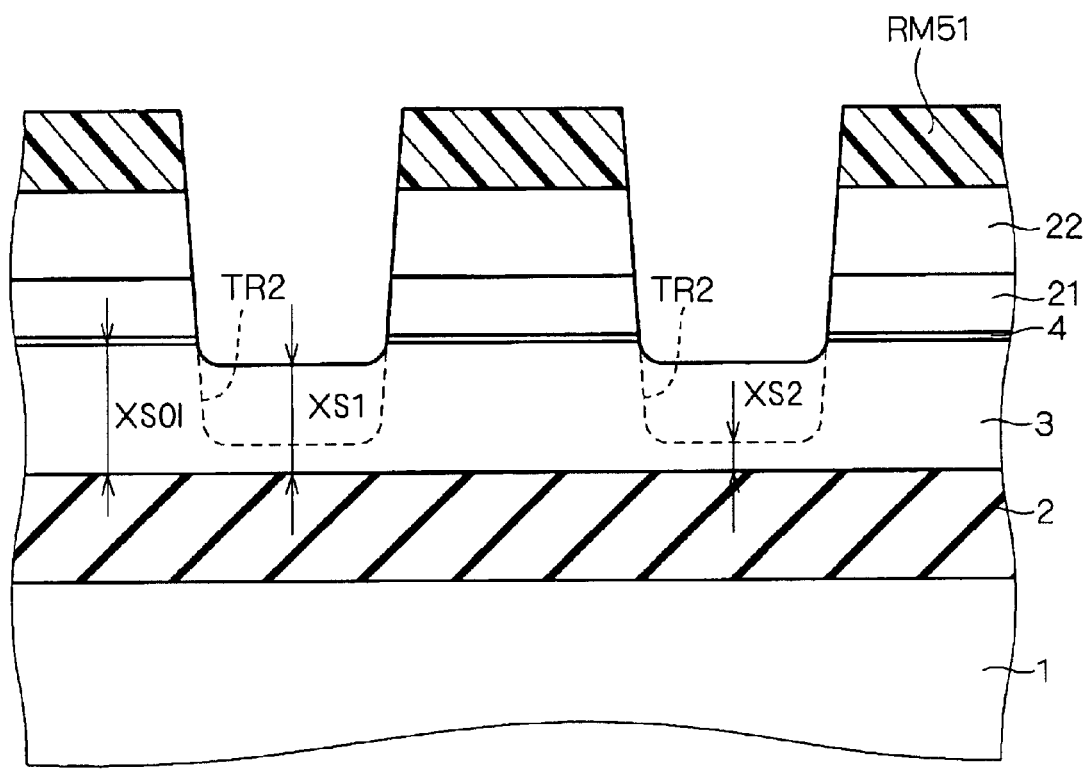

F I G . 2 4
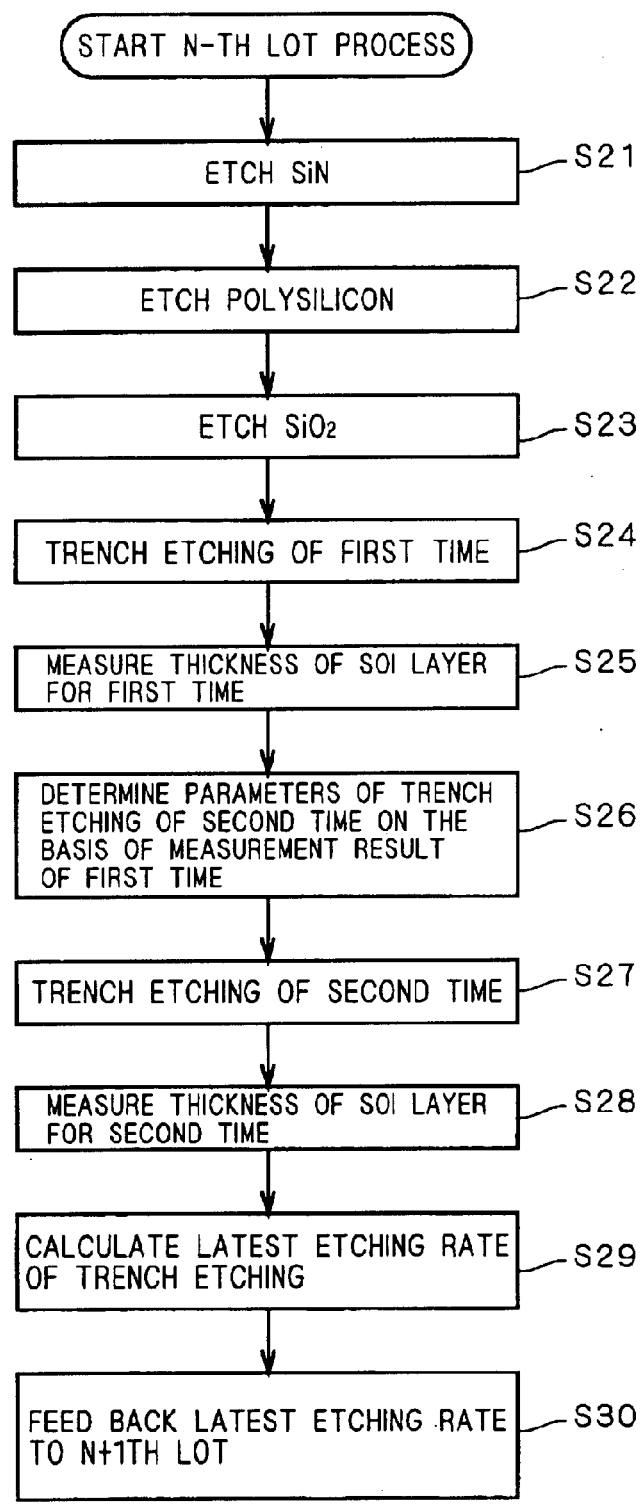

F I G . 3 0
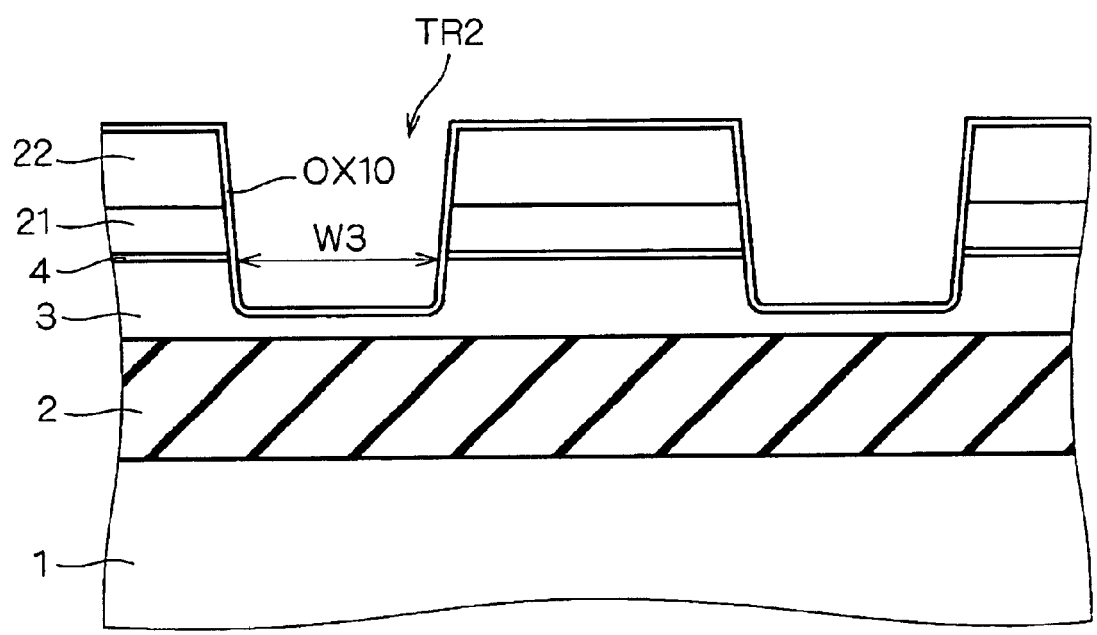

F I G . 4 3
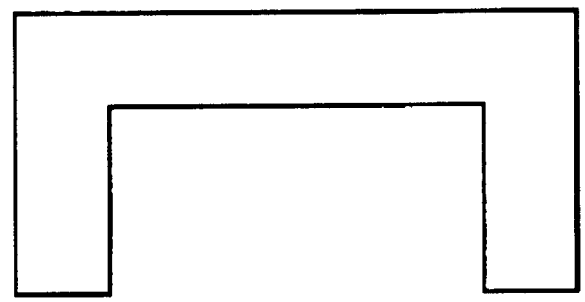
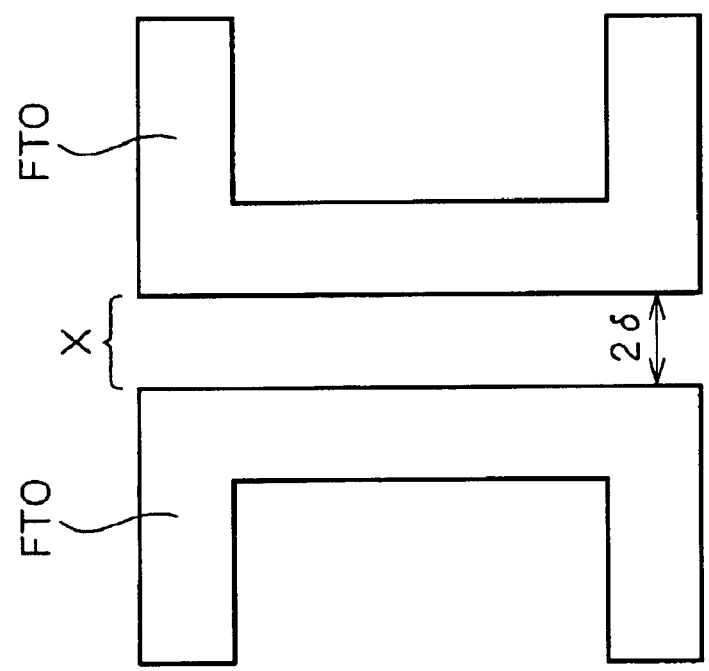
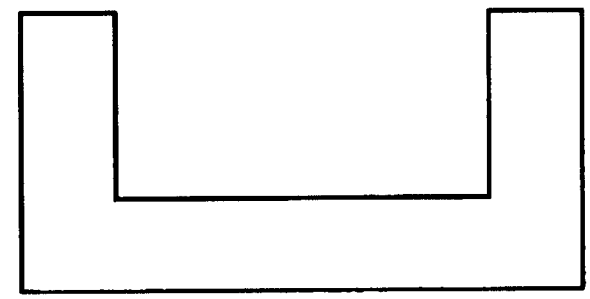

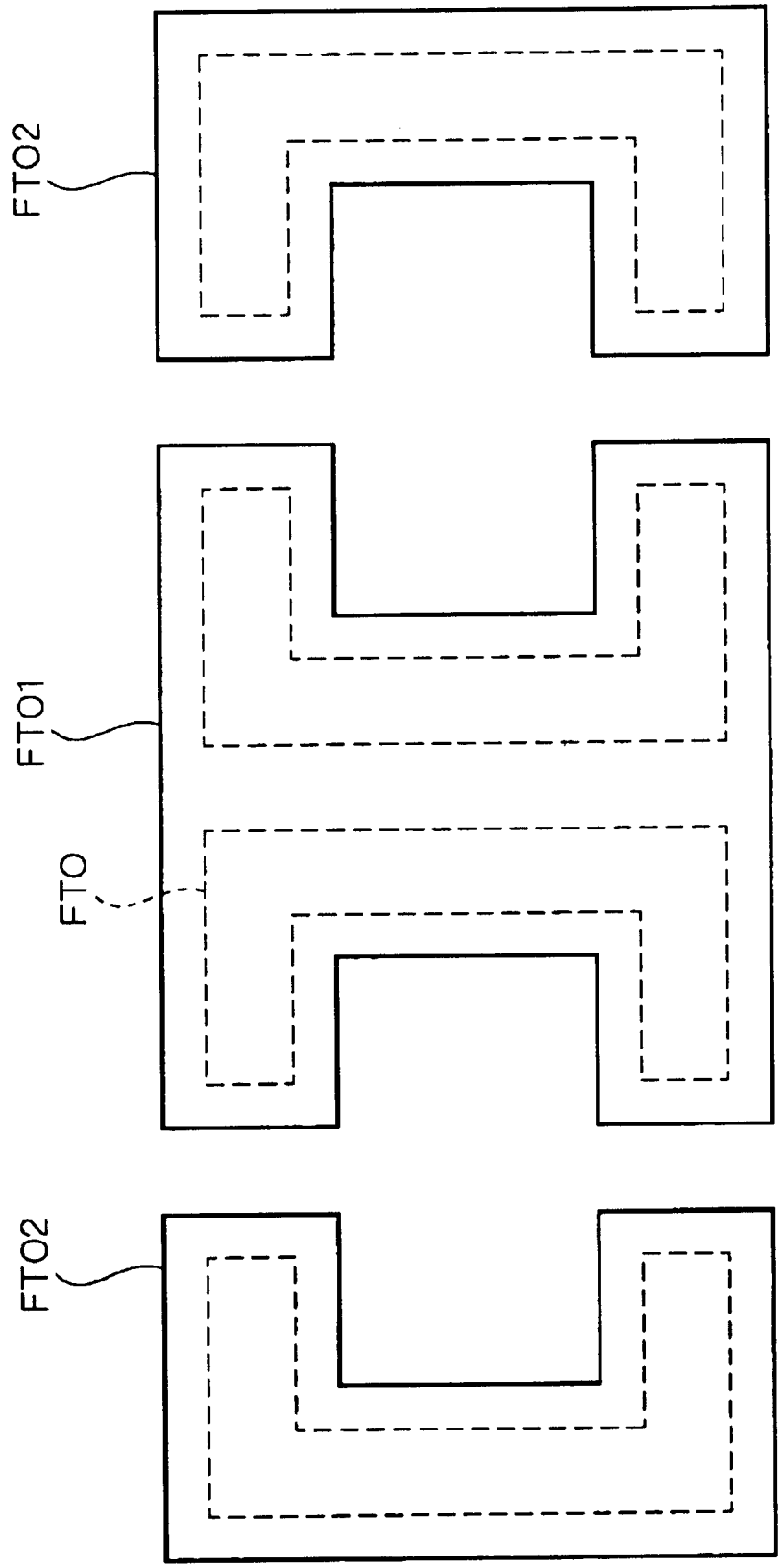

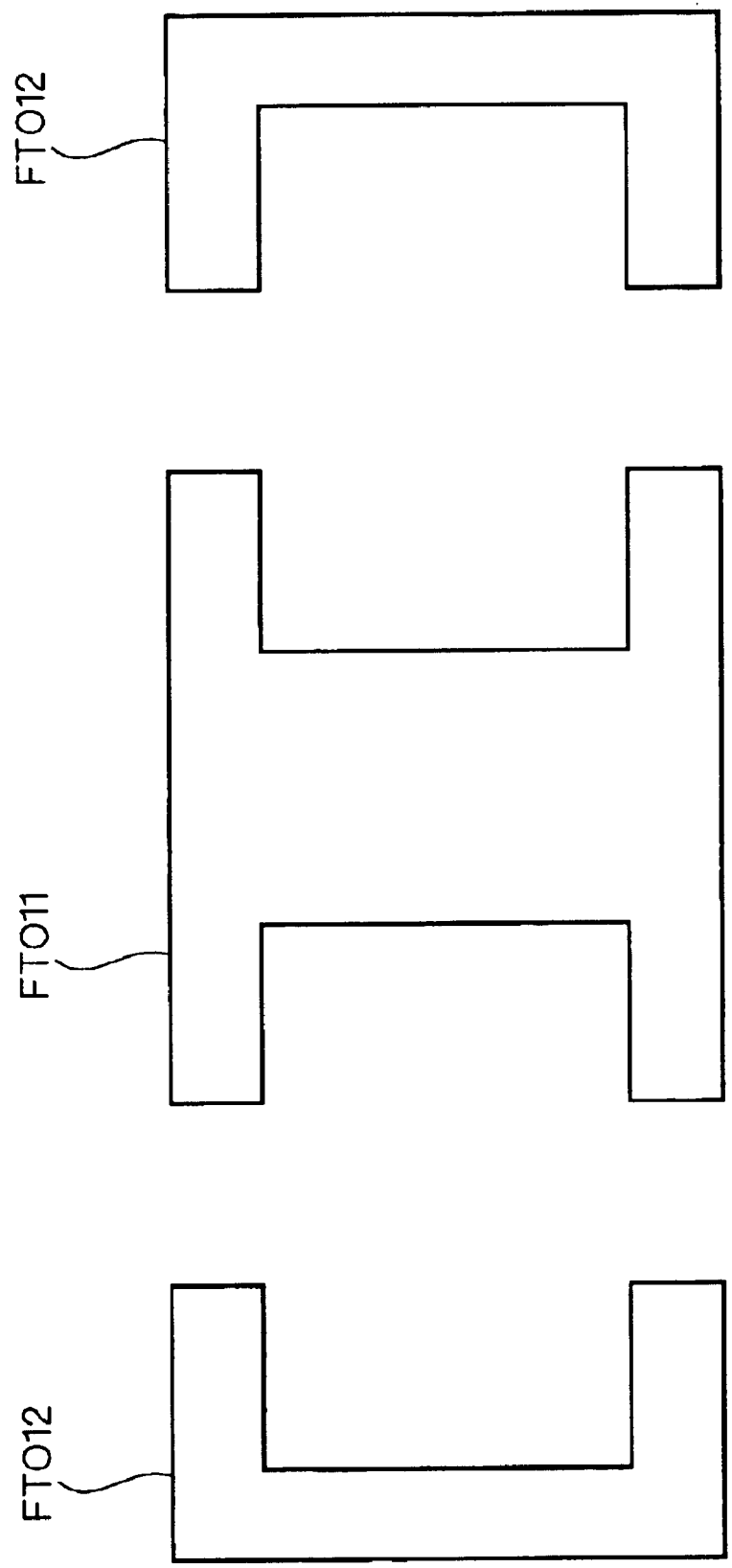

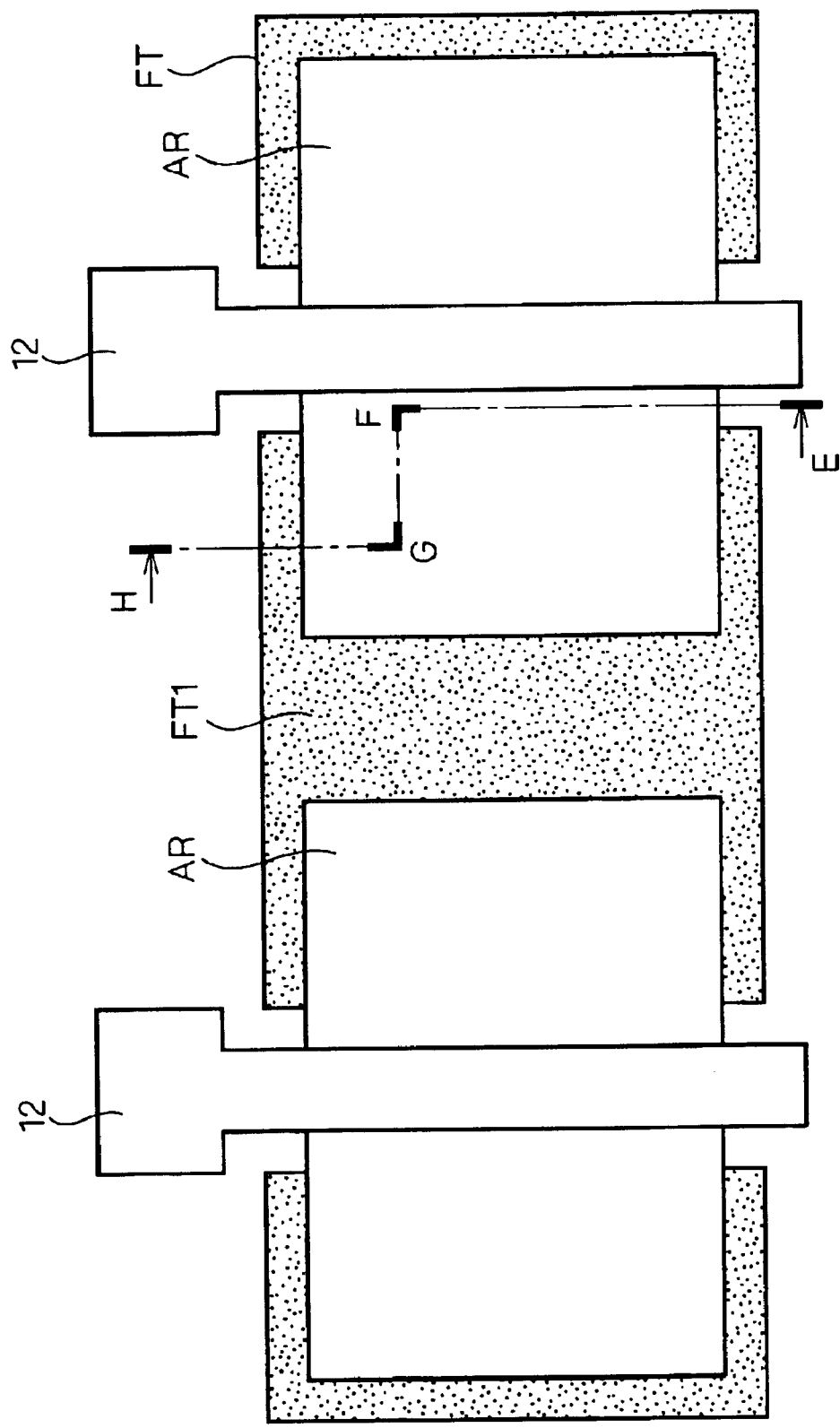

METHOD OF MANUFACTURING SEMICONDUCTOR DEVICE HAVING TRENCH ISOLATION

BACKGROUND OF THE INVENTION

1. Field of the Invention

The present invention relates to a semiconductor device and, more particularly, to a method of manufacturing a semiconductor device having a trench isolation oxide film.

2. Description of the Background Art

A semiconductor device of an SOI (Silicon On Insulator) structure (hereinbelow, called an SOI device), formed on an SOI substrate in which a buried oxide film and an SOI layer are formed on a silicon substrate has characteristics such as reduced parasite capacity, high-speed operation, and low power consumption and is used for a portable device and the like.

Also for a bulk device directly formed on a silicon substrate, microfabrication technology and high integration technique progress conspicuously, and the speed of development of the bulk device is increasing.

In association with a progress of a device technique, the concentration of a channel impurity and that of a source/drain impurity are getting higher and, moreover, a sharp impurity profile is requested more and more. Consequently, there is a tendency that heat treatment after implanting impurities is performed at low temperature in short time.

On the other hand, for a device having a trench isolation structure formed by providing a trench in a silicon layer and filling the trench with an insulating material, heat treatment at high temperature for long time is indispensable to form the isolation structure.

As an example of the SOI device, FIG. 64 shows a partial sectional configuration of an SOI device 70 in which MOS transistors are electrically isolated from each other by a trench.

In FIG. 64, in an SOI substrate in which a buried oxide film 102 and an SOI layer 103 are formed on a silicon substrate 101, an N-channel type MOS transistor (NMOS transistor) NM1 and a P-channel type MOS transistor (PMOS transistor) PM1 are formed on SOI layer 103 and are electrically completely isolated from each other by an isolation oxide film 104. Isolation oxide film 104 is provided so as to surround NMOS transistor NM1 and PMOS transistor PM1.

Each of NMOS transistor NM1 and PMOS transistor PM1 is constructed by a source/drain region SD formed in SOI layer 103, a channel forming region CH, a gate oxide film GO formed on channel forming region CH, a gate electrode GT formed on gate oxide film GO, and a side wall oxide film SW covering side faces of gate electrode GO.

In SOI device 70, NMOS transistor NM1 and PMOS transistor PM1 are not only independent of each other by isolation oxide film 104 in SOI layer 103 but also completely isolated from other semiconductor devices and the like. The SOI device 70 has, therefore, a structure in which latch-up does not occur in the transistors in theory.

In the case of manufacturing an SOI device having a CMOS transistor, there is consequently an advantage that the minimum isolation width determined by the microfabrication technology can be used and the chip area can be reduced. However, there are various problems caused by a substrate floating effect, such as accumulation of carriers (holes in the NMOS transistor) generated by an impact ionization phenomenon in the channel forming region, occurrence of a kink due to the accumulated carriers, deterioration in operation breakdown voltage, and occurrence of frequency dependency of delay time caused by an unstable potential of the channel forming region.

Consequently, a partial trench isolation structure has been devised. FIG. 65 shows a partial sectional configuration of an SOI device 80 having a partial trench isolation structure (PTI structure).

In FIG. 65, NMOS transistor NM1 and PMOS transistor PM1 are provided on SOI layer 103 and are isolated from each other by a partial isolation oxide film 105 under which a well region WR is formed. Partial isolation oxide film 105 is disposed so as to surround NMOS transistor NM1 and PMOS transistor PM1.

In contrast with partial isolation oxide film 105, a structure for electrically completely isolating devices by a trench oxide film reaching buried oxide film 102 like isolation oxide film 104 in SOI device 70 will be called a full trench isolation structure (FTI structure) and the oxide film will be called a full isolation oxide film.

Although NMOS transistor NM1 and PMOS transistor PM1 are isolated from each other by partial isolation oxide film 105, carries can move via well region WR under partial isolation oxide film 105. The carriers can be prevented from being accumulated in the channel forming region, and the potential of the channel forming region can be fixed via well region WR (body fixation). Consequently, there is an advantage such that the various problems due to the substrate floating effect do not occur.

As an SOI device having a PTI structure with further improved reliability of a MOS transistor, a MOS transistor 90 to be described hereinbelow can be mentioned. A method of manufacturing MOS transistor 90 will be described hereinbelow with reference to FIGS. 66 to 73. The configuration of MOS transistor 90 is shown in FIG. 73 for explaining the final process.

First, as shown in FIG. 66, by an SIMOX method for forming buried oxide film 102 by oxygen ion implantation, bonding, or the like, the SOI substrate constructed by silicon substrate 101, buried oxide film 102, and SOI layer 103 is prepared.

An oxide film 106 having a thickness of 10 to 30 nm (100 to 300 Å) is formed by CVD or thermal oxidation and, after that, a nitride film 107 having a thickness of 30 to 200 nm (300 to 2000 Å) is formed. Subsequently, a resist mask RM1 is formed on nitride film 107 by patterning. Resist mask RM1 has an opening for forming a trench.

Subsequently, by using resist mask RM1 as a mask, nitride film 107, oxide film 106, and SOI layer 103 are patterned by etching, thereby forming a partial trench TR in SOI layer 103 as shown in FIG. 67. The etching is performed not to completely etch SOI layer 103 to expose the buried oxide film 102 but the etching conditions are adjusted so that SOI layer 103 having a predetermined thickness remains on the bottom of the trench.

Since partial trench TR is formed so as to extend almost perpendicular to silicon substrate 101 with a predetermined width, device isolation which maintains fineness can be performed without deteriorating integration.

In the process shown in FIG. 68, an oxide film having a thickness of about 500 nm (5000 Å) is deposited, nitride film 107 is polished part way by CMP (Chemical Mechanical Polishing) and, after that, nitride film 107 and oxide film 106 are removed, thereby forming partial isolation oxide film 105. The region on the left side of the partial isolation oxide film 105 in FIG. 68 is set as a first region R1 in which a transistor having a low threshold voltage is formed, and the region on the right side of the partial isolation oxide film 105 is set as a second region R2 in which a transistor having a general threshold voltage and high reliability is formed.

Subsequently, oxide film OX101 is formed on the entire face of SOI layer 103 in the process shown in FIG. 69. The thickness of oxide film OX101 is 3 to 10 nm (30 to 100 Å). After that, a resist mask RM2 is formed so as to cover second region R2, and a semiconductor impurity is ion implanted into SOI layer 103 in first region R1 via oxide film OX101. The implantation parameters in this case are parameters for forming a transistor having a low threshold voltage. In the case of forming, for example, an NMOS transistor, ions of boron (B) are implanted with an energy of 5 to 40 keV and a dose of $1 \times 10^{11}$ to $3 \times 10^{11}/cm^2$. Prior to the process, a process of forming a well region by implanting boron ions with an energy of 30 to 100 keV and a dose of $1 \times 10^{12}$ to $1 \times 10^{14}/cm^2$ is performed.

In the process shown in FIG. 70, a resist mask RM3 is formed so as to cover first region R1, and a semiconductor impurity is introduced into SOI layer 103 in second region R2 via oxide film OX101 by ion implantation. The implantation parameters in this case are parameters for forming a transistor having a general threshold voltage. In the case of forming, for example, an NMOS transistor, ions of boron (B) are implanted with an energy of 5 to 40 keV and a dose of $3 \times 10^{11}$ to $5 \times 10^{11}/cm^2$.

In the process shown in FIG. 71, a resist mask RM4 is formed so as to cover second region R2, and oxide film OX101 in first region R1 is removed.

After removing resist mask RM4, an oxide film is formed in the whole area in the process shown in FIG. 72. At this time, an oxide film OX102 having a thickness of 1 to 4 nm (10 to 40 Å) is formed in region R1, and an oxide film OX103 is obtained by increasing the thickness of oxide film OX101 in region R2. After that, in the whole area, a polycrystalline silicon layer (hereinbelow, called a polysilicon layer) PS1 serving as a gate electrode is formed.

Subsequently, in the process shown in FIG. 73, by patterning polysilicon layer PS1 and oxide films OX102 and OX103, gate electrodes GT1 and GT2 and gate oxide films GO1 and GO2 are formed and, by forming a side wall oxide film SW and source/drain layer SD, NMOS transistors NM3 and NM4 are formed. Under partial isolation oxide film 105, well region WR exists.

On NMOS transistors NM3 and NM4, an interlayer insulating film is formed. A plurality of contact holes (not shown) penetrating the interlayer insulating film and reaching source/drain layer SD are formed. In such a manner, SOI device 90 is configured.

As described above, the SOI device having the PTI structure is being widely used as a device capable of solving various problems caused by the substrate floating effect. However, there is a case that, in the well region under the partial isolation oxide film, the impurity concentration decreases due to a segration phenomenon at the time of forming an oxide film, and the conduction type reverses. In order to prevent this, channel stop implantation of implanting impurities of the same conduction type as that of the impurities to the well region is performed. However, as described above, at the time of forming the trench isolation structure, heat treatment of long time at high temperature is indispensable. Consequently, even if the channel stop implantation is performed before the trench isolation structure is formed, there is the possibility that the impurities are diffused in the heat treatment performed after that, the profile is disturbed, and an intended effect cannot be obtained.

As a method of solving the problem, a method of implanting impurities after forming the trench isolation structure can be mentioned. However, in this case, a problem arises such that it is difficult to implant impurities of high concentration into only the region under the trench isolation oxide film.

Specifically, as shown in FIG. 74, in the case of forming partial isolation oxide film 105 in the surface of SOI layer 103 and implanting ions through partial isolation oxide film 105 into the region under the partial isolation oxide film 105, the impurities of high concentration are also introduced into an active region AR in which a semiconductor device such as a MOS transistor is to be formed and an impurity layer XL is formed.

This happens for the reason that an isolation step (for example, 20 nm) is low, which is specified by the height L of a portion projected from the main surface of SOI layer 103, of partial isolation oxide film 105. If implantation is performed with an energy that impurities are implanted through partial isolation oxide film 105 and the peak of an impurity profile is formed in the well region under partial isolation oxide film 105, impurity layer XL of high concentration is formed also in active region AR. The conduction type of impurity layer XL is opposite to that of the source/drain layer.

As a result, it becomes difficult to adjust the threshold value of a MOS transistor and to make the source/drain layer of the MOS transistor or a depletion layer formed around a PN junction of the source/drain layer reach buried oxide film 102.

FIG. 75 shows a configuration in which a MOS transistor is formed in active region AR. Due to existence of impurity layer XL, impurities of the source and drain are canceled off, and source/drain region SD does not reach buried oxide film 102. The depletion layer formed around the PN junction of the source/drain layer cannot also reach buried oxide film 102 due to the existence of impurity layer XL.

On the other hand, when the isolation step of partial isolation oxide film 105 is made large, impurity layer XL of high concentration can be prevented from being formed in active region AR. From the viewpoint of microfabrication of a semiconductor device, it is desirable that the isolation step is set to 20 nm or less.

SUMMARY OF THE INVENTION

An object of the present invention is to provide a method of manufacturing a semiconductor device in which deterioration in a transistor characteristic is avoided by preventing a channel stop implantation layer from being formed in an active region.

According to a first aspect of the present invention, a method of manufacturing a semiconductor device including a MOS transistor on an SOI layer of an SOI substrate obtained by sequentially stacking a semiconductor substrate, a buried insulating film, and the SOI layer, and a trench isolation oxide film which defines an active region serving as a region in which the MOS transistor is formed and electrically isolates the MOS transistor, includes the following steps (a) and (b).

Specifically, the step (a) is to form an auxiliary film used for forming the trench isolation oxide film on the SOI layer.

The step (b) is to form a trench penetrating the auxiliary film and reaching a predetermined depth in the SOI layer by trench etching. The step (b) includes a step of measuring the thickness of the SOI layer at least once and controlling the trench etching during formation of the trench.

Since the thickness of the SOI layer is measured at least once during formation of a trench for the trench isolation oxide film and the trench etching is controlled, the final depth of the trench can be made uniform in lots.

According to a second aspect of the present invention, a method of manufacturing a semiconductor device including a MOS transistor on an SOI layer of an SOI substrate obtained by sequentially stacking a semiconductor substrate, a buried insulating film, and the SOI layer, and a trench isolation oxide film which defines an active region serving as a region in which the MOS transistor is formed and electrically isolates the MOS transistor, includes the following steps (a) to (d).

Specifically, the step (a) is to form an auxiliary film used for forming the trench isolation oxide film on the SOI layer. The step (b) is to form a trench penetrating the auxiliary film and reaching a predetermined depth in the SOI layer by trench etching. The step (c) is to measure a thickness of the SOI layer remained after formation of the trench and, on the basis of the thickness of the SOI layer remained, calculating the latest etching rate for the SOI layer. The step (d) is to give data of the latest etching rate to the trench etching step of a different manufacture lot of the semiconductor device.

After forming the trench for the trench isolation oxide film, the latest etching rate for the SOI layer is calculated, and data of the latest etching rate is given to the trench etching step for a different manufacturing lot of a semiconductor device, so that variations among lots, in the final depth of the trench can be suppressed.

A third aspect of the invention is directed to a method of manufacturing a semiconductor device, and the semiconductor device includes a MOS transistor on an SOI layer of an SOI substrate obtained by sequentially stacking a semiconductor substrate, a buried insulating film, and the SOI layer, and a trench isolation oxide film which defines an active region serving as a region in which the MOS transistor is formed and electrically isolates the MOS transistor. The method includes the following steps (a) to (c).

Specifically, the trench isolation oxide film includes a combined isolation oxide film which is a combination of a full isolation oxide film penetrating the SOI layer and reaching the buried insulating film of the SOI substrate, and a partial isolation oxide film having the SOI layer under the partial isolation oxide film, and in the combined isolation oxide film, a portion around the active region except for a portion near a gate electrode of the MOS transistor is constructed by the full isolation oxide film and the other portion is constructed by the partial isolation oxide film, and the step (a) is to prepare field data of a source/drain layer for forming a partial trench which defines a region in which the source/drain layer is formed in the active region. The step (b) is to prepare gate data for forming the gate electrode. The step (c) is to prepare full isolation data for forming the full isolation oxide film. The step (c) includes a step of obtaining the full isolation data from the field data and the gate data.

When a combined isolation oxide film is included as the trench isolation oxide film and a portion around the active region except for a portion near a gate electrode of the MOS transistor is constructed by the full isolation oxide film and the other portion is constructed by the partial isolation oxide film, full isolation data for forming a full trench for forming a full isolation oxide film can be easily obtained.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 20 are cross sections showing a semiconductor device manufacturing method which prevents a channel stop implantation layer from being formed in an active region.

FIG. 21 is a cross section showing a method of manufacturing a semiconductor device of a first embodiment according to the invention.

FIGS. 24 and 25 are flowcharts for explaining a modification of the method of manufacturing the semiconductor device of the first embodiment according to the invention.

FIGS. 28 to 30 are cross sections for explaining a modification of the method of manufacturing the semiconductor device of the second embodiment according to the invention.

FIGS. 42 to 46 are plan views for explaining an example of application of the method of manufacturing the semiconductor device of the third embodiment according to the invention.

DETAILED DESCRIPTION OF THE PREFERRED EMBODIMENTS

A. First Embodiment

Figure 4:
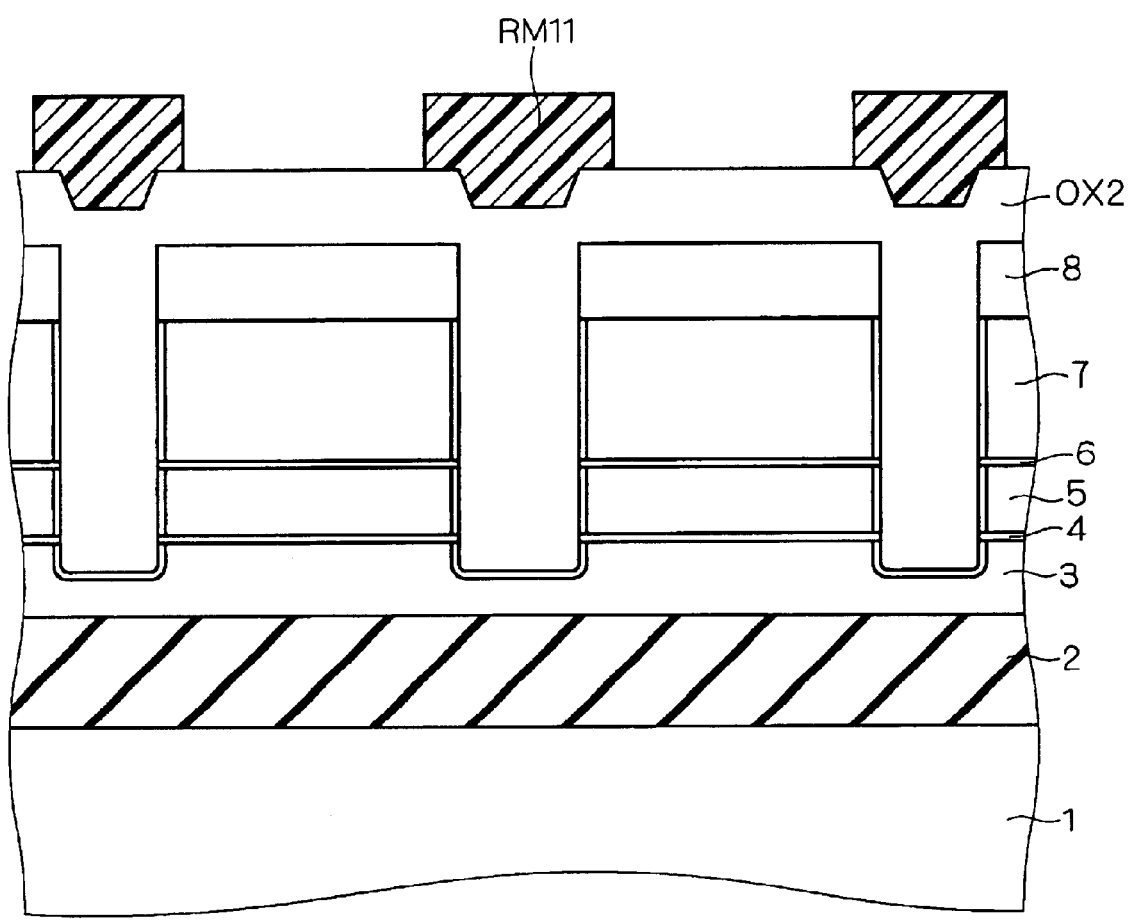
Figure 5:
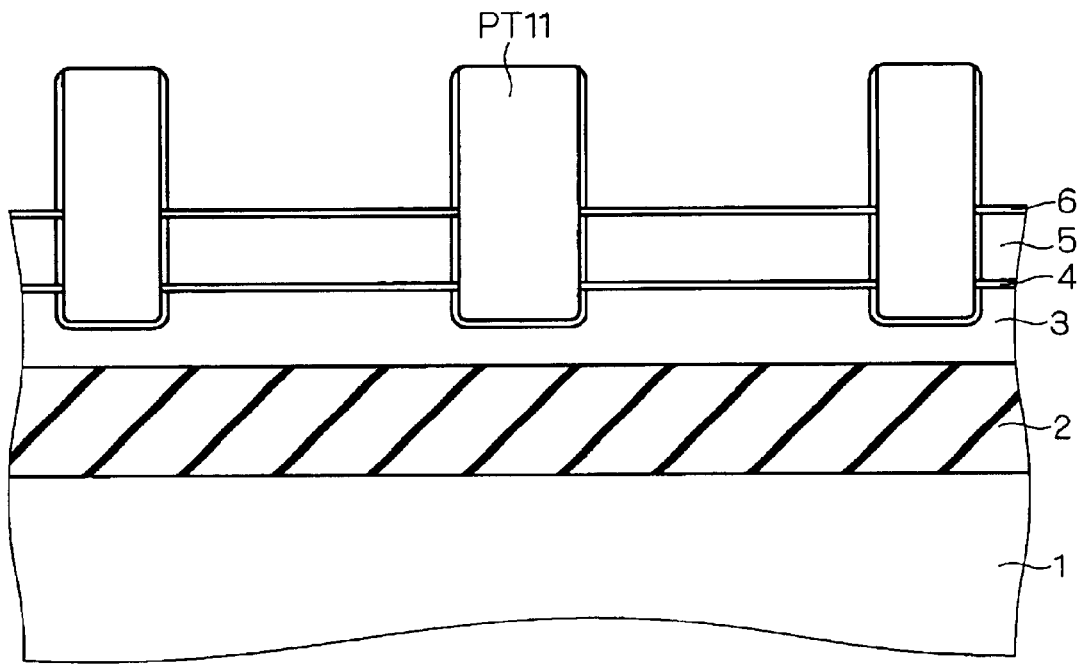

With reference to FIGS. 1 to 13 as cross sections for sequentially showing a manufacturing process, a semiconductor device manufacturing method which prevents a channel stop implantation layer from being formed in an active region will be described.

First, as shown in FIG. 1, by the SIMOX method for forming a buried oxide film 2 (buried insulating film) by oxygen ion implantation, bonding, or the like, an SOI substrate constructed by a silicon substrate 1, buried oxide film 2, and an SOI layer 3 is prepared. The SOI substrate may be formed by a method other than the above methods.

Usually, the film thickness of SOI layer 3 is 50 to 200 nm, and the film thickness of buried oxide film 2 is 100 to 500 nm. On the SOI substrate, a silicon oxide film (hereinafter, called an oxide film) 4 having a thickness of 10 to 30 nm (100 to 300 Å) is formed by CVD (with a temperature condition of about 800° C.) or thermal oxidation (with a temperature condition of 800 to 1000° C.).

After that, a polycrystalline silicon film (hereinbelow, called a polysilicon film) 5 having a thickness of 10 to 100 nm (100 to 1000 Å) is formed on oxide film 4 by CVD.

An oxide film 6 having a thickness of 10 to 200 (100 to 2000 Å) is formed on polysilicon film 5 by CVD or thermal oxidation, and a polysilicon film 7 having a thickness of 10 to 300 nm (100 to 3000 Å) is formed on oxide film 6 by CVD.

Further, a silicon nitride film (hereinbelow, called a nitride film) 8 having a thickness of 30 to 200 nm (300 to 2000 Å) is formed on polysilicon film 7 by CVD (with a temperature condition of about 700° C.). Since oxide film 4, polysilicon film 5, oxide film 6, polysilicon film 7, and nitride film 8 function auxiliarily to form a trench isolation oxide film to be formed later, they may be called auxiliary films.

A resist mask having openings corresponding to the positions in which the trench isolation oxide film is to be formed is patterned on nitride film 8, and nitride film 8 and polysilicon film 7 are selectively removed by dry etching or wet etching.

After that, as shown in FIG. 2, patterned nitride film 8 is used as an etching mask, oxide film 6, polysilicon film 5, and oxide film 4 are etched, and SOI layer 3 is etched to predetermined depth, thereby forming a trench TR1. The etching conditions of the etching are adjusted so as not to completely etch SOI layer 3 to expose buried oxide film 2 but so as to leave SOI layer 3 having a predetermined thickness on the bottom of the trench.

Since partial trench TR1 is formed so as to extend in the direction almost perpendicular to silicon substrate 1 with a predetermined width, without deteriorating the integration degree, device isolation can be carried out while maintaining microfabrication.

In a process shown in FIG. 3, the inner walls of trench TR1 are oxidized to form an oxide film OX1. In a process shown in FIG. 4, trench TR1 is filled with an oxide film OX2.

It is sufficient to form oxide film OX2 by, for example, HDP (High-Density-Plasma) CVD. The HDP-CVD uses plasma having density higher than that in general plasma CVD by one to two digits and deposits an oxide film by simultaneously performing sputtering and deposition. By the HDP-CVD, an oxide film of excellent film quality can be obtained.

After that, a resist mask RM11 having openings corresponding to active regions in each of which a semiconductor device such as a MOS transistor is to be formed is patterned on oxide film OX2, and oxide film OX2 is etched to a predetermined depth in accordance with the opening pattern of resist mask RM11. After that, resist mask RM11 is removed. The reason why such a process is performed is to uniformly remove oxide film OX2 in a following CMP (Chemical Mechanical Polishing) process for removing oxide film OX2.

By removing oxide film OX2 by CMP, oxide film OX2 is left only in trench TR1. After that, nitride film 8 is removed by hot phosphoric acid and, further, polysilicon film 7 is removed, thereby obtaining a partial isolation oxide film PT11 shown in FIG. 5. Polysilicon film 7 may be removed by wet etching using alkaline solution, for example, KOH (potassium hydroxide) solution or a mixture solution of ammonia and hydrogen peroxide or dry etching having selectivity with an oxide film.

Partial isolation oxide film PT11 is projected from the main surface of oxide film 6, and the thickness of the whole is about 600 nm (6000 Å). When the thickness of partial isolation oxide film PT11 in SOI layer 3 is set to about 100 nm, what is called an isolation step is about 500 nm.

Figure 6:
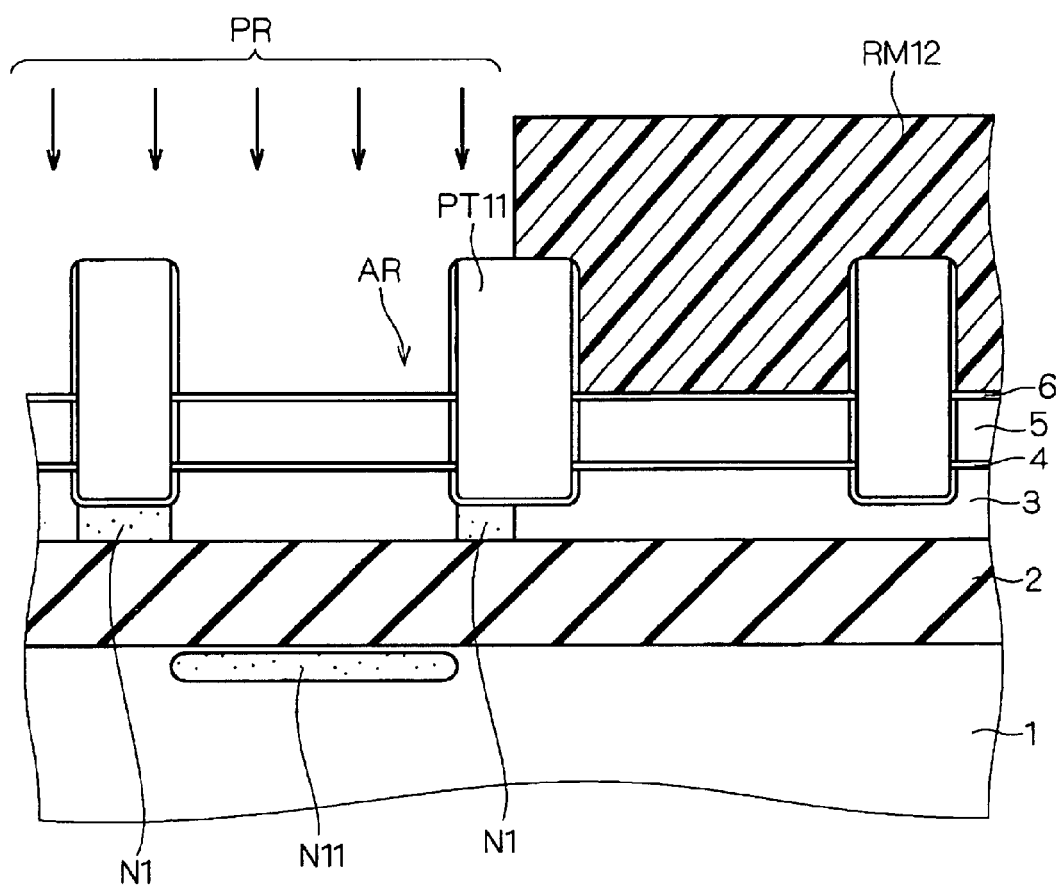

In a process shown in FIG. 6, a resist mask RM12 having an opening corresponding to a region PR in which a PMOS transistor is to be formed is formed. By performing channel stop implantation with an energy by which the peak of an impurity profile is formed in SOI layer 3 through partial isolation oxide film PT11, a channel stop layer N1 is formed in SOI layer 3 under partial isolation oxide film PT11, that is, in the isolation region.

The impurities to be implanted here are N-type impurities. When phosphorus (P) is used, its implantation energy is, for example, 60 to 120 keV, and the density of channel stop layer N1 is $1\times10^{17}$ to $1\times10^{19}/cm^3$.

In this case, in SOI layer 3 corresponding to active region AR, the impurities of channel stop implantation are not stopped but are implanted into buried oxide film 2 and silicon substrate 1 under buried oxide film 2. FIG. 6 shows an example that an impurity layer N11 is formed in silicon substrate 1.

In a process shown in FIG. 7, a resist mask RM13 having an opening corresponding to a region NR in which an NMOS transistor is to be formed is formed. Channel stop implantation is performed with an energy by which a peak of an impurity profile is formed in SOI layer 3 through partial isolation oxide film PT11, and a channel stop layer P1 is formed in SOI layer 3 under partial isolation oxide film PT11, that is, in the isolation region.

Impurities to be implanted here are P-type impurities. When boron (B) is used, its implantation energy is set to, for example, 30 to 60 keV, and the density of channel stop layer P1 is set to $1\times10^{17}$ to $1\times10^{19}/cm^3$.

At this time, in SOI layer 3 corresponding to active region AR, the impurities of channel stop implantation are not stopped but are implanted into buried oxide film 2 and silicon substrate 1 under buried oxide film 2. FIG. 7 shows an example that impurity layer P11 is formed in silicon substrate 1.

By performing channel stop implantation by using the isolation step as described above, channel stop layers N1 and P1 of high density can be formed in a self-aligned manner in the isolation regions.

Figure 8:
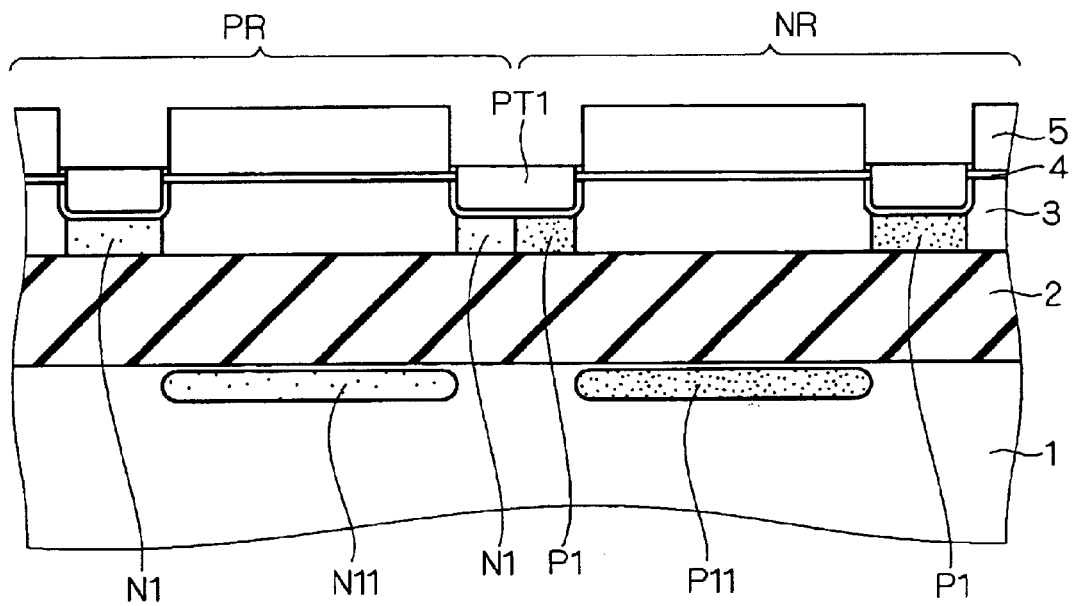

In a process shown in FIG. 8, partial isolation oxide film PT11 and internal-wall oxide film OX1 are etched by a hydrofluoric acid process for exposing partial isolation oxide film PT11 and internal-wall oxide film OX1 to a 2% hydrofluoric acid solution having a ratio of water ($H_2O$) to hydrofluoric acid (HF) of 50:1, thereby forming a partial isolation oxide film PT1 with reduced an isolation step.

Figure 9:
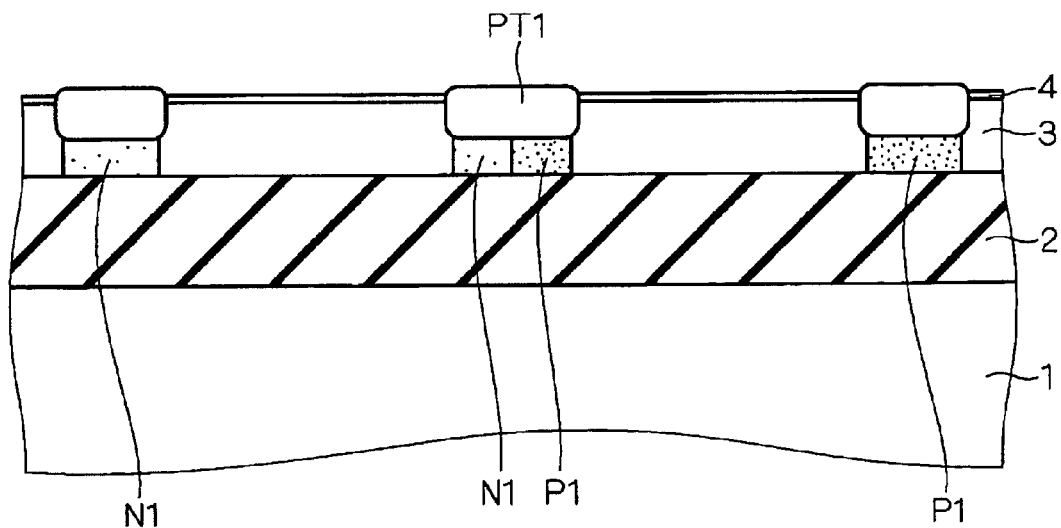

In a process shown in FIG. 9, polysilicon film 5 on oxide film 4 is removed by wet etching or dry etching having selectivity with an oxide film.

Figure 10:
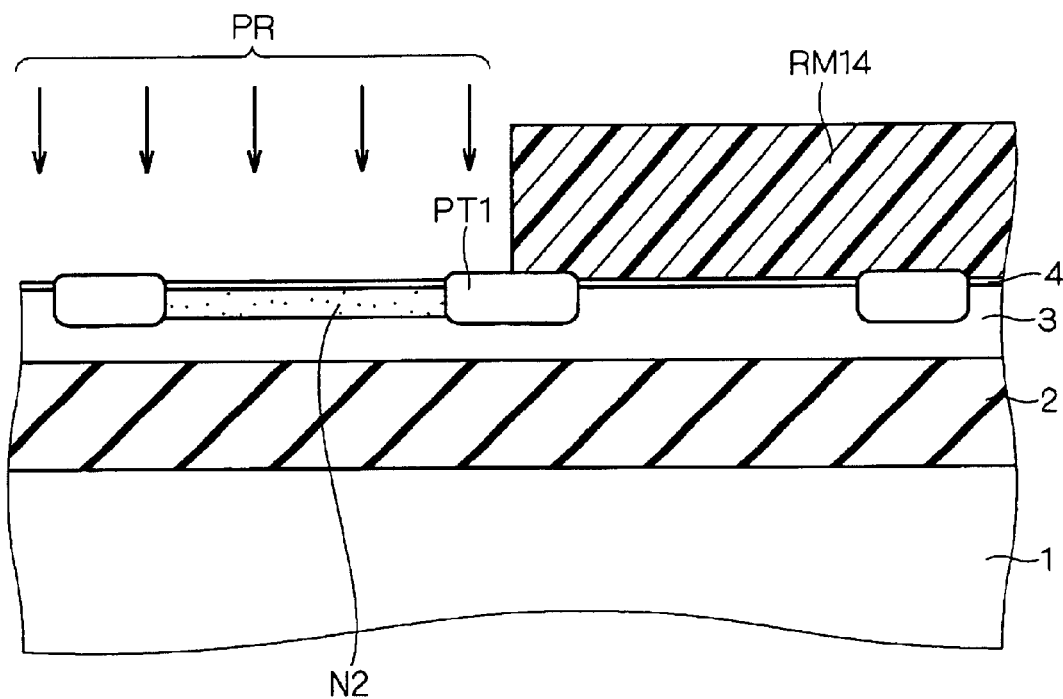

In a process shown in FIG. 10, a resist mask RM14 is formed so that its opening corresponds to region PR in which a PMOS transistor is to be formed. By implanting an n-type impurity for channel implantation, for example, any of P (phosphorus), As (arsenic), and Sb (antimony), a threshold voltage of a transistor is set.

As an example of impurity parameters at this time, in the case of using phosphorus, implantation energy is 20 to 100 keV, and a dose is $1\times10^{10}$ to $1\times10^{14}/cm^2$.

Figure 11:
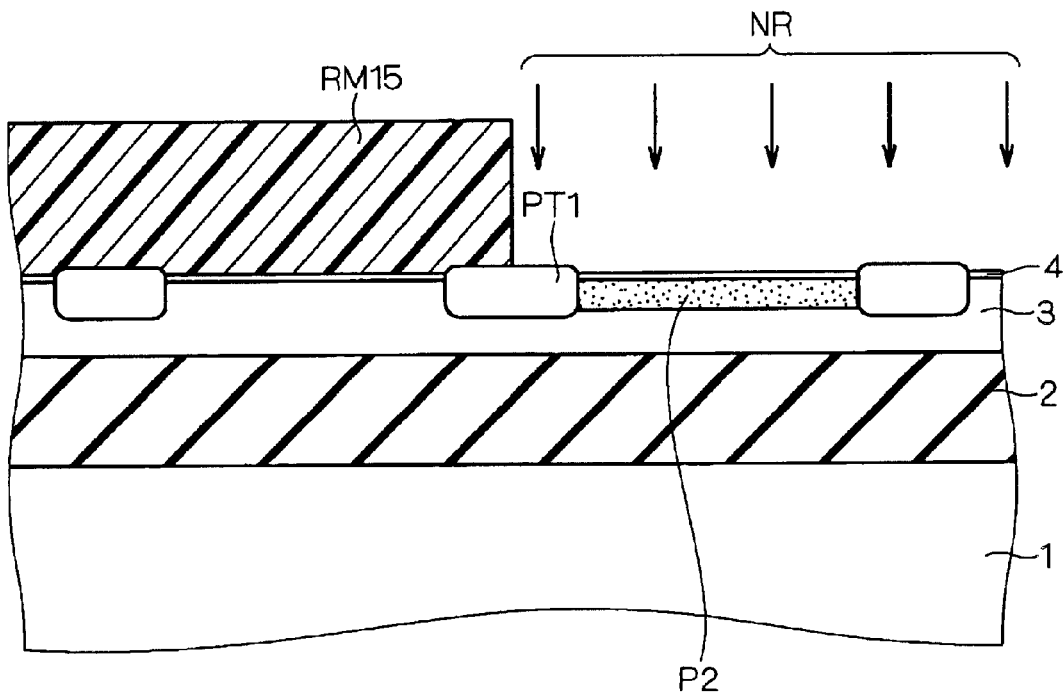

In a process shown in FIG. 11, a resist mask RM15 is formed so that its opening corresponds to region NR in which an NMOS transistor is formed. By implanting a p-type impurity for channel implantation, for example, B (boron) or In (indium), a threshold voltage of a transistor is set.

As an example of impurity parameters at this time, in the case of using boron, implantation energy is 5 to 40 keV, and a dose is $1\times10^{10}$ to $1\times10^{14}/cm^2$. To set the threshold voltage to a lower value, it is sufficient to reduce the dose. After the channel implantation, heat treatment for shot time is performed for the purpose of recovering damage caused by the implantation.

Figure 12:
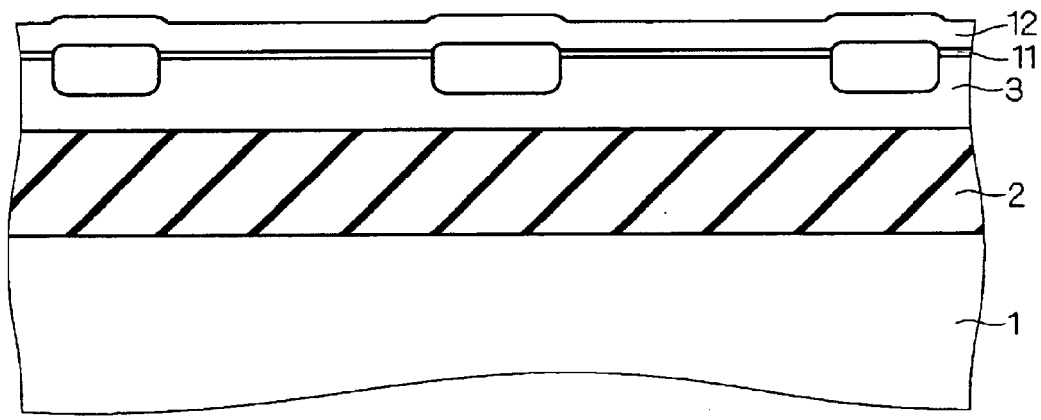

After that, oxide film 4 is removed by wet etching. Instead, as shown in FIG. 12, an insulating film 11 having a thickness of 1 to 4 nm (10 to 40 Å) is formed on SOI layer 3. For the formation, thermal oxidation, rapid thermal oxidation, CVD or the like can be used. Further, a polysilicon film 12 having a thickness of 100 to 400 nm (1000 to 4000 Å) is deposited on insulating film 11 by CVD.

Figure 13:
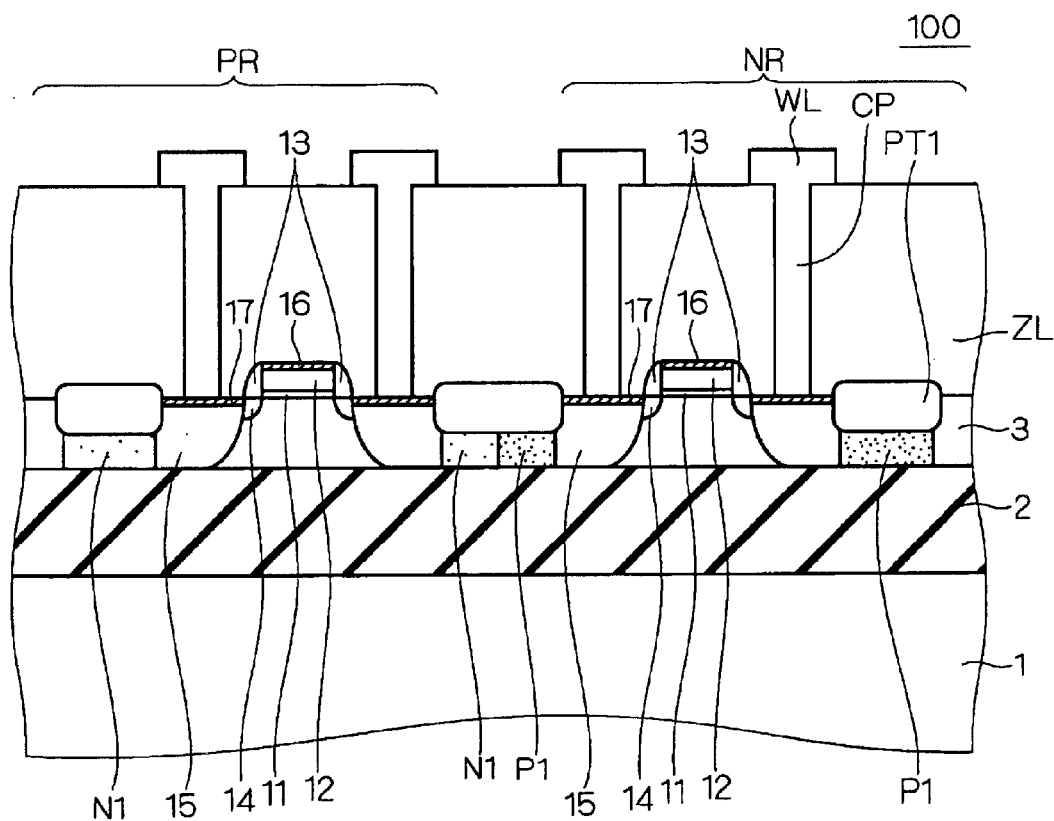

As shown in FIG. 13, in regions PR and NR, insulating film 11 and polysilicon film 12 are patterned to form gate insulating film 11 and gate electrode 12. By performing impurity implantation (LDD implantation) while using gate electrode 12 as an implantation mask, a lightly doped drain layer (or source/drain extension layer) 14 is formed.

After that, a spacer (side wall spacer) 13 of an insulating film is formed on side walls of gate insulating film 11 and gate electrode 12. By performing impurity implantation for forming a source/drain layer (source/drain implantation) while using gate electrode 12 and side wall space 13 as an implantation mask, a source/drain layer 15 is formed.

Further, heat treatment of short time is performed for recovery of an implantation damage and activation of implanted ions.

A refractory metal layer made of Co (cobalt) or the like is formed on the whole face by sputtering. A silicide reaction with silicon is caused by heat treatment, thereby forming a silicide layer. By the silicide reaction, silicide layers 16 and 17 are formed on gate electrode 12 and source/drain layer 15, and the unreacted refractory metal layer is removed.

After that, an interlayer film ZL is formed on the whole face, a contact plug CP penetrating interlayer insulating film ZL and reaching silicide layer 17 is formed. By connecting a wiring layer WL to contact plug CP, an SOI device 100 shown in FIG. 13 is formed.

According to the above-described semiconductor device manufacturing method, partial isolation oxide film PT11 having a large isolation step is formed and channel stop implantation is performed through partial isolation oxide film PT11, thereby enabling channel stop layers N1 and P1 of high density to be formed in a self-aligned manner in the isolation regions. In this case, since a channel stop layer is not formed in SOI layer 3 corresponding to active region AR, the threshold value of a MOS transistor can be adjusted without a hitch, the source/drain layer of the MOS transistor or a depletion layer formed around the PN junction of the source/drain layer can be made reach buried oxide film 2. A semiconductor device in which deterioration in the transistor characteristics is prevented can be obtained.

Since partial isolation oxide film PT11 is etched so as to reduce the isolation step after the channel stop implantation to thereby finally obtain partial isolation oxide film PT1 having the isolation step of 20 nm or less, a problem associated with reduction in size of the semiconductor device does not occur.

Since five layers of oxide film 4, polysilicon film 5, oxide film 6, polysilicon film 7, and nitride film 8 are formed on SOI layer 3 and partial isolation oxide film PT11 is formed by using trench TR1 penetrating the five layers, a large isolation step can be formed. Further, nitride film 8 functions as an etching mask used for trench TR1, polysilicon film 7 is a film for forming a large isolation step, oxide film 6 functions as an etching stopper at the time of removing polysilicon film 7, and polysilicon film 5 functions as a protective film of the active region at the time of reducing the isolation step of partial isolation oxide film PT11 by etching. Oxide film 4 is also called a pad oxide film and functions as a protective film for SOI layer 3 at the time of reducing a damage caused by implanting impurities into SOI layer 3 and removing an upper layer.

Although the configuration of performing the channel stop implantation through the partial isolation oxide film having a large isolation step has been described as a semiconductor device manufacturing method which prevents the channel stop implantation layer from being formed in the active region, channel stop implantation may be also performed by a method described hereinbelow with reference to FIGS. 14 to 20 as cross sections sequentially showing the manufacturing process. The same components as those in the semiconductor device manufacturing method described by referring to FIGS. 1 to 13 are designated by the same reference numerals and their description will not be repeated.

Figure 14:
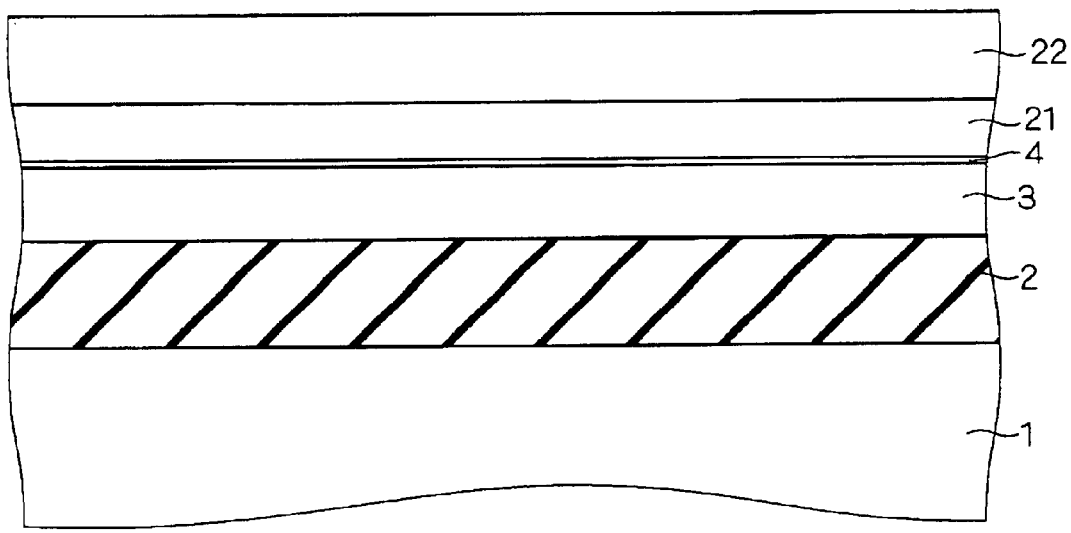

First, as shown in FIG. 14, an SOI substrate is prepared, and oxide film 4 is formed on the SOI substrate.

A polysilicon film 21 having a thickness of 5 to 300 nm (50 to 3000 Å) is formed on oxide film 4 by CVD. A nitride film 22 having a thickness of 100 to 200 (1000 to 2000 Å) is formed on polysilicon film 21 by CVD. Oxide film 4, polysilicon film 21, and nitride film 22 function auxiliarily to form an isolation oxide film, so that they may be called auxiliary films.

After that, nitride film 22 and polysilicon film 21 are selectively removed by dry etching or wet etching.

Figure 15:
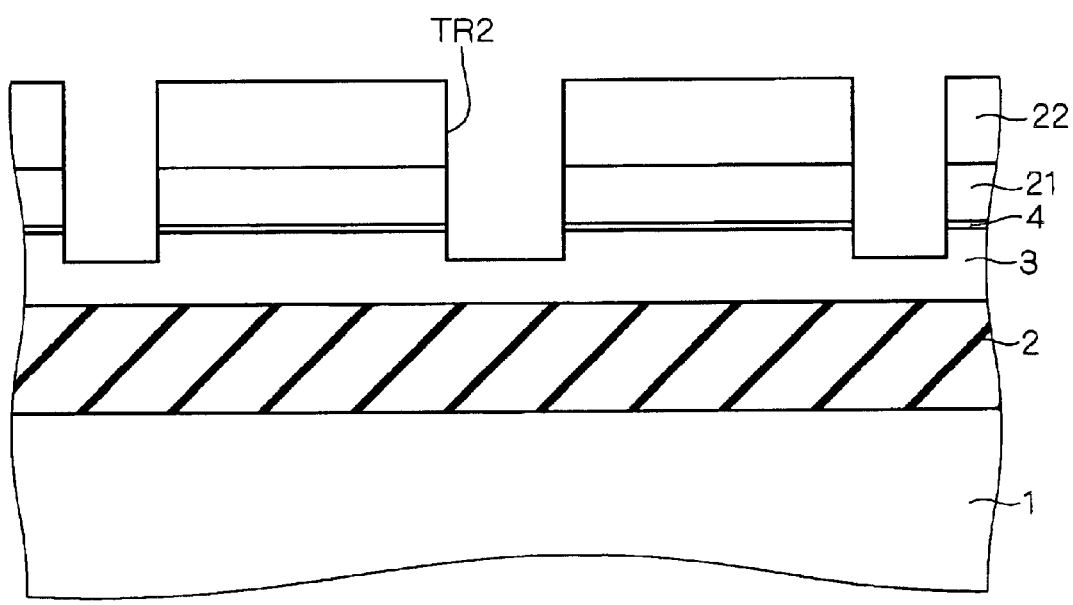

As shown in FIG. 15, patterned nitride film 22 is used as an etching mask, oxide film 4 is penetrated and SOI layer 3 is etched to predetermined depth, thereby forming a trench TR2. The etching conditions of the etching are adjusted so as not to completely etch SOI layer 3 to expose buried oxide film 2 but so as to leave SOI layer 3 having a predetermined thickness on the bottom of the trench.

Figure 16:
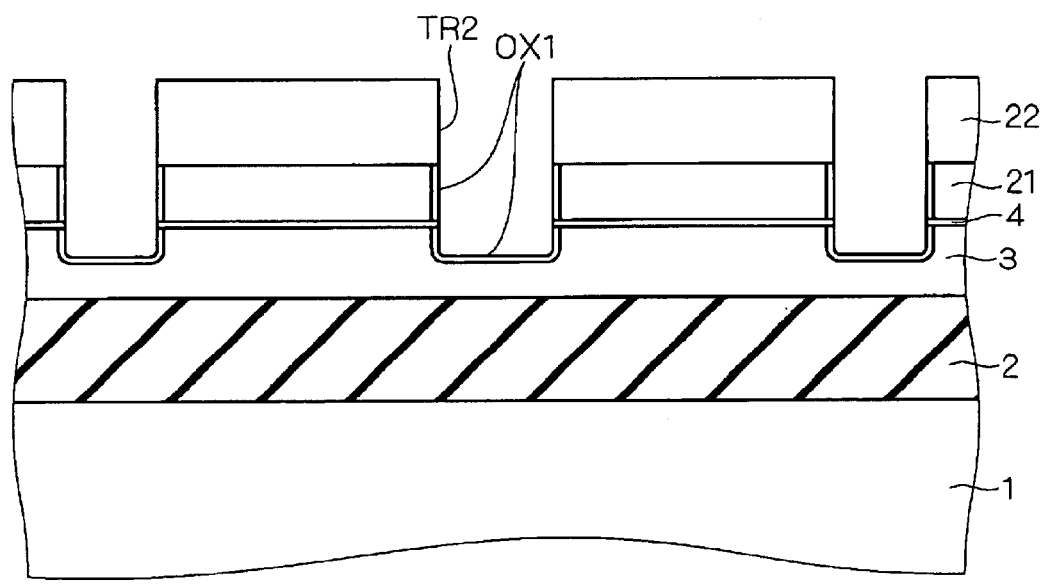
Figure 17:
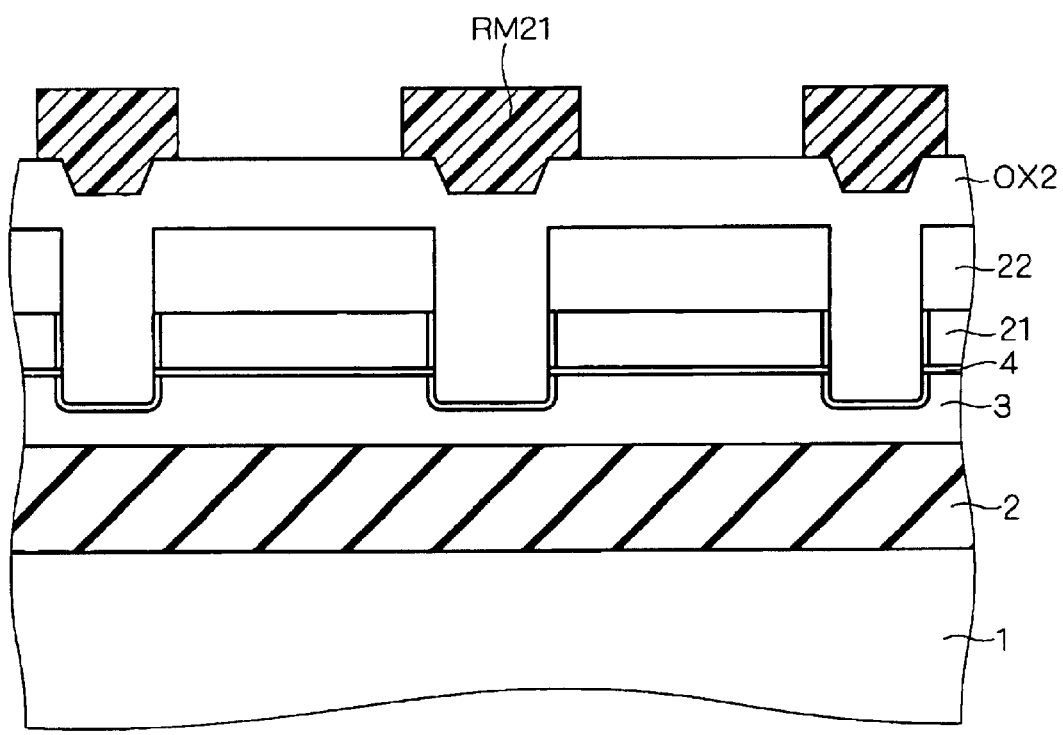

In a process shown in FIG. 16, the inner walls of trench TR2 are oxidized to form internal-wall oxide film OX1. In a process shown in FIG. 17, trench TR2 is filled with oxide film OX2.

After that, a resist mask RM21 having openings corresponding to active regions in each of which a semiconductor device such as a MOS transistor is to be formed is patterned on oxide film OX2, and oxide film OX2 is etched to a predetermined depth in accordance with the opening pattern of resist mask RM21. After that, resist mask RM21 is removed.

Figure 18:
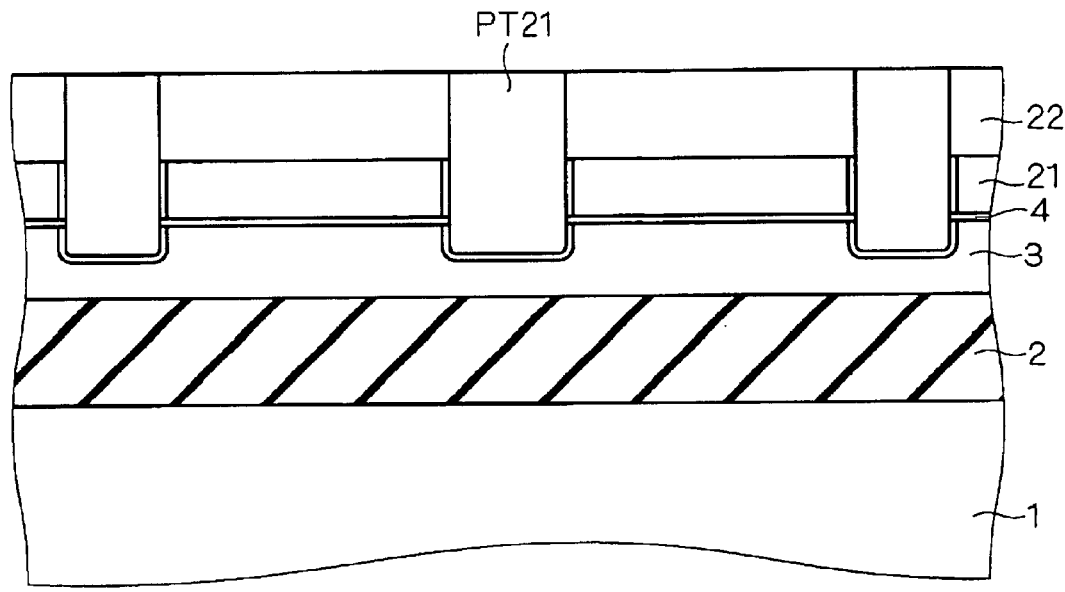

By removing oxide film OX2 on nitride film 22 by CMP, oxide film OX2 is left only in trench TR2. In such a manner, a partial isolation oxide film PT21 shown in FIG. 18 is obtained.

Figure 19:
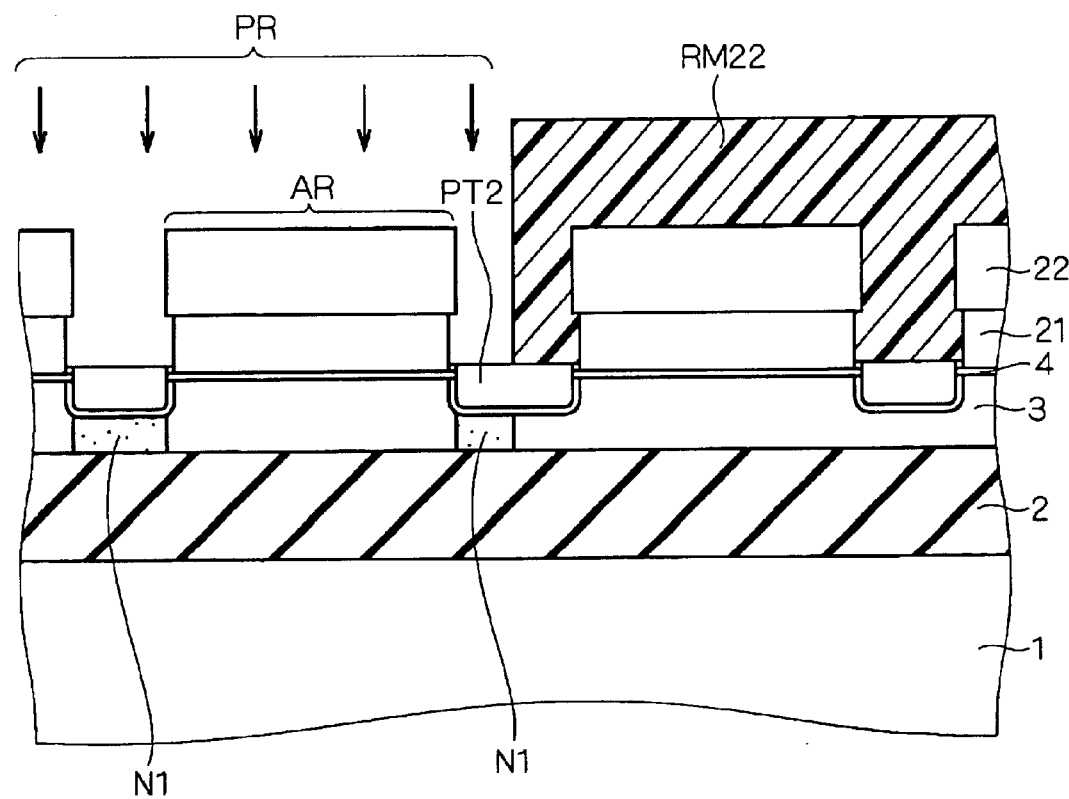

In a process shown in FIG. 19, partial isolation oxide film PT21 and internal-wall oxide film OX1 are etched by a hydrofluoric acid (HF) process, thereby forming a partial isolation oxide film PT2 with a reduced isolation step. It is assumed that the thickness of isolation oxide film PT2 is 100 to 150 nm (1000 to 1500 Å) and the isolation step is about 20 nm.

After that, a resist mask RM22 is formed so that its opening corresponds to region PR in which a PMOS transistor is to be formed. By performing channel stop implantation with an energy by which a peak of an impurity profile is formed in SOI layer 3 through partial isolation oxide film PT2, channel stop layer N1 is formed in SOI layer 3 under partial isolation oxide film PT2, that is, in the isolation region.

An impurity to be implanted here is an N-type impurity. In the case of using phosphorus (P), its implantation energy is set to, for example, 100 to 300 keV, and the density of channel stop layer N1 is set to $1 \times 10^{17}$ to $1 \times 10^{19} /cm^3$.

At this time, polysilicon film 21 and nitride film 22 remain on SOI layer 3 corresponding to active region AR, and the thickness is about 400 nm (4000 Å), so that the impurities cannot pass through polysilicon film 21 and nitride film 22 with the above-described energy. The impurities of channel stop implantation cannot be implanted into SOI layer 3 corresponding to active region AR.

Figure 20:
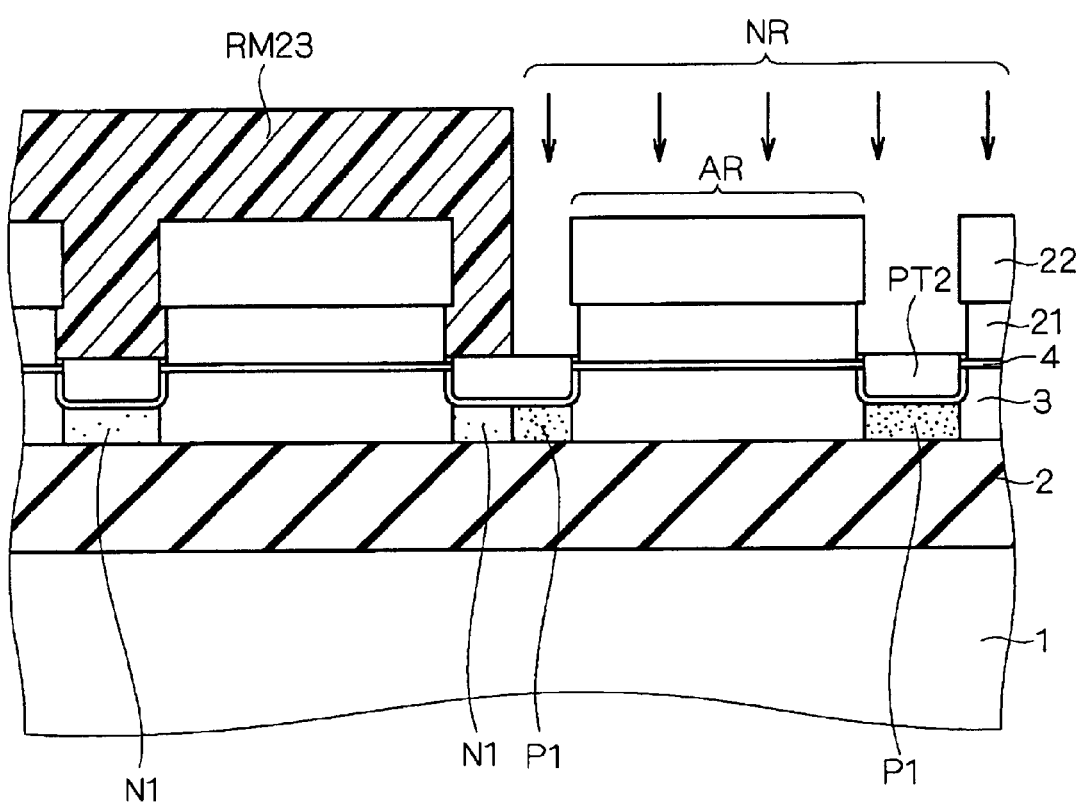

Subsequently, in a process shown in FIG. 20, a resist mask RM23 is formed so that its opening corresponds to region NR in which an NMOS transistor is to be formed. Channel stop implantation is carried out with an energy by which a peak of an impurity profile can be formed in SOI layer 3 through partial isolation oxide film PT2, thereby forming channel stop layer P1 in SOI layer 3 under partial isolation oxide film PT2, that is, the isolation region.

The impurity to be implanted here is a P-type impurity. In the case of using boron (B), implantation energy is set to, for example, 30 to 100 keV, and the density of channel stop layer P1 is set to $1 \times 10^{17}$ to $1 \times 10^{19} /cm^3$.

At this time, the impurity of the channel stop implantation is not implanted into SOI layer 3 corresponding to active region AR.

After that, nitride film 22 is removed by hot phosphoric acid, and polysilicon film 21 is removed by wet etching or dry etching having selectivity with an oxide film. Subsequently, by performing the processes described with reference to FIGS. 10 to 13, SOI device 100 shown in FIG. 13 is obtained.

According to the above-described manufacturing method, by performing channel stop implantation with an energy by which the channel stop layer is formed in SOI layer 3 through partial isolation oxide film PT2 having a small isolation step while leaving polysilicon film 21 and nitride film 22 on active region AR, channel stop layers N1 and P1 of high density can be formed in a self-aligned manner in the isolation regions. In this case, no channel stop layer is formed in SOI layer 3 corresponding to active region AR, so that the threshold value of a MOS transistor can be adjusted without a hitch, the source/drain layer of the MOS transistor or a depletion layer formed around the PN junction of the source/drain layer can be made reach buried oxide film 2. A semiconductor device in which deterioration in the transistor characteristics is prevented can be obtained.

By leaving polysilicon film 21 and nitride film 22 on SOI layer 3 corresponding to active region AR, the impurity ions used at the time of channel stop implantation remain in polysilicon film 21 and/or nitride film 22 and the possibility that the impurity ions reach SOI layer 3 is low. Consequently, the impurity ions are not vulnerable to a damage caused when passed through SOI layer 3, and the reliability of the gate insulating film to be formed on SOI layer 3 can be improved.

The above-described semiconductor device manufacturing method which prevents the channel stop implantation layer from being formed in the active region is similar with respect to the point that a trench for forming the trench isolation oxide film is formed in SOI layer 3. In the formation of the trench, by employing a method to be described as follows, the depth of the trench can be made uniform.

A-1. Manufacturing Method which Makes Depth of Trench Uniform

A manufacturing method which makes the depth of a trench uniform will be described hereinbelow as a first embodiment according to the invention with reference to FIGS. 21 to 25. In the following description, on condition that the invention is applied to the semiconductor device manufacturing method which has been described by referring to FIGS. 14 to 20, the same components as those described in FIGS. 14 to 20 are designated by the same reference numerals and repetitive description will not be made.

FIG. 21 is a diagram for describing the manufacturing process described by referring to FIG. 14 in more details and shows a process of selectively removing nitride film 22 and polysilicon film 21 by dry etching or wet etching by using a resist mask RM51 patterned on nitride film 22.

In etching silicon nitride (SiN), since the selectivity with polysilicon or silicon oxide ($SiO_2$) is not generally high, there is the possibility that not only polysilicon film 21 but also silicon oxide film (hereinbelow, called oxide film) 4 are etched and even SOI layer 3 is etched a little.

If SOI layer 3 is etched at this stage and the depths of SOI layers vary in lots (production unit of semiconductor devices), in the case of etching SOI layer 3 is etched to a predetermined depth to form trench TR2, the final depths of trenches TR2 vary in the lots.

Figure 22:
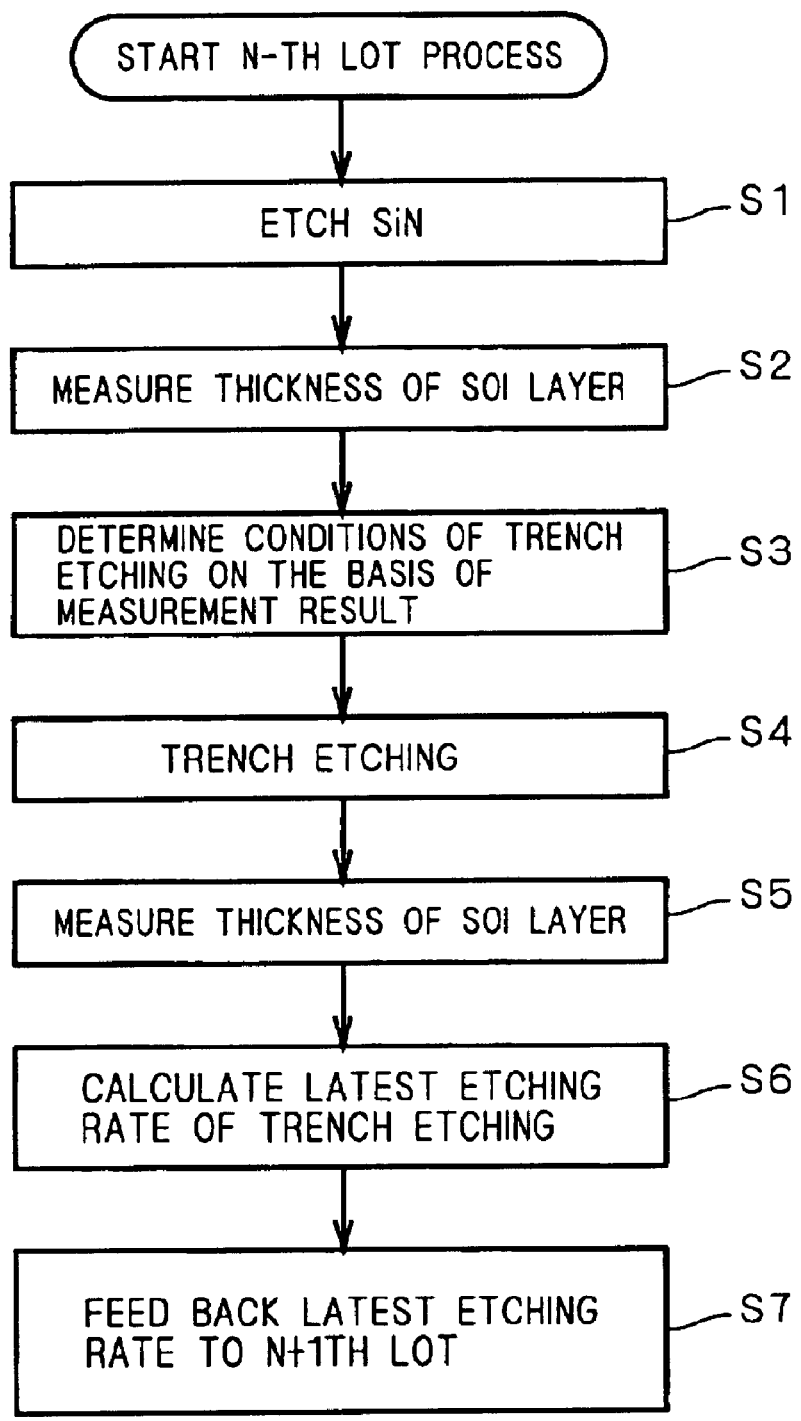
FIG. 22 is a flowchart for explaining the method of manufacturing the semiconductor device of the first embodiment according to the invention.

By using the flowchart shown in FIG. 22, the manufacturing method according to the first embodiment will be described hereinbelow.

When a process on an n-th lot is started, first, as described by using FIG. 21, nitride film 22 is patterned in step S1. At this time, as described above, there is the possibility that not only polysilicon film 21 but also oxide film 4 are etched and, in some instances, even SOI layer 3 is etched.

Consequently, after patterning nitride film 22, the thickness of SOI layer 3 is measured (step S2), and etching conditions (such as etching time) for SOI layer 3 are determined (step S3). To measure the thickness of SOI layer 3, it is sufficient to use spectroscopic ellipsometry which irradiates the surface of a substance with linearly polarized light and observes elliptically polarized light reflected by the surface of a substance.

When etching time is determined as an etching condition, a process described as follows is performed. Specifically, when it is assumed now that the measured thickness of SOI layer 3 is XS1, the thickness of SOI layer 3 in the beginning is XSOI, and a target trench depth (which is defined as a depth from the main surface of SOI layer 3 which is not etched yet) is XTR, in the case where the etching rate is ER1, etching time ET1 is determined by the following mathematical expression (1).

$$ET1 = \frac{XTR - (XSOI - XS1)}{ER1} \quad (1)$$

The etching condition determined is used and trench TR2 is formed by using patterned nitride film 22 as an etching mask (step S4). Since the parameter of the process advancing in the process progress direction in the lot is corrected, the above process is called a feed forward (FF) process.

In the etching, obviously, SOI layer 3 is left between the bottom of the trench and buried oxide film 2.

After trench TR2 is etched, the thickness of SOI layer 3 remaining on the bottom of the trench is measured (step S5). By using the result of the measurement, the latest etching rate for SOI layer 3 is calculated (step S6).

If the measured thickness of SOI layer 3 is XS2, from the measurement result XS1 in step S2 and the etching time ET1, the latest etching rate ER2 can be calculated by the following mathematical expression (2).

$$ER2 = \frac{XS1 - XS2}{ET1} \quad (2)$$

Since the etching rate may vary, although slightly, for each etching in accordance with the conditions of an etching apparatus, the etching rate for SOI layer 3 denotes one of the values of etching rates or an average value, the expression "latest" which means an updated numerical value is used.

The latest etching rate ER2 is given to the following n+1th lot process (step S7), and used to calculate the etching time for SOI layer 3 in step S3. That is, by using etching rate ER2 instead of etching rate ER1 of the mathematical expression (1) used in the process on the n-th lot, the etching time for SOI layer 3 is calculated. In such a manner, variations in lots of the final depth of trench TR2 can be further suppressed.

Since the process is a process of correcting the parameter of a process behind in the process progress direction in the lot, it is called a feedback process (FB process).

The above-described processes of steps S1 to S7 are also performed on each of the n+2th lot and the n+3th lot.

Figure 23:
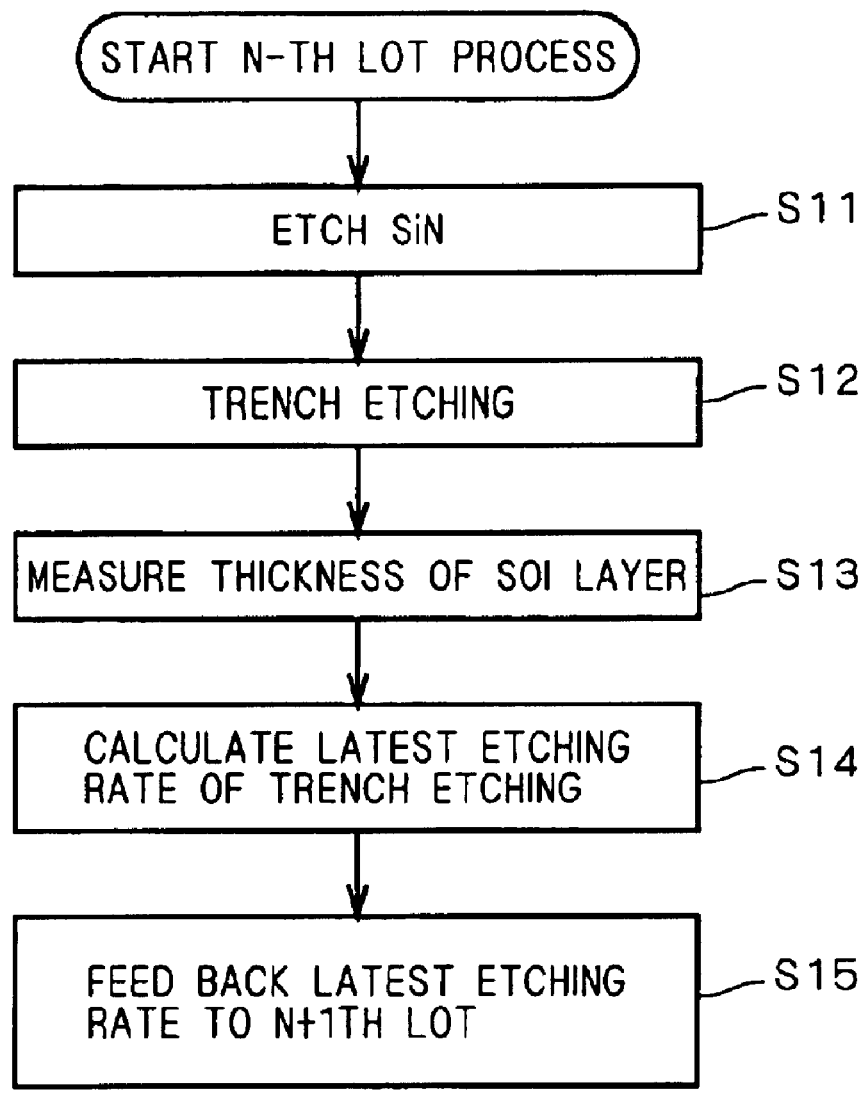
FIG. 23 is a flowchart in the case of performing only an FB process in the method of manufacturing the semiconductor device of the first embodiment according to the invention.

It is also possible not to perform the FF process but to perform only the FB process. FIG. 23 shows a flowchart in the case of performing only the FB process.

In step S11 of FIG. 23, nitride film 22 is patterned. After that, by using patterned nitride film 22 as an etching mask, trench TR2 is formed (step S12). In etching trench TR2, a known etching rate for SOI layer 3 is used. In patterning nitride film 22, etching time is set on assumption that SOI layer 3 is not etched.

After completion of the etching to form trench TR2, the thickness of SOI layer 3 remaining on the bottom of the trench is measured (step S13). By using the result of measurement, the latest etching rate for SOI layer 3 is calculated (step S14).

The latest etching rate can be obtained by calculating the depth of the trench from the thickness of SOI layer 3 remaining on the bottom of the measured trench and the initial depth of SOI layer 3 and dividing the calculated value by etching time.

The latest etching rate is given to the following n+1th lot process (step S15) and used in place of the known etching rate for SOI layer 3 at the time of setting the etching time for SOI layer 3 in step S12.

It is also possible not to perform the FB process but to perform only the FF process. In this case, it is sufficient to omit the steps S5 to S7 in the flowchart of FIG. 22.

A-2. Action and Effect

As described above, in the manufacturing method of the first embodiment, in each lot, after patterning nitride film 22, the thickness of SOI layer 3 is measured at least once and, by using the result of measurement, the etching condition for SOI layer 3 is determined, thereby enabling the final depth of trench TR2 to be uniform in lots.

The thickness of SOI layer 3 is measured also after formation of trench TR2, and the latest etching rate is calculated by using the result of measurement and is fed back for the following lot process. Thus, variations in lots of the final depth of trench TR2 can be further suppressed.

A-3 Modification 1

The manufacturing method of the foregoing first embodiment has been described on condition that in patterning nitride film 22, polysilicon film 21 and oxide film 4 are etched and even SOI layer 3 is etched. Also in the case where the selectivity of etching on nitride film 22 can be increased and in the case where polysilicon film 21 is sufficiently thick and SOI layer 3 is not etched, the measurement result of the thickness of SOI layer 3 can be used as follows.

The use of the measurement result of the thickness of SOI layer 3 will be described hereinbelow by using the flowchart of FIG. 24.

When the process of the n-th lot is started, first, as described by referring to FIG. 21, in step S21, nitride film 22 is patterned. It is now assumed that the selectivity of etching of nitride film 22 can be increased and only nitride film 22 is patterned.

Subsequently, by using nitride film 22 as an etching mask, polysilicon film 21 and oxide film 4 are patterned in steps S22 and S23, respectively.

After that, etching of the first time is performed on SOI layer 3 by using nitride film 22 as an etching mask (step S24). In the etching, etching time is set by using the known etching rate for SOI layer 3. Obviously, it is set so that the depth of the etching does not reach the final depth of trench TR2.

The thickness of SOI layer 3 is measured for the first time (step S25). By referring to the first etching rate calculated by using the result of measurement and the measured thickness of SOI layer 3, etching conditions (such as etching time) of etching of the second time on SOI layer 3 are determined in step S26 (FF process).

The etching rate of the first time can be obtained by calculating the depth of the trench from the thickness of SOI layer 3 remaining on the bottom of the measured trench and the initial depth of SOI layer 3 and dividing the calculated value by etching time of the first time.

Subsequently, etching is carried out by using etching conditions of the second time for SOI layer 3 determined in step S26. The etching is performed up to the final depth of trench TR2 (step S27).

After that, the thickness of SOI layer 3 is measured for the second time (step S28) and the latest etching rate is calculated by using the result of measurement (step S29).

The latest etching rate can be obtained by calculating the depth of the second etching by subtracting the thickness of SOI layer 3 remaining on the bottom of the trench measured for the second time from the thickness of SOI layer 3 remaining on the bottom of the trench measured for the first time and dividing the calculated value by the etching time of the second time.

The latest etching rate is given to the following n+1th lot process (FB process) in step S30 and used to calculate the etching conditions of the etching for the first time on SOI layer 3 in step 24.

As described above, in formation of trench TR2, SOI layer 3 is etched twice, the etching rate is calculated each time and the FF process and FB Process are performed, so that the final depth of trench TR2 can be made uniform in lots.

A-4. Modification 2

Figure 25:
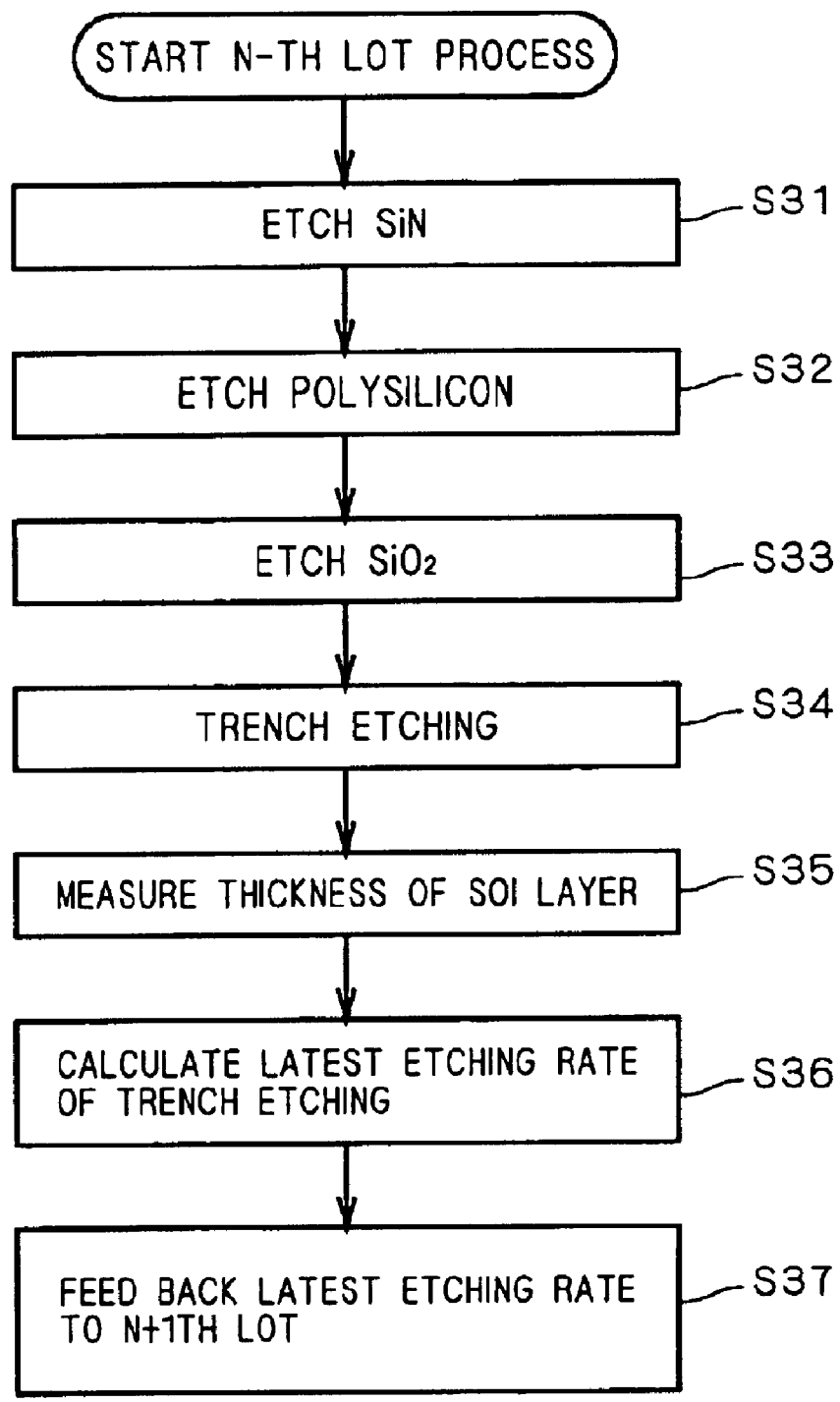

Although the example of etching SOI layer 3 twice has been described in the above-described modification 1, SOI layer 3 may be etched once as shown in the flowchart of FIG. 25.

Specifically, first, in step S31, nitride film 22 is patterned. It is now assumed that the selectivity of etching of nitride film 22 can be increased and only nitride film 22 is patterned.

Subsequently, by using nitride film 22 as an etching mask, polysilicon film 21 and oxide film 4 are patterned in steps S32 and S33, respectively.

After that, SOI layer 3 is etched by using nitride film 22 as an etching mask to thereby form trench TR2 (step S34). In the etching, etching time is set by using the known etching rate for SOI layer 3 and the etching depth is set so as to be the final depth of trench TR2.

After that, the thickness of SOI layer 3 is measured (step S35). By using the result of measurement, the latest etching rate is calculated (step S36).

The latest etching rate can be obtained by calculating the depth of the trench from the thickness of SOI layer 3 remaining on the bottom of the measured trench and the initial thickness of SOI layer 3 and dividing the calculated value by etching time.

The latest etching rate is given to the following n+1th lot process (FB process) in step S37 and used to calculate etching conditions of etching in step S34.

A-5. Monitor Pattern

In the foregoing first embodiment and its modifications, the manufacturing method of accurately forming a trench used to form a partial isolation oxide film in the so-called partial isolation oxide film in which SOI layer 3 is made remain between the bottom of a trench and buried oxide film 2 has been described.

Figure 26:
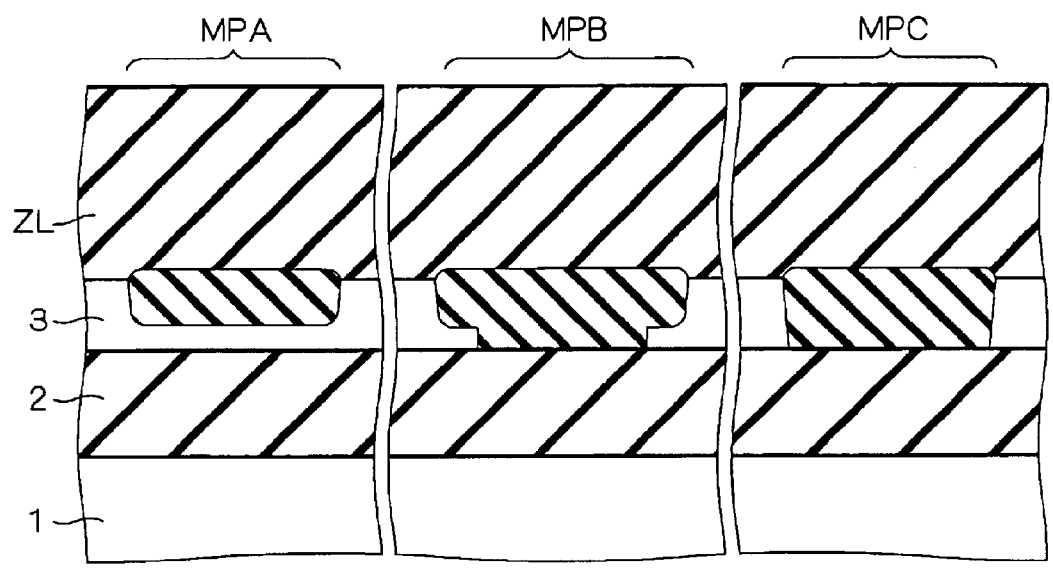
FIG. 26 is a cross section showing a monitor pattern for carrying out the method of manufacturing the semiconductor device of the first embodiment according to the invention.

To measure the thickness of SOI layer 3 remaining on the bottom of a trench, in reality, a monitor pattern provided in the peripheral portion of the SOI wafer is used. Concretely, a monitor pattern MPA shown in FIG. 26 is used. Monitor pattern MPA is a partial isolation oxide film having a simple plane shape (for example, a rectangular shape) and has a sufficiently large area so that measurement by spectroscopic ellipsometry can be performed.

The thickness of SOI layer 3 is measured in a process of forming monitor pattern MPA. After completion of monitor pattern MPA, an interlayer insulating film ZL is formed so as to cover the whole face of the wafer. Since a contact hole is formed in interlayer insulating film ZL, to prevent the contact hole from being over-etched, information of accurate thickness of interlayer insulating film ZL is necessary.

Consequently, the thickness of interlayer insulating film ZL is measured by spectroscopic ellipsometry. At this time, when interlayer insulating film ZL on monitor pattern MPA is measured, there is the possibility that the accurate result cannot be obtained for the following reason.

Specifically, when attention is paid to the configuration on silicon substrate 1, on silicon substrate 1 in the portion of monitor pattern MPA, buried oxide film 2, SOI layer 3, monitor pattern MPA, and interlayer insulating film ZL exist, and a multilayer structure of an oxide film and a silicon layer is formed. Therefore, in the case of performing the spectroscopic ellipsometry, a measurement result is analyzed on the basis of the multilayer structure. The analysis is complicated and it is difficult to obtain the accurate thickness of interlayer insulating film ZL.

It is consequently desirable to provide monitor patterns MPB and MPC shown in FIG. 26.

To be specific, monitor pattern MPB has a full trench isolation structure which penetrates SOI layer 3 in the center portion and reaches buried oxide film 2. In each of end portions, monitor pattern MPB has a partial trench isolation structure that SOI layer 3 remains under monitor pattern MPB. Consequently, monitor pattern MPB has the shape of a combined isolation oxide film in which a partial isolation oxide film and a full isolation oxide film are combined. Monitor pattern MPC is a full isolation oxide film.

Therefore, when attention is paid to the configuration on silicon substrate 1, the structure that only the oxide films exist on silicon substrate in each of the portions of monitor patterns MPB and MPC, so that analysis on the measurement result of the spectroscopic ellipsometry is facilitated.

B. Second Embodiment

B-1. Basic Configuration

The semiconductor device manufacturing method which prevents the channel stop implantation layer from being formed in an active region described by referring to FIGS. 14 to 20 has the process of forming internal-wall oxide film OX1 by oxidizing the internal wall of trench TR2 prior to filling of trench TR2 with an HDP oxide film as described by referring to FIG. 16. It is more preferable to use dry oxidation performed by furnace anneal in oxygen (O2) atmosphere of 800 to 1000° C. for the oxidizing process.

Figure 27:
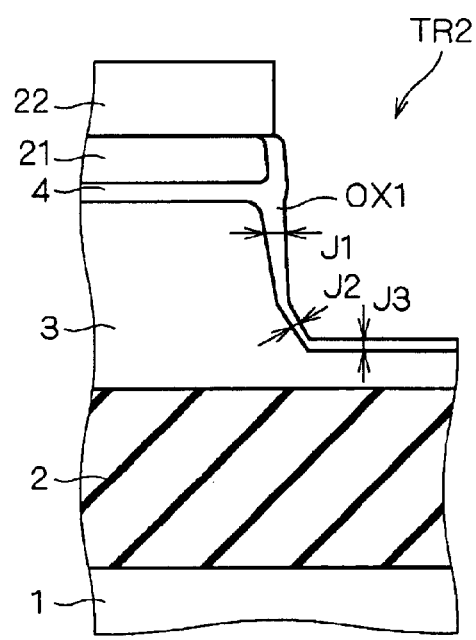
FIG. 27 is a cross section for explaining a method of manufacturing a semiconductor device of a second embodiment according to the invention.

FIG. 27 shows a sectional shape of internal-wall oxide film OX1 formed by dry oxidation. When dry oxidation is performed as shown in FIG. 27, the thickness of internal-wall oxide film OX1 is not uniform in portions.

Specifically, when the thickness of a portion formed on a side wall of trench TR2 of internal-wall oxide film OX1 is J1, the thickness of a portion formed at the corner on the bottom side of trench TR2 is J2, and the thickness of a portion formed on the bottom of trench TR2 is J3, the relations of thickness are J1>J3>J2.

B-2. Action and Effect

When internal-wall oxide film OX1 has such a structure, a structure with a little junction leak can be obtained.

The reason is that, when the side walls and bottom of trench TR2 are oxidized, a thick oxide film is formed and a volume increases. However, in the case of dry oxidation, in the corner portion on the bottom side of trench TR2, the degree of proportion of oxidation is low. Even if the oxide film on the side wall and the bottom expands to the corner portion, the oxide film in the corner portion does not become as thick as the oxide film in the side wall and that on the bottom. When a thick oxide film is formed at the corner on the bottom side, stress is concentrated on the thick oxide film. In the case where a PN junction exists near the corner, a junction leak occurs. However, in dry oxidation as described above, the oxide film at the corner is prevented from becoming thick, so that occurrence of the junction leak can be suppressed.

B-3. Modification 1

The sectional shape of trench TR2 shown in FIG. 27 is not a rectangular shape but the corner of the bottom is inclined so as to extend toward the opening. This is due to slow progress of etching in the corner portion at the time of performing etching to form the trench.

In such a structure, the width of the isolation defined by the width of the bottom face of the trench is narrowed, and insulation for isolation deteriorates. It is not desirable for trench isolation.

Figure 28:
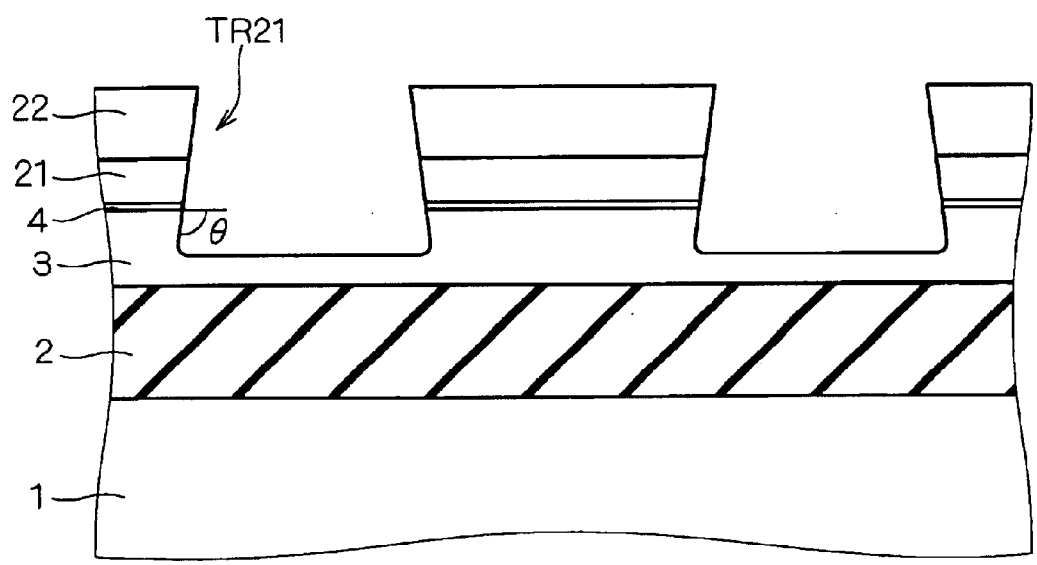

Consequently, at the time of performing etching to form the trench, etching conditions are set to perform rather over-etching, thereby forming a trench TR21 having a mesa sectional shape as shown in FIG. 28.

Figure 29:
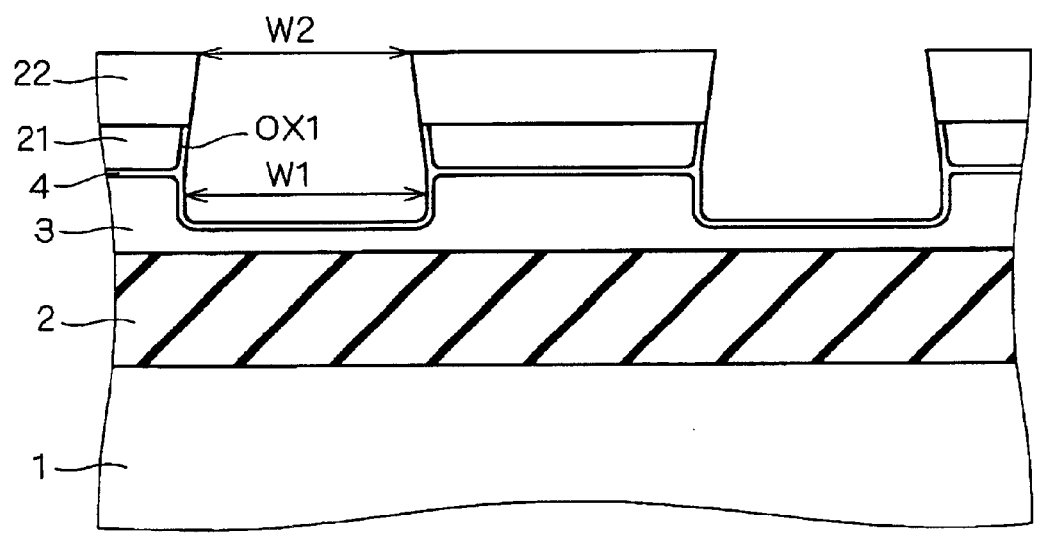

The side walls of trench TR21 are inclined so that the opening is widened from the nitride film 22 side toward the bottom, and the inclination angle is about 95° to 110°. FIG. 29 shows a state where internal-wall oxide film OX1 by, for example, dry oxidation in trench TR21 having such a shape.

As shown in FIG. 29, even when internal-wall oxide film OX1 is formed and the corners are rounded, since trench TR21 has the mesa sectional shape, an isolation width W1 (the width of the bottom face of the trench after internal-wall oxide film OX1 is formed) is not narrowed. Rather, the side walls of the trench become close to be perpendicular, and deterioration in insulation for isolation can be prevented.

In patterning of nitride film 22 for forming trench TR21, since trench TR"1 has a mesa sectional shape, a width W2 of the opening formed in nitride film 22 can be narrowed. By narrowing the opening in nitride film 22, the interval between trenches is further narrowed, and the degree of integration of a semiconductor device can be improved.

B-4. Modification 2

Although the foregoing second embodiment and the first modification are carried out on condition that the internal walls of trenches TR2 and TR21 are subjected to thermal oxidation to form internal-wall oxidation films OX1. From the viewpoint of not rounding the corners of the bottom portion of the trench, it is sufficient to use a CVD oxide film formed by CVD in place of internal-wall oxide film OX1 formed by thermal oxidation.

FIG. 30 shows a state where an internal-wall oxide film OX10 is formed by CVD on the internal walls of trench TR2. It is understood that the rounding of the corners of the bottom of the trench is suppressed and a relatively wide isolation width W3 is obtained. Internal-wall oxide film OX10 is formed also on the surface of nitride film 22.

In the case of forming an oxide film by CVD, unlike thermal oxidation, an underlayer (SOI layer 3 in this case) is not exposed to high temperature. Consequently, there is the possibility that a recovery is not made from a damage caused by etching to form a trench in the underlayer, so that the state of the interface between the CVD oxide film and the underlayer may be not good. However, by performing thermal oxidation a little after forming the CVD oxide film, the state off the interface with the underlayer can be improved.

C. Third Embodiment

The first and second embodiments have been described on condition that the partial isolation oxide film is used as a trench isolation oxide film. In the third and subsequent embodiments, the invention carried out in the case of using the full isolation oxide film and the combined isolation oxide film will be described.

In fabrication of a semiconductor device, a plurality of masks such as an etching mask and an implantation mask are used. In the third embodiment according to the invention, a method of easily obtaining mask data of a specific mask used for fabrication of a semiconductor device by processing other mask data is disclosed.

C-1. Device Configuration

Figure 31:
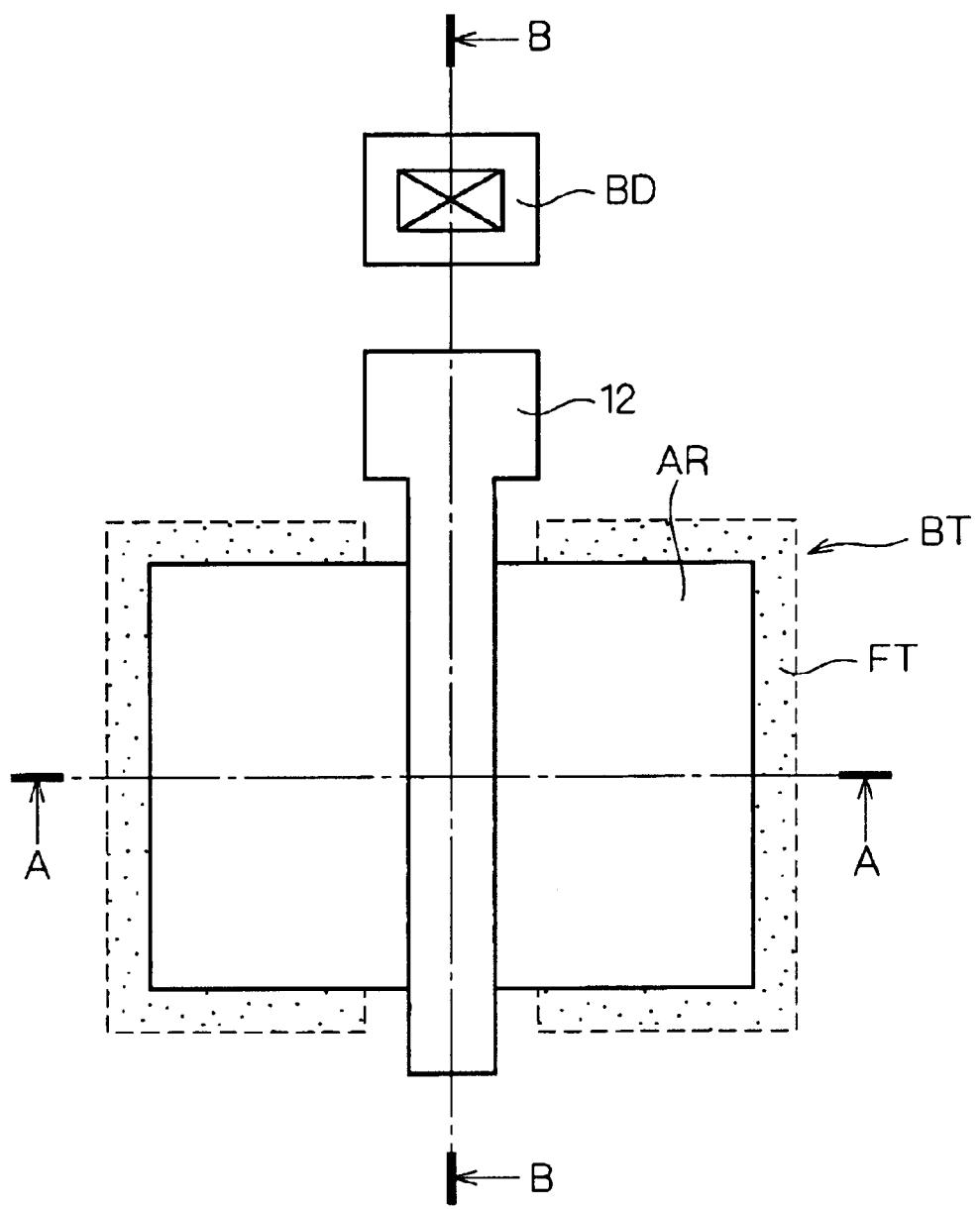
FIG. 31 is a plan view for explaining a method of manufacturing a semiconductor device of a third embodiment according to the invention.

FIG. 31 is a plan view showing the configuration used in the case of electrically isolating a MOS transistor by using a combined isolation oxide film.

In FIG. 31, a rectangular active region AR in which a MOS transistor is to be formed is defined by a combined isolation oxide film BT. A gate electrode 12 is disposed so as to divide rectangular active region AR into two parts and a body contact portion BD for fixing a body is provided on an extension line of gate electrode 12. The area for forming body contact portion BD is also defined by combined isolation oxide film BT.

Fixation of the body denotes fixation of a potential in a channel formation region via a well region remaining under a partial isolation oxide film.

Combined isolation oxide film BT has a structure in which the full isolation oxide film and the partial isolation oxide film are combined. In FIG. 31, combined isolation oxide film BT has a full isolation oxide film FT (indicated by hatch) disposed along the periphery of active region AR. In the other region, the partial isolation oxide film is provided.

Full isolation oxide film FT is interrupted near gate electrode 12. In a plan view, full isolation oxide film FT has a shape that two full isolation oxide films FT each having an almost C letter shape surround active region AR.

Figure 32:
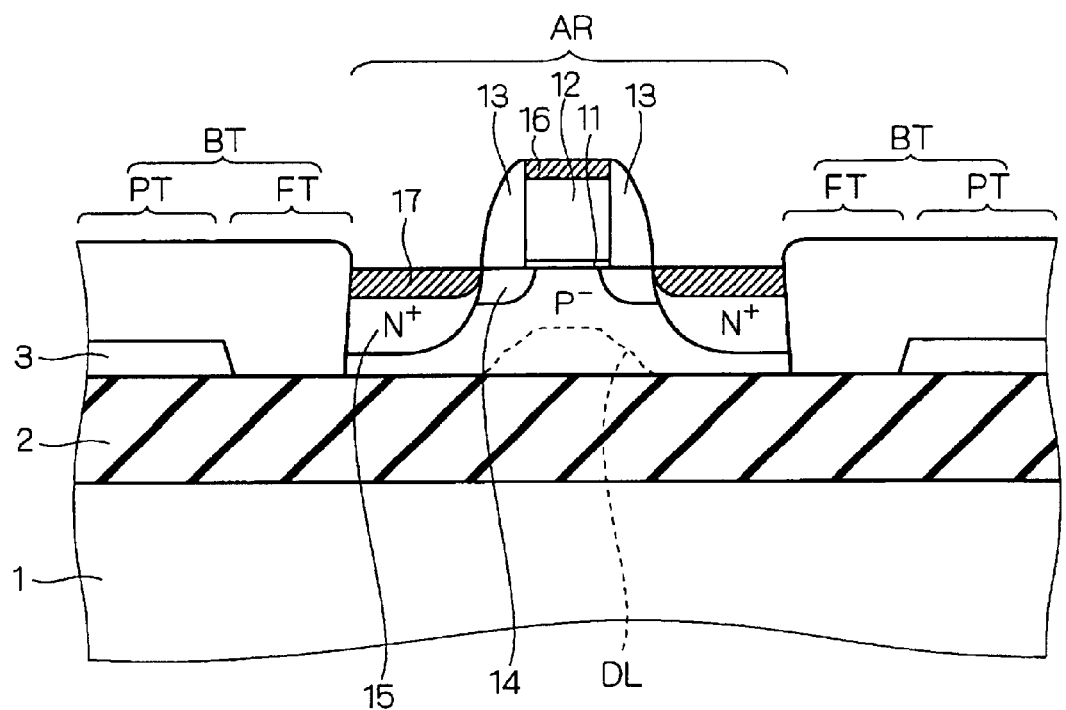
FIGS. 32 and 33 are cross sections for explaining a method of manufacturing the semiconductor device of the third embodiment according to the invention.
Figure 33:
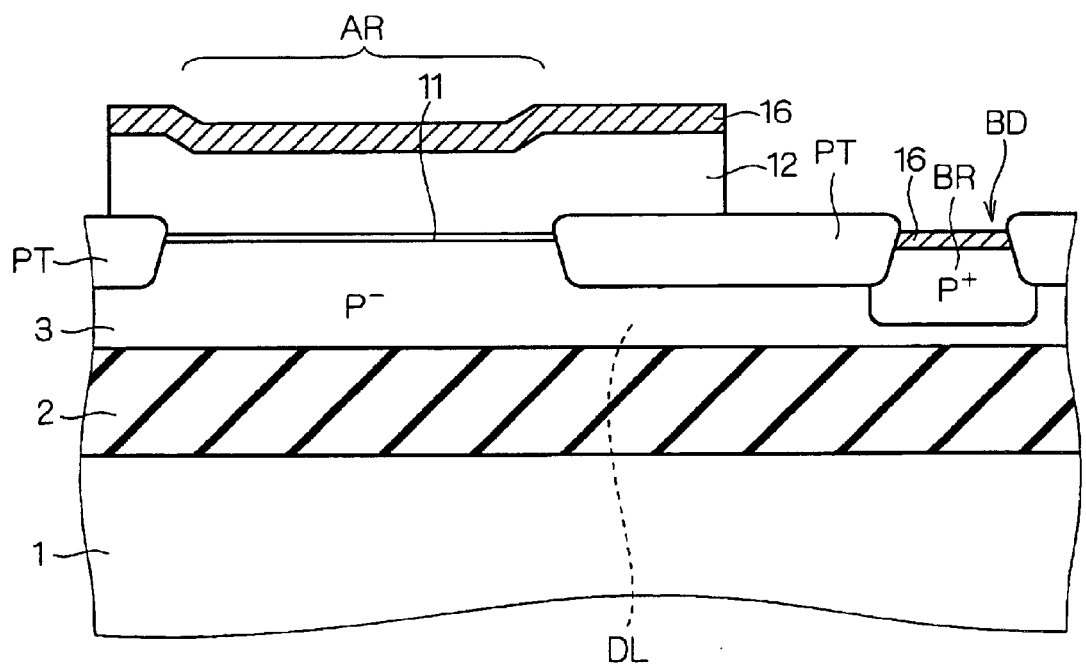

The configuration in a section taken along line A—A of FIG. 31 and that in a section taken along line B—B are shown in FIGS. 32 and 33, respectively. The configuration of a MOS transistor shown in each of FIGS. 32 and 33 is similar to that of FIG. 13. The same components are designated by the same reference numerals and their description will not be repeated. In FIG. 32, an example of a state where a depletion layer DL is formed is shown by a broken line.

As shown in FIG. 32, full isolation oxide film FT is disposed around active region AR in the direct ion of the gate length of gate electrode 12 so as to fully isolate active region AR. As shown in FIG. 33, partial isolation oxide film PT is disposed around active region AR in the direction of the gate width of gate electrode 12 to partially isolate active region AR. Therefore, active region AR is electrically connected to a body region (impurity region) BR of body contact portion BD via SOI layer 3 under partial isolation oxide film PT. The potential of active region AR is fixed to the potential of body contact portion BD (body fixation) and a field edge component of a PN junction capacity can be reduced, so that the device operation is stabilized, and high speed operation and low power consumption can be achieved.

To form two full isolation oxide films FT each having an almost C letter shape as shown in FIG. 31, a dedicated etching mask is necessary. However, labor is needed to manufacture the etching mask.

As a third embodiment according to the invention, a method of easily obtaining an etching mask used to form full isolation oxide film FT will be described hereinbelow.

C-2. Manufacturing Method

Prior to description of the method of forming the etching mask, processes of manufacturing the MOS transistor shown in FIG. 31 will be sequentially described.

Figure 34:
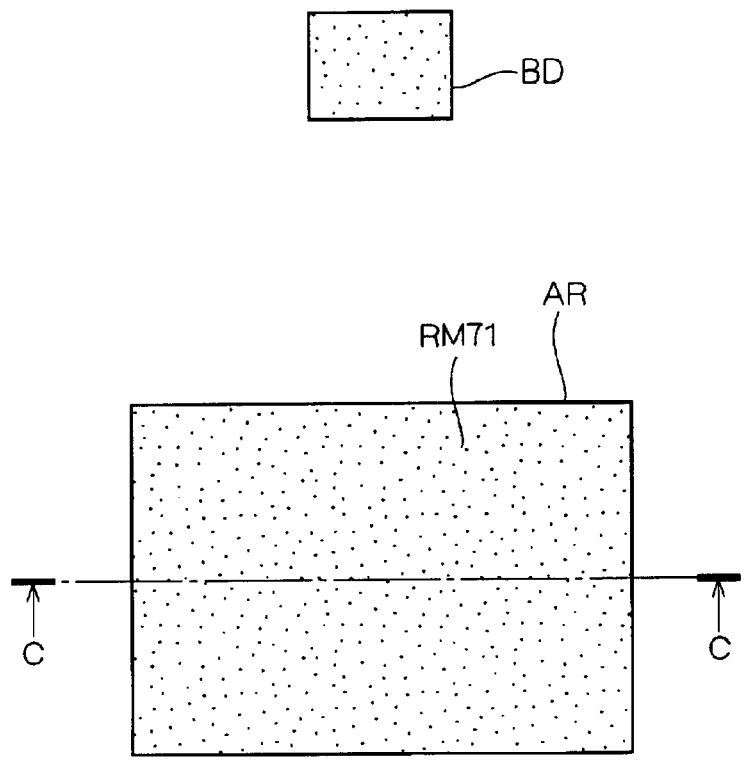
FIG. 34 is a plan view of a resist mask used for the method of manufacturing the semiconductor device of the third embodiment according to the invention.

First, in a process shown in FIG. 34, a resist mask RM71 for defining active region AR is disposed on the SOI layer. In the following description, the active region basically indicates a region in which a source/drain layer is formed. Therefore, data for forming resist mask RM71 is called field data L31 of the source/drain layer. Although a resist mask is disposed also on body contact portion BD, in the following, it is just shown in the drawing and its description will not be repeated.

Figure 35:
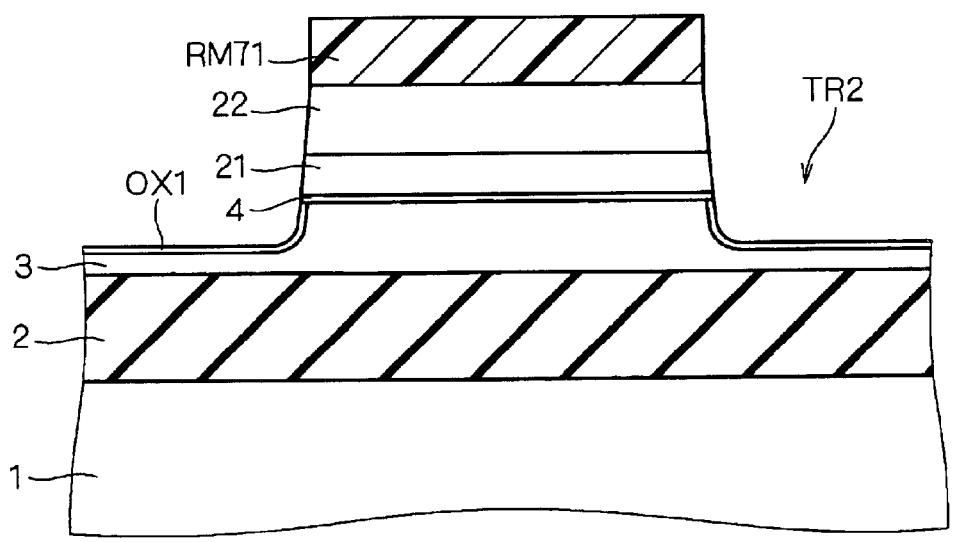
FIG. 35 is a cross section for explaining the method of manufacturing the semiconductor device of the third embodiment according to the invention.

FIG. 35 shows the configuration in the section taken along line C—C of FIG. 34. On SOI layer 3 as a component of the SOI substrate, oxide film 4, polysilicon film 21, and nitride film 22 are stacked. An etching mask used for patterning nitride film 22 is resist mask RM71. In FIG. 35, in a state where resist mask RM71 is left, trench TR2 for the partial isolation oxide film is formed and internal-wall oxide film OX1 is formed. In reality, etching to form a trench in oxide film 4, polysilicon film 21, and SOI layer 3 is performed as described above by removing resist mask RM1 and patterned nitride film 22 is used.

Subsequently, in a process shown in FIG. 36, a resist mask RM72 for forming a full isolation oxide film is disposed on the SOI substrate.

Resist mask RM72 is a mask having openings FTO each having an almost C letter shape corresponding to the formation portion of the full isolation oxide film. The two openings FTO are disposed so as to be partially overlapped with the peripheral portion of active region AR. Data for forming resist mask RM72 is called full isolation data F1.

It is assumed that, in opening FTO, a portion overlapped with the outside of active region AR has a predetermined width $\alpha$, a portion overlapped with active region AR has a predetermined width $\beta$, and there is a distance $\gamma$ between gate electrode 12 (broken line portion) to be formed later and both ends of opening FTO.

Figure 36:
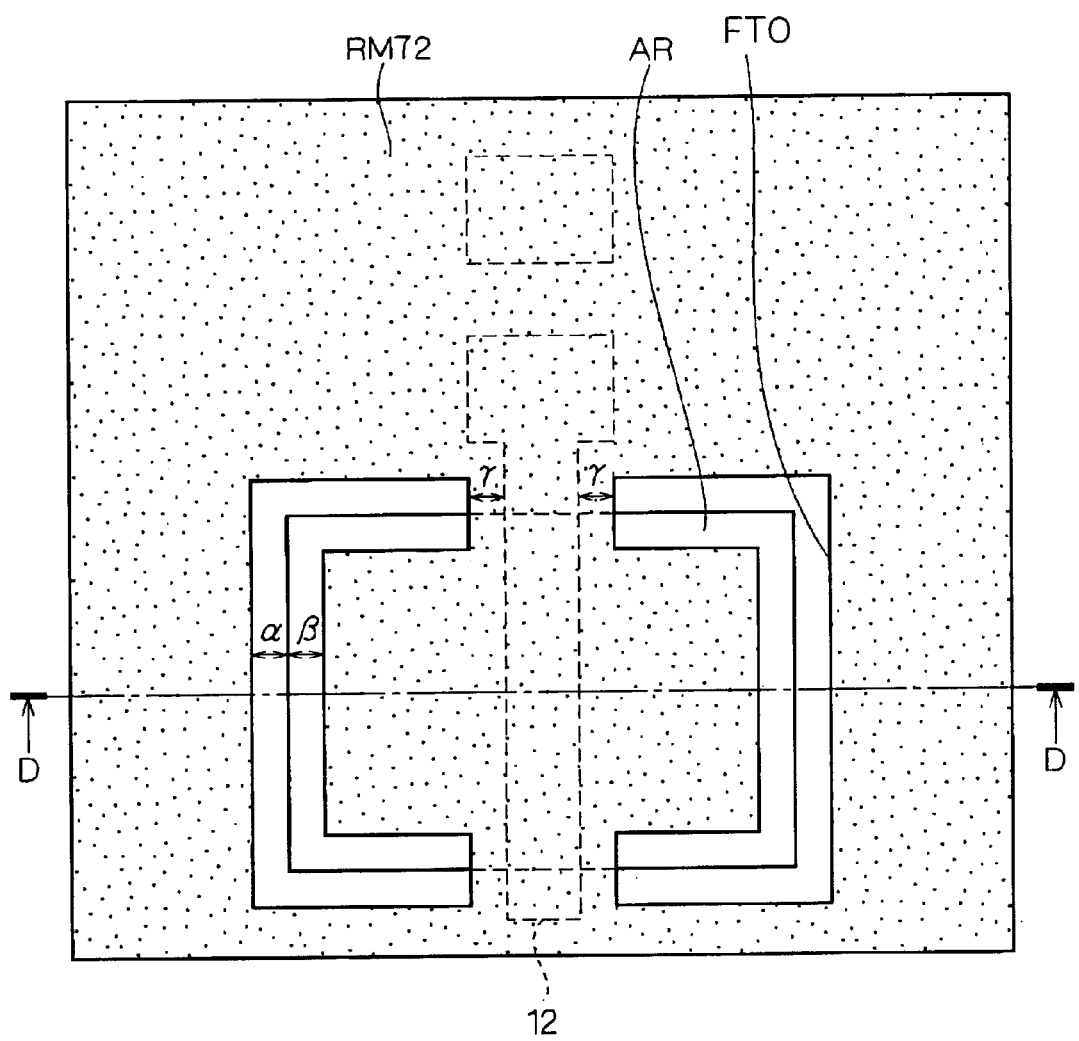
FIG. 36 is a plan view of a resist mask used for the method of manufacturing the semiconductor device of the third embodiment according to the invention.
Figure 37:
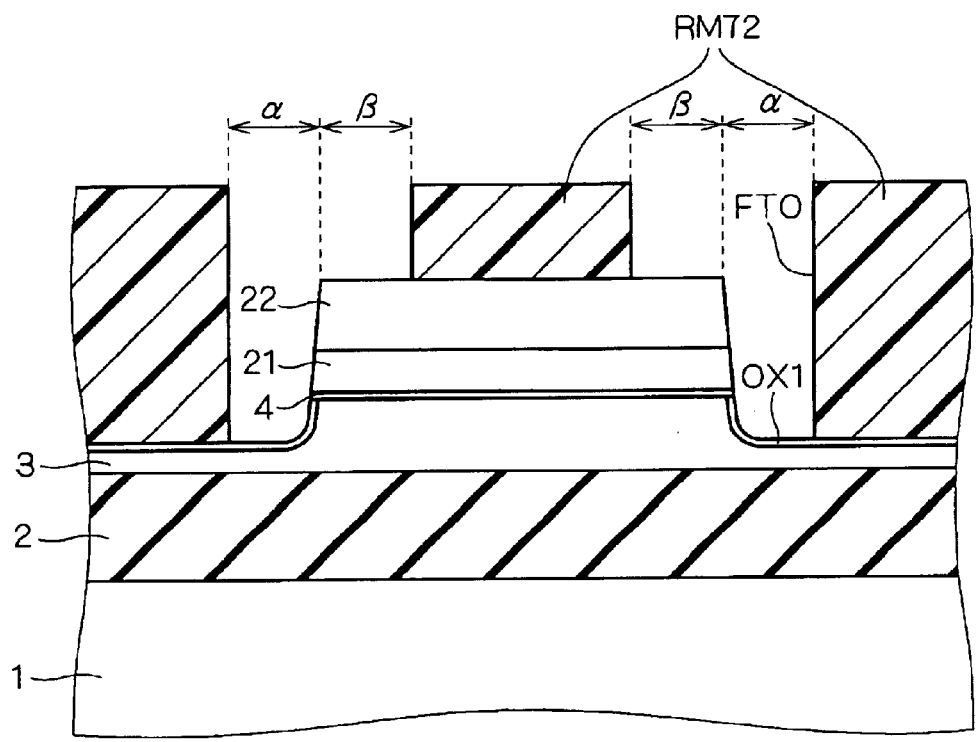
FIGS. 37 to 40 are cross sections for explaining the method of manufacturing the semiconductor device of the third embodiment according to the invention.
Figure 38:
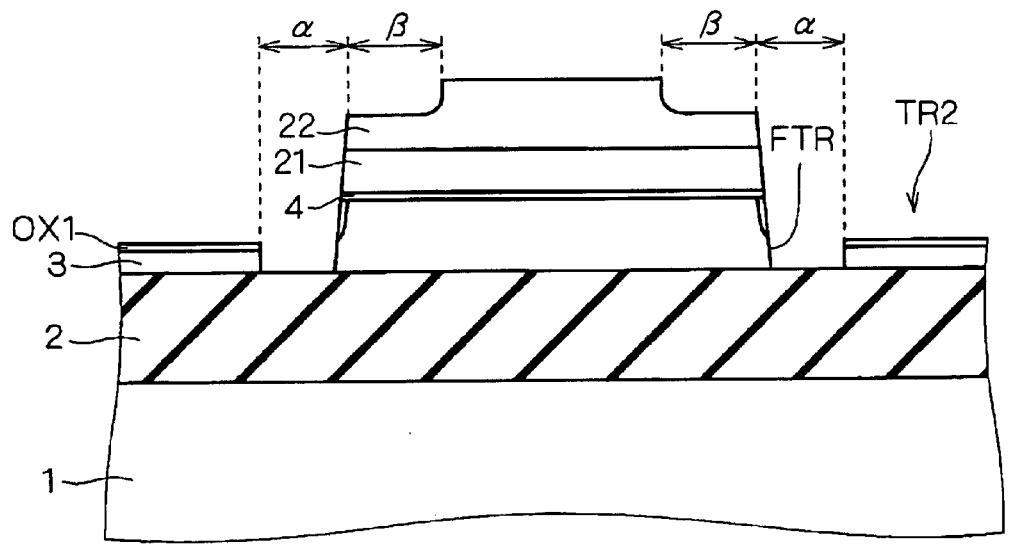

FIG. 37 shows the configuration in the section taken along line D—D in FIG. 36. As shown in FIG. 37, each of two openings FTO in resist mask RM72 is overlapped on trench TR2 only by width $\alpha$ and overlapped on active region AR only by width $\beta$. FIG. 38 shows a state where SOI layer 3 is etched by using resist mask RM72.

As shown in FIG. 38, a full trench FTR reaching buried oxide film 2 is formed in a portion corresponding to width $\alpha$ of trench TR2. Although the portion corresponding to width $\beta$ of nitride film 22 on active region AR is etched, there is no problem since nitride film 22 is removed finally.

Figure 39:
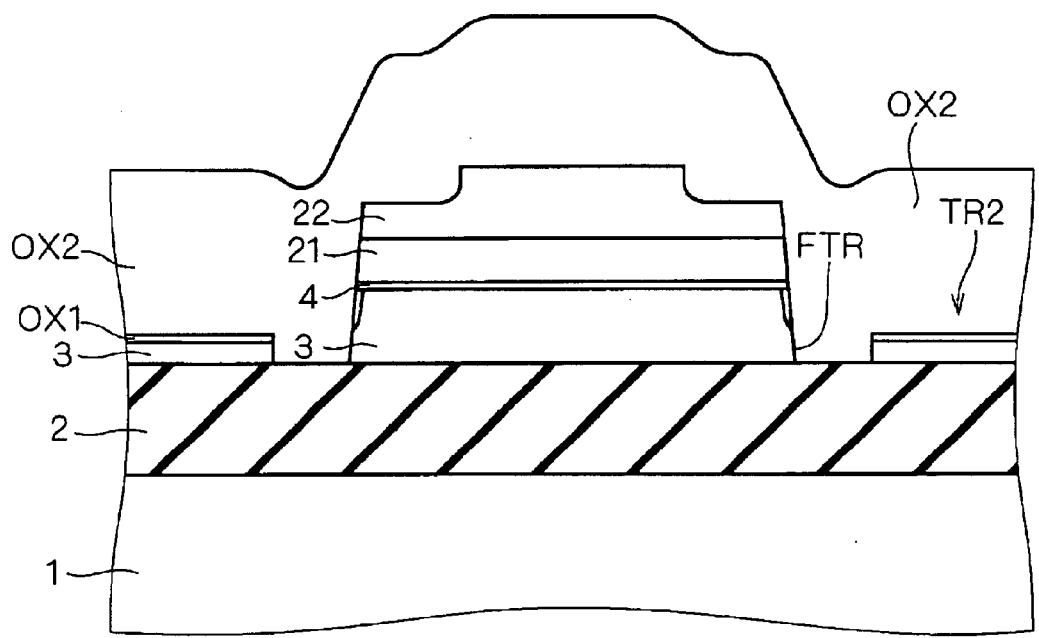
Figure 40:
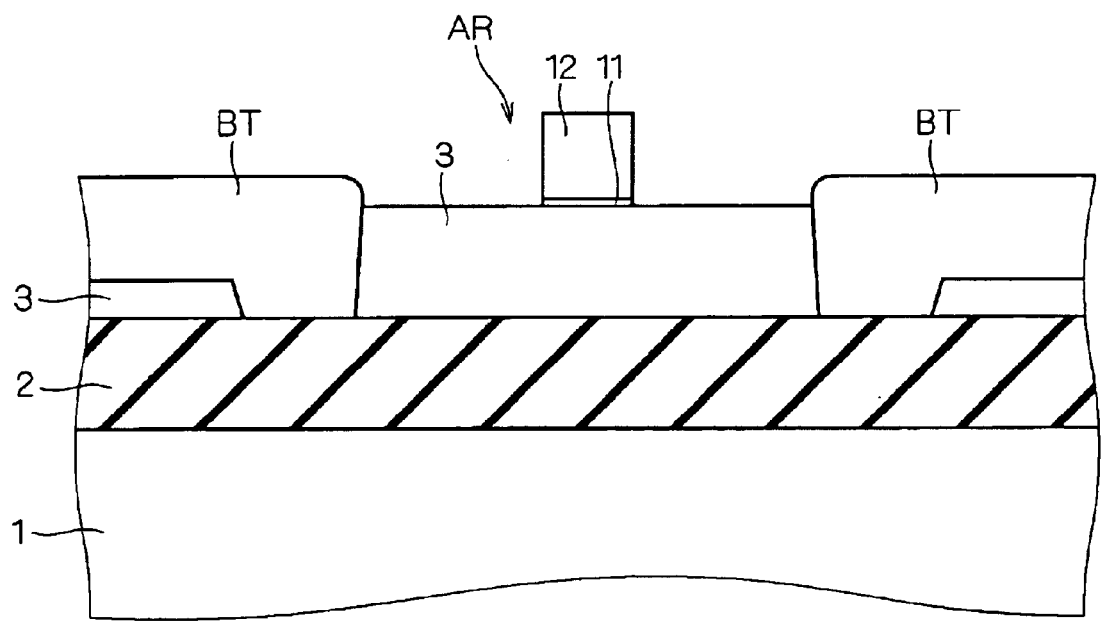

FIG. 39 shows a state where trench TR2 and full trench FTR are buried by an HDP oxide film OX2. After that, HDP oxide film OX2 is planarized, and nitride film 22, polysilicon film 21, and oxide film 4 are removed, thereby obtaining final combined isolation oxide film BT as shown in FIG. 40. By patterning insulating film 11 and polysilicon film 12 on active region AR defined by combined isolation oxide film BT, gate insulating film 11 and gate electrode 12 are obtained.

Figure 41:
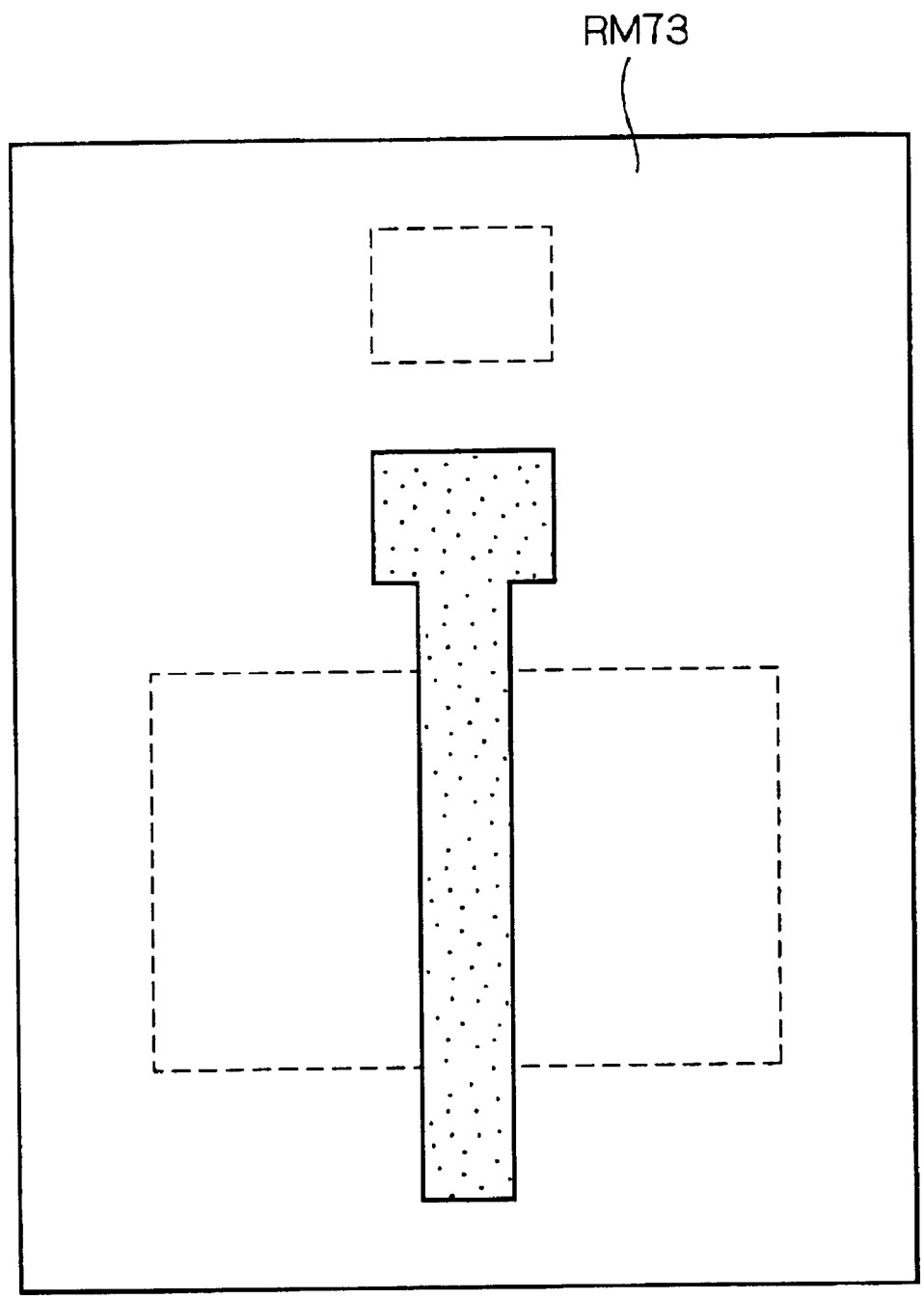
FIG. 41 is a plan view used for the method of manufacturing the semiconductor device of the third embodiment according to the invention. invention.

After forming combined isolation oxide film BT, gate insulating film 11 and gate electrode 12 are selectively formed on active region AR. The etching mask used at that time is a resist mask RM73 shown in FIG. 41. Resist mask RM73 is selectively disposed on the oxide film and polysilicon film formed on the whole face of the SOI substrate and has a pattern corresponding to the shape in plan view of gate electrode 12. By patterning the oxide film and polysilicon film, gate insulating film 11 and gate electrode 12 are formed. Data for forming resist mask RM73 will be called gate data L33.

C-3. Method of Generating Full Isolation Data

As described above, to form the MOS transistor shown in FIG. 31, at least three resist masks of resist masks RM71 to RM73 are necessary. However, by employing the following method, full isolation data F1 for forming resist mask RM72 can be easily obtained.

In generation of full isolation data F1, in addition to field data L31 and gate data L33 of the source/drain layer, the following is defined.

A data undersize process is expressed by an operator UN.

A data oversize process is expressed by an operator OV.

Subtraction of data is expressed by an operator "−".

The undersize process denotes a process of isotropically reducing target data only by a predetermined amount. For example, in the case of (L31 UN 0.1 $\mu$m), when initial field data L31 defines a rectangular region, it denotes that each of the four sides moves to the inside every 0.1 $\mu$m.

On the contrary, the oversize process denotes a process of isotropically increasing target data only by a predetermined amount. For example, in the case of (L31 OV 0.1 $\mu$m), when initial field data L31 defines a rectangular region, it denotes that each of four sides moves to the outside every 0.1 $\mu$m.

By the following arithmetic expression (3) using the values $\alpha$, $\beta$, and $\gamma$ showing the lengths as coefficients of the processes, full isolation data F1 can be obtained.

$$F1=(L31 OV\alpha)-(L31 UN\beta)-(L33 OV\gamma) \tag{3}$$

When it is now assumed that each of the coefficients $\alpha$, $\beta$, and $\gamma$ is 0.15 $\mu$m, according to (L31 OV $\alpha$), a rectangular region is obtained by isotropically expanding the rectangular region specified by field data L31 of the source/drain layer by 0.15 $\mu$m. According to (L31 UN $\beta$), by subtracting a rectangular region derived by isotropically reducing the rectangular region specified by field data L31 of the source/drain layer by 0.15 $\mu$m from the expanded rectangular region, the rectangular loop region having a width of $\alpha+\beta$ (=0.3 $\mu$m) is obtained.

Further, according to (L33 OV $\gamma$), by subtracting a region obtained by isotropically expanding a gate region specified by gate data L33 from the rectangular loop region, full isolation data F1 for generating resist mask RM72 having two facing C-shaped openings FTO as shown in FIG. 36 can be derived.

C-4. Action and Effect

According to the above-described method of generating the full isolation data, full isolation data F1 can be obtained from field data L31 and the source/drain layer and gate data L33. Thus, fabrication of an etching mask for forming full isolation oxide film FT required at the time of forming combined isolation oxide film BT is facilitated, and the manufacturing cost of the semiconductor device can be reduced.

C-5. Application Example 1

The above-described method can be applied as follows.

Figure 42:
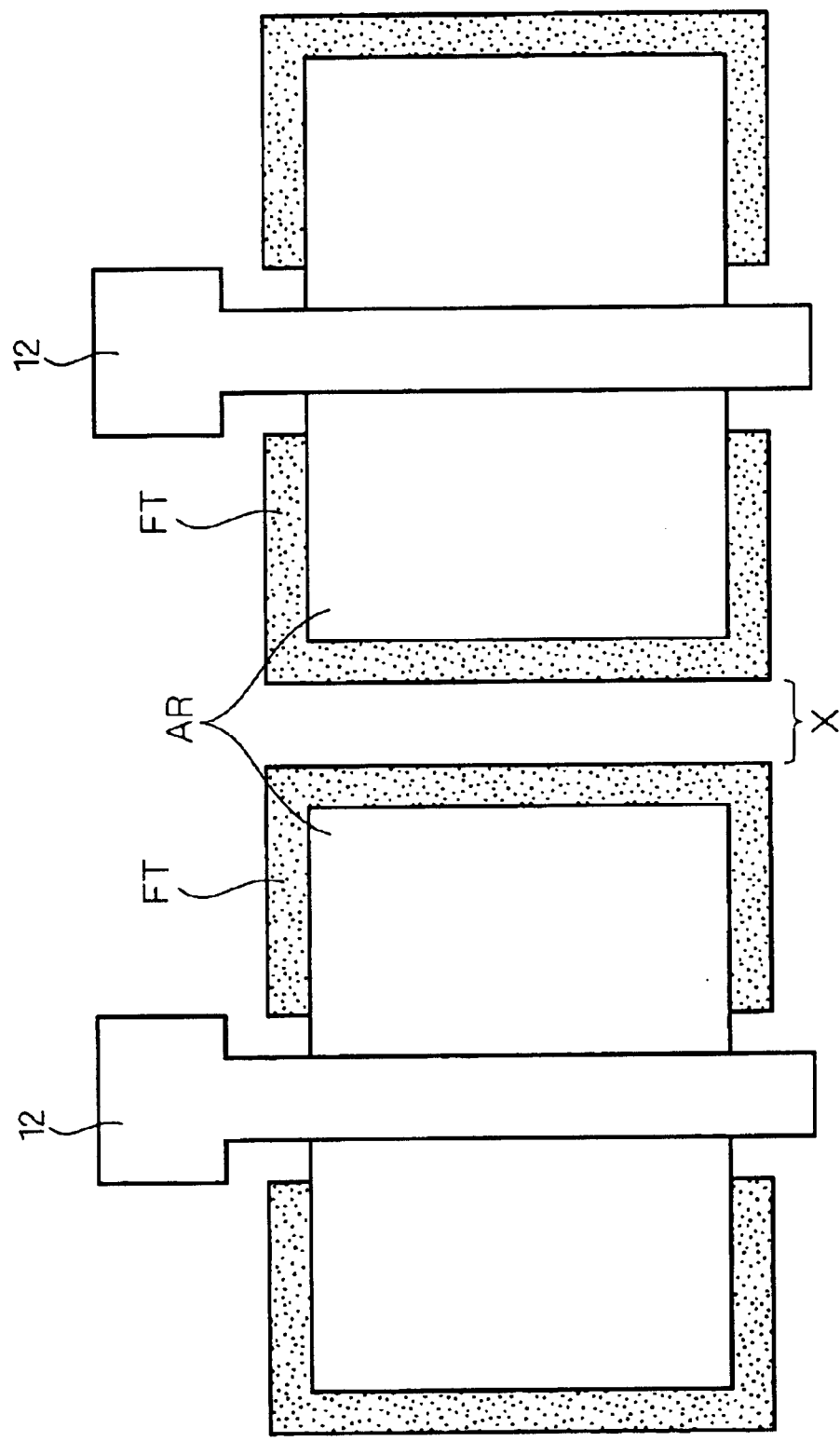

FIG. 42 is a plan view showing the configuration in which two MOS transistors are disposed adjacent to each other. Gate electrodes 12 of the two transistors are disposed so as to be parallel to each other. Each of the MOS transistors is electrically isolated by the combined isolation oxide film in which a portion surrounding active region AR serves as full isolation oxide film FT.

However, a partial isolation region X in which full isolation oxide film FT is not formed exists between neighboring active regions AR. In the region, a partial isolation oxide film is formed, and the SOI layer exists under the partial isolation oxide film.

When a narrow partial isolation region exists as described above, the pattern of the etching mask is complicated and the manufacturing cost increases. Consequently, it is desirable to avoid the narrow partial isolation region as much as possible. In such a case as well, the above-described method of generating full isolation data is effective.

FIG. 43 is a diagram expressing full isolation data F1 obtained on the basis of the arithmetic expression (3) to obtain the configuration of FIG. 42. The width of partial isolation region X between neighboring openings FTO is 2δ.

When the process is performed on the basis of data, the configuration shown in FIG. 42 is obtained. In the example, full isolation data F1 is further processed by the following arithmetic expression (4) to thereby obtain full isolation data F2.

$$F2 = (F1 \text{ OV} \delta) \text{UN} \delta \quad (4)$$

When a length δ corresponding to the half of the width of partial isolation region X is set as a coefficient δ in each process, and coefficient δ is about 0.15 μm, according to (F1 OV δ), opening FTO specified by full isolation data F1 is isotropically widened by 0.15 μm. To be accurate, opening FTO should be referred to as data for forming opening FTO, but it will be called opening FTO for simplicity. The following other openings will be called similarly. It is also possible to set the half of, not the width of partial isolation region X between neighboring openings FTO, but the width of neighboring active regions as coefficient δ. In short, any value can be used as long as it is determined on the basis of the disposing interval of neighboring MOS transistors and by which neighboring openings FTO can be made contact with each other with reliability.

FIG. 44 schematically shows a state where openings FTO are subjected to the oversize process. In FIG. 44, openings FTO1 and FTO2 obtained by performing the oversize process on full isolation data F1 are shown by solid lines, and initial openings FTO are shown by broken lines. As shown in FIG. 44, by performing the oversize process on full isolation data F1, neighboring openings FTO come into contact with each other, and opening FTO1 has an almost H shape (or I shape) in plan view. On both sides of opening FTO1, openings FTO2 each having an almost C shape and maintaining the initial shape of opening FTO are formed.

Subsequently, according to (F1 OV δ) UNδ, FIG. 45 schematically shows a state where openings FT01 and FT02 are subjected to the undersize process.

FIG. 45 schematically shows openings FTO11 and FTO12 obtained by 0.15 μm isotropically reducing openings FTO1 and FTO2, respectively. As a result, opening FTO12 is substantially the same as opening FTO in full isolation data F1 and opening FTO11 is reduced while maintaining the almost H shape.

FIG. 46 is a plan view of MOS transistors manufactured by using the etching mask formed on the basis of full isolation data F2 having openings FTO11 and FTO12 of such shapes.

As shown in FIG. 46, on the end portions of neighboring active regions AR and between neighboring active regions AR of two MOS transistors disposed adjacent to each other, full isolation oxide film FT1 having an almost H shape is formed. In each of the two MOS transistors, active region AR on the side opposite to active region AR surrounded by full isolation oxide film FT1 is surrounded by full isolation oxide film FT as shown in FIG. 42.

As described above, by processing the full isolation data by simple arithmetic operation, the existence of a narrow partial isolation region between the neighboring active regions of the two MOS transistors disposed adjacent to each other is prevented. The pattern of the etching mask is simplified, so that the manufacturing cost can be reduced.

C-6. Application Example 2

Although the method of easily obtaining mask data for forming a full isolation oxide film as a part of the combined isolation oxide film by processing other mask data has been mentioned, field data L31 of the source/drain layer can be also obtained by using the method.

Addition of data is expressed by an operator "+" and a data adding process is expressed by an operator AND. All of field data is expressed as whole field data L311, data for defining a P-type impurity implantation region for forming a P-type well is expressed as P-type well data L24, data for defining an N-type impurity implantation region for forming an N-type well is expressed by N-type well data L20, data for defining an N-type impurity implantation region for forming an N-type source/drain layer is expressed as N-type source/drain data L18, and data for defining a P-type impurity implantation region for forming a P-type source/drain layer as P-type source/drain data L17. Field data L31 of the source/drain layer can be obtained on the basis of the following arithmetic expression (5).

$$L1 = L31 \text{ AND } L24 \text{ AND } L18 + L31 \text{ AND } L20 \text{ AND } L17 \quad (5)$$

D. Fourth Embodiment

In the semiconductor device manufacturing method described by referring to FIGS. 1 to 20, at the time of forming a partial isolation oxide film, a partial trench is formed and, after that, an internal-wall oxide film is formed in the partial trench. Also in formation of a full isolation oxide film and a combined isolation oxide film, a partial trench is formed once, an internal-wall oxide film is formed and, after that, a desired full trench is formed, thereby obtaining the following effects.

D-1. Manufacturing Method

First, by referring to FIGS. 47 to 51 as cross sections sequentially showing the manufacturing process, a semiconductor device manufacturing method of a fourth embodiment according to the invention will be described.

Figure 47:
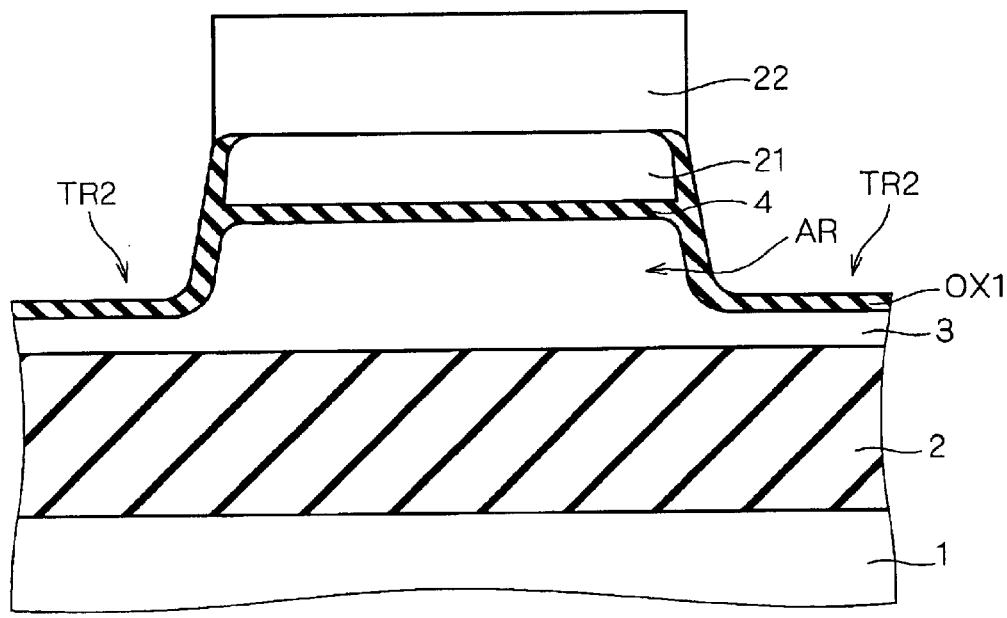
FIGS. 47 to 51 are cross sections for explaining a method of manufacturing a semiconductor device of a fourth embodiment according to the invention.

FIG. 47 is a diagram corresponding to the process described by referring to FIG. 16 and shows a state where the internal wall of trench TR2 is oxidized to thereby form internal-wall oxide film OX1.

Figure 48:
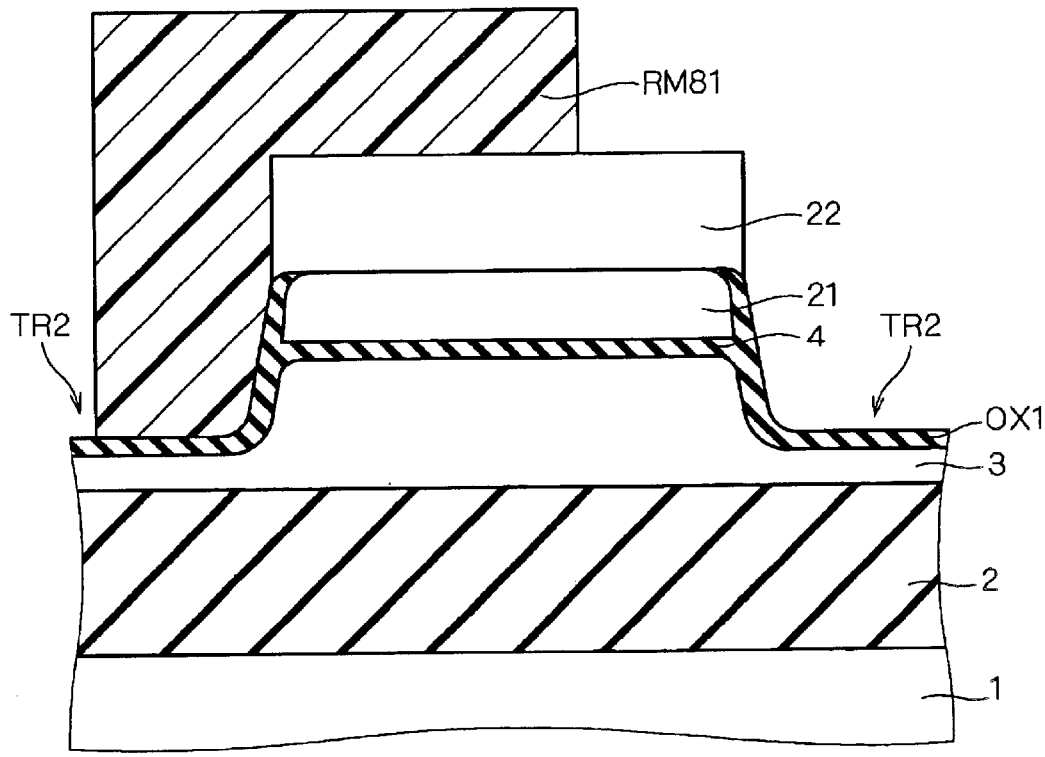

Subsequently, as shown in FIG. 48, for the purpose of forming a full trench, a resist mask RM81 having a predetermined opening pattern is formed on the full face of the SOI substrate.

The predetermined opening pattern is a pattern in which all of trench TR2 on the right side in the drawing is an opening and, in trench TR2 on the left side in the drawing, a portion near the end portion of active region AR is covered with a resist and the other portion is open.

Figure 49:
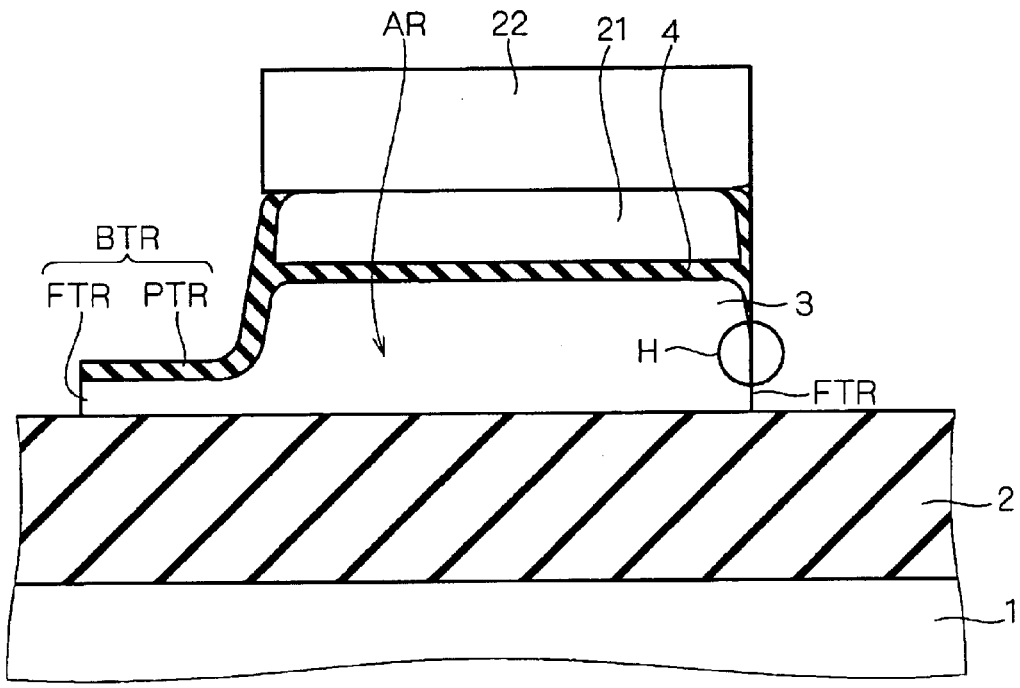

By performing etching (full trench etching) to buried oxide film 2 by using such resist mask RM81, as shown in FIG. 49, full trench FTR is formed on the right side in the drawing of active region AR, and combined trench BTR having full trench FTR and partial trench PTR is formed on the left side in the drawing of active region AR.

In this case, in full trench FTR, the bottom face of trench TR2 is removed by etching, internal-wall oxide film OX1 exists only in the upper part of a side wall of SOI layer 3, and internal-wall oxide film OX1 does not exist in the lower part of the side wall.

In combined trench BTR, internal-wall oxide film OX1 exists only in partial trench PTR, and internal-wall oxide film OX1 does not exist on the side wall of SOI layer 3 of full trench FTR.

Since internal oxide film OX1 does not exist near the interface between buried oxide film 2 and SOI layer 3 as described above, internal-wall oxide film OX1 does not enter the interface of buried oxide film 2 and SOI layer 3. It can be prevented that the shape of SOI layer 3 is deformed so as to be warped, a mechanical stress is applied, and a junction leak occurs.

On the side walls of SOI layer 3 on the full trench FTR side, internal-wall oxide film OX1 becomes gradually thinner like the H-shaped portion shown in FIG. 49, so that the configuration contributes to reduce a mechanical stress applied on SOI layer 3. FIG. 49 is a cross section taken along lines E-F-G-H of FIG. 46.

Figure 50:
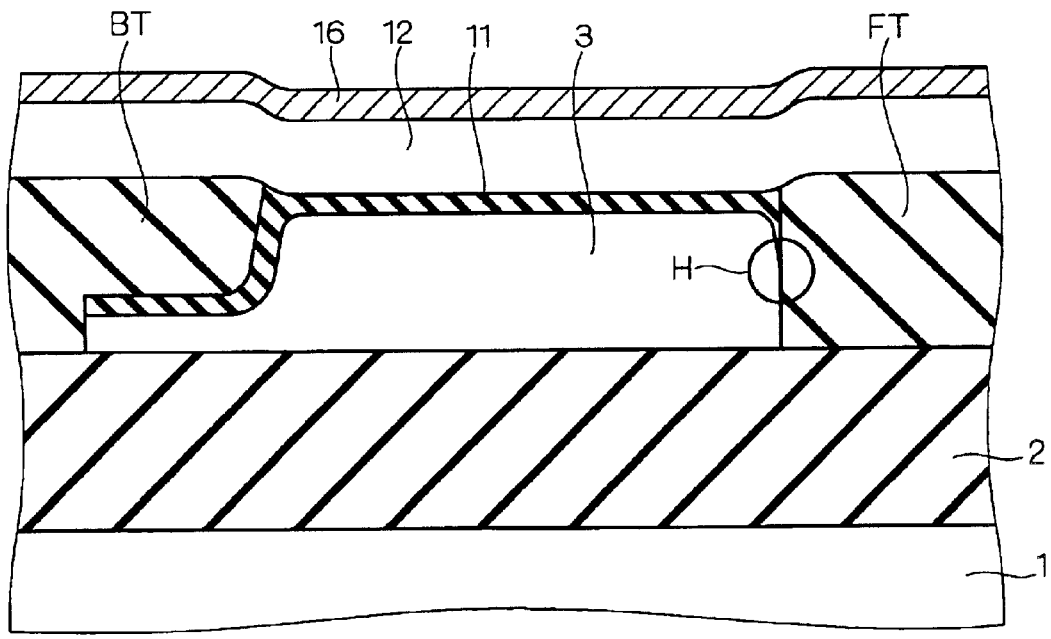

The process will be described again. Full trench FTR and combined trench BTR are buried in an HDP oxide film and, after that, as described by referring to FIG. 19, the HDP oxide film is etched to a predetermined thickness by a hydrofluoric acid (HF) process using nitride film 22 as an etching mask. Subsequently, nitride film 22 and polysilicon film 21 are removed. Further, oxide film 4 is removed and, instead, gate insulating film 11 is formed. On gate insulating film 11, gate electrode 12 and silicide layer 16 are formed. In such a manner, as shown in FIG. 50, a configuration that full isolation oxide film FT and combined isolation oxide film BT are provided on the right and left sides, respectively, of active region AR is achieved.

Figure 51:
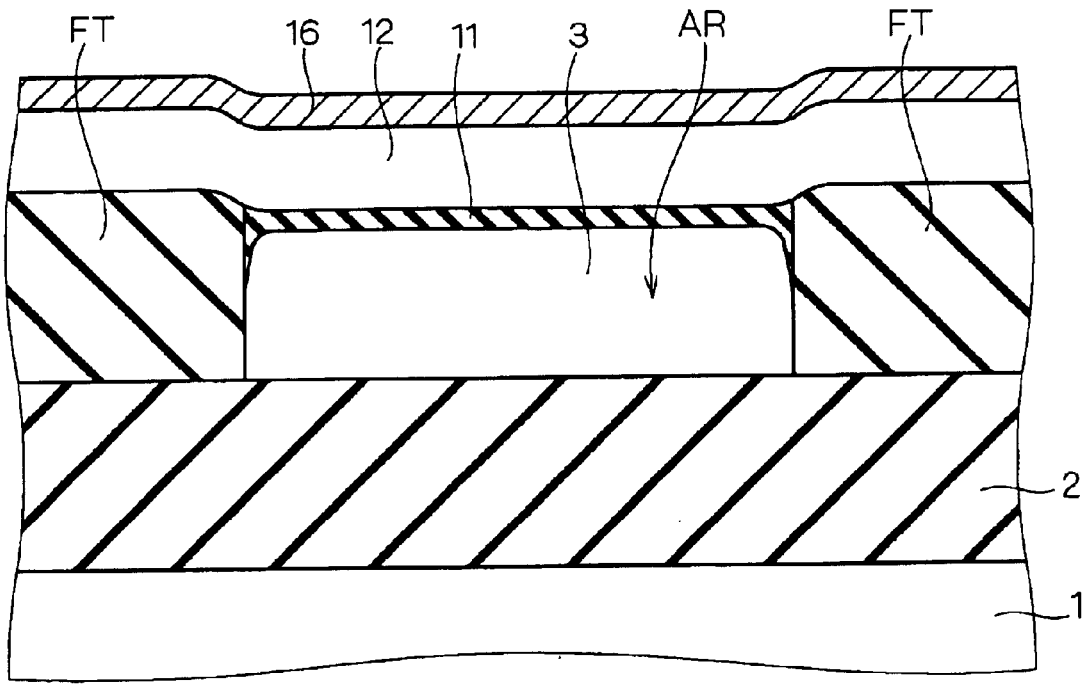

Although the method of obtaining the configuration that full isolation oxide film FT and combined isolation oxide film BT are provided on the right and left sides of active region AR has been described above, by forming the opening pattern of resist mask RM81 described with reference to FIG. 48 as a pattern in which both the right and left trench TR2 portions are open, a full trench can be formed on each of the right and left sides of active region AR and, finally, as shown in FIG. 51, a configuration that full isolation oxide film FT is provided on both of the right and left sides of active region AR can be easily obtained. There is also a case that both of the configurations of FIGS. 50 and 51 are simultaneously obtained.

D-2. Action and Effect

As described above, according to the semiconductor device manufacturing method of the fourth embodiment, in any of the configuration that full isolation oxide film FT and combined isolation oxide film BT are provided on the right and left sides of active region AR and the configuration that full isolation oxide film FT is provided on the right and left sides of active region AR, internal-wall oxide film OX1 does not exist near the interface between buried oxide film 2 and SOI layer 3. Therefore, internal-wall oxide film OX1 does not enter the interface of buried oxide film 2 and SOI layer 3. It can be prevented that the shape of SOI layer 3 is deformed so as to be warped, a mechanical stress is applied, and a junction leak occurs.

On the side walls of SOI layer 3 on the full trench FTR side, internal-wall oxide film OX1 becomes gradually thinner as shown in a region H, so that the configuration contributes to reduce a mechanical stress applied on SOI layer 3.

Conventionally, at the time of forming a full isolation oxide film and a combined isolation oxide film, a full trench is formed and, after that, the internal wall is oxidized. In this case, the internal-wall oxide film enters the interface between the buried oxide film and the SOI layer, and the shape of the SOI layer is deformed so as to be warped. In order to prevent the deformation, in some cases, the following method is employed.

Specifically, at the time of forming a full trench in the SOI layer, a trench is formed so that the SOI layer of a thickness about the thickness of the internal-wall oxide film remains on the bottom face and, after that, thermal oxidation is performed. Thus, not only the SOI layer on the side walls of the trench is oxidized but also the SOI layer on the bottom of the trench is fully oxidized, thereby forming the internal-wall oxide film.

By the method, an oxidant (for example, oxygen) can be prevented from entering the interface between the buried oxide film and the SOI layer to a certain extent but not fully. In the case where the SOI layer to be left on the bottom of the trench is unexpectedly thick due to variations in etching and is not fully oxidized, the SOI layer partially remains and may cause a current leak.

However, according to the semiconductor device manufacturing method of the fourth embodiment, internal-wall oxide film OX1 does not enter the interface between buried oxide film 2 and SOI layer 3, it is unnecessary to make the SOI layer remain at the time of forming a full trench, and a full trench can be formed by sufficient over-etching. Consequently, there is also an advantage that the etching control is facilitated.

E. Fifth Embodiment

E-1. Device Configuration

Although attention is paid to the above-described partial trench isolation (PTI) structure as a structure capable of realizing the body fixation of fixing the potential of the channel formation region via the well region remaining under the partial isolation oxide film, it is not always necessary to fix all of the regions of the semiconductor device. There is also a region for which a floating structure is preferably employed by using the features of the SOI device.

For example, there may be a case that, in a system LSI, a random logic part has the PTI structure in which the body fixation is performed, and an SRAM part has a floating structure as the FTI structure (full trench isolation structure).

As a fifth embodiment according to the invention, a semiconductor device in which the random logic part has the PTI structure and the SRAM part has the FTI structure will be described hereinbelow.

Figure 52:
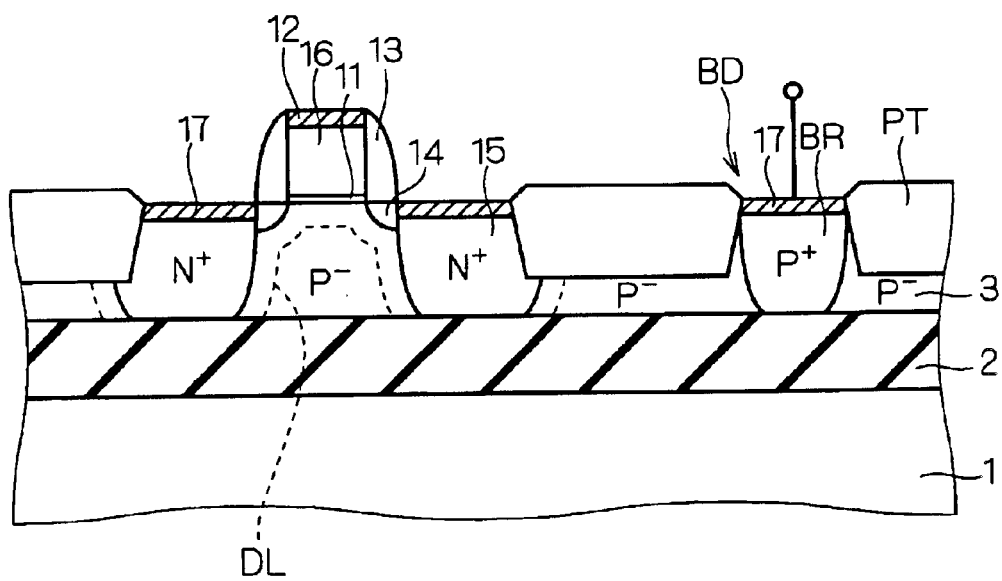
FIGS. 52 and 53 are cross sections for explaining the configuration of a semiconductor device of a fifth embodiment according to the invention.

FIG. 52 is a cross section showing the configuration in the case where a MOS transistor surrounded by the PTI structure is fixed to the potential of the body contact portion. Active region AR is electrically connected to impurity region (body region) BR of body contact portion BD via SOI layer 3 (P-type well) under partial isolation oxide film PT, and the potential of active region AR is fixed to the potential of body contact portion BD (body fixation). Body contact portion BD is constructed by a P-type impurity region formed in the surface of SOI layer 3, and silicide layer 17 is provided on the P-type impurity region.

Therefore, by applying a predetermined potential to body contact portion BD and fixing the potential of the MOS transistor shown in FIG. 52 to the potential of the body contact portion, occurrence of various problems caused by a substrate floating effect can be suppressed.

The MOS transistor shown in FIG. 52 is of the N-channel type, source/drain layer 15 is an N-type impurity region, and SOI layer 3 under gate electrode 12 is a P-type impurity region. The MOS transistor shown in FIG. 52 is basically the same as an NMOS transistor illustrated in FIG. 13, the same components are designated by the same reference numerals and their description will not be repeated.

The MOS transistor shown in FIG. 52 is a PD (Partially-Depleted) SOI-MOS transistor and has a characteristic that depletion layer DL just under gate electrode 12 does not reach buried oxide film 2 in normal operation. Because of the feature, the PDSOI-MOS transistor has excellent controllability on a threshold voltage.

Figure 53:
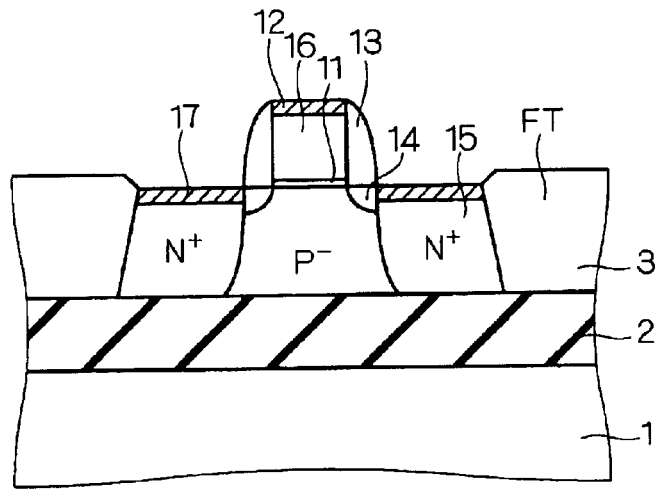

FIG. 53 is a cross section showing a MOS transistor surrounded by the FTI structure. Active region AR is surrounded by full isolation oxide film FT, and the NMOS transistor is electrically floated.

The MOS transistor shown in FIG. 53 is an FD (Fully-Depleted) SOI-MOS transistor in which the depletion layer just under gate electrode 12 reaches buried oxide film 2 in normal operation. Unlike the PDSOI-MOS transistor shown in FIG. 52, the depletion layer is not shown.

The FDSOI-MOS transistor has advantages of a good subthreshold characteristic and excellent switching operation. Moreover, since a parasitic bipolar effect is not good, it has also an advantage that resistance to a soft error is high.

E-2. Action and Effect

Therefore, in the system LSI, the PTI structure is employed for the random logic part, and the potential of the MOS transistor as the PDSOI-MOS transistor is fixed to the potential of the body contact portion, thereby obtaining a stable operation.

By using the FTI structure for the SRAM part and using the FDSOI-MOS transistor as the MOS transistor of the SRAM part, a MOS transistor having an excellent switching characteristic and high resistance to a soft error can be obtained.

Figure 54:
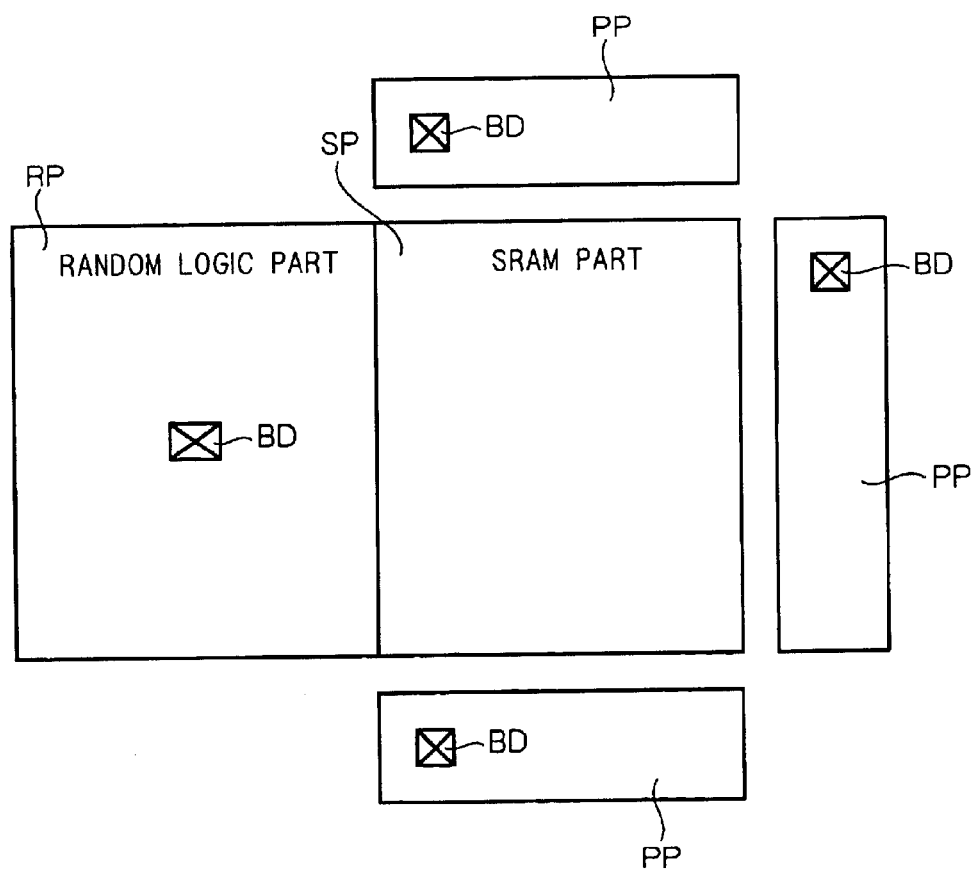
FIG. 54 is a plan view for explaining the configuration of the semiconductor device of the fifth embodiment according to the invention.

FIG. 54 schematically shows a plane layout of a system LSI having the configuration. As shown in FIG. 54, a random logic part RP has body contact portion BD. In contrast, an SRAM part SP does not have body contact portion BD.

In a peripheral circuit PP of SRAM part SP, the PTI structure is employed for the random logic part, and the potential of the MOS transistor as the PDSOI-MOS transistor is fixed to the potential of the body contact portion.

When the PDSOI-MOS transistor is applied to an I/O circuit, an analog circuit (PLL and sense amplifier), a timing circuit, a dynamic circuit, or the like, it is particularly effective.

E-3. Modification

The configuration that, in the system LSI, the PTI structure is employed for the random logic part, the potential of the MOS transistor of the random logic part is fixed to the body contact portion, the FTI structure is employed for the SRAM part, and a floating structure is obtained has been described above. In this case, the thickness of the SOI layer in the random logic part and that in the SRAM part are the same.

However, by properly changing the thickness of the SOI layer in accordance with the kind of a circuit, the characteristics of the PTI structure and FTI structure can be utilized more effectively.

For example, a semiconductor integrated circuit is constructed in which an analog circuit part is formed in a thick region of the SOI layer (thick film region) and is electrically isolated by the PTI structure, and a digital circuit part is formed in a thin region of the SOI layer (thin film region) and is electrically isolated by the FTI structure.

A process of manufacturing the semiconductor integrated circuit will be described hereinbelow by referring to FIGS. 55 to 61.

Figure 55:
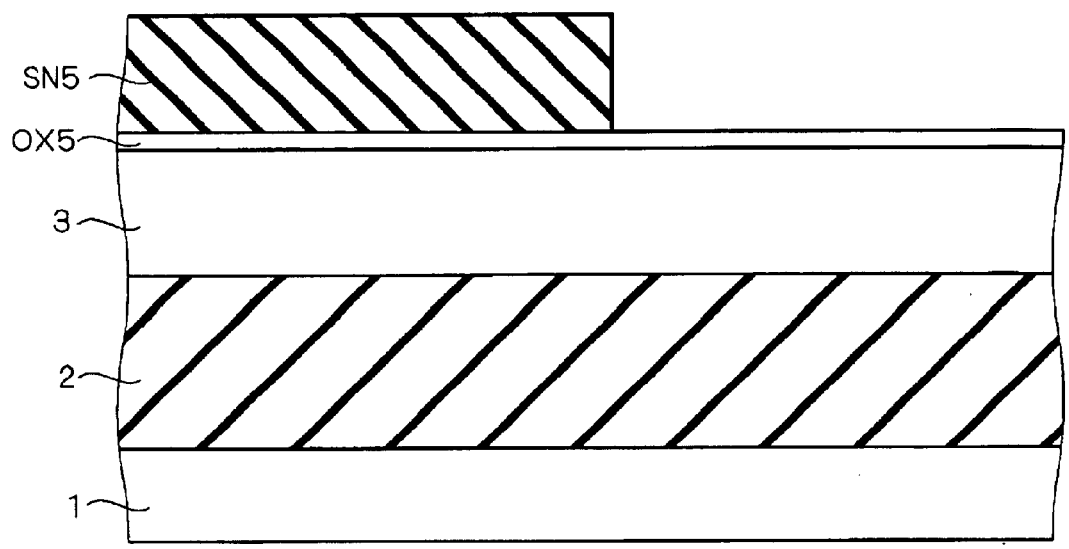
FIGS. 55 to 61 are cross sections for explaining a method of manufacturing the semiconductor device of the fifth embodiment according to the invention.

First, in the process shown in FIG. 55, an SOI substrate constructed by silicon substrate 1, buried oxide film 2 and SOI layer 3 is prepared, and an oxide film OX5 having a thickness of 5 to 30 nm is formed on SOI layer 3. Oxide film OX5 is an underlying oxide film for changing the thickness of SOI layer 3 in accordance with positions.

A nitride film mask SN5 of a thickness of 100 to 500 nm, having a pattern including an opening corresponding to a portion in which the thickness of SOI layer 3 is reduced is formed on oxide film OX5.

Figure 56:
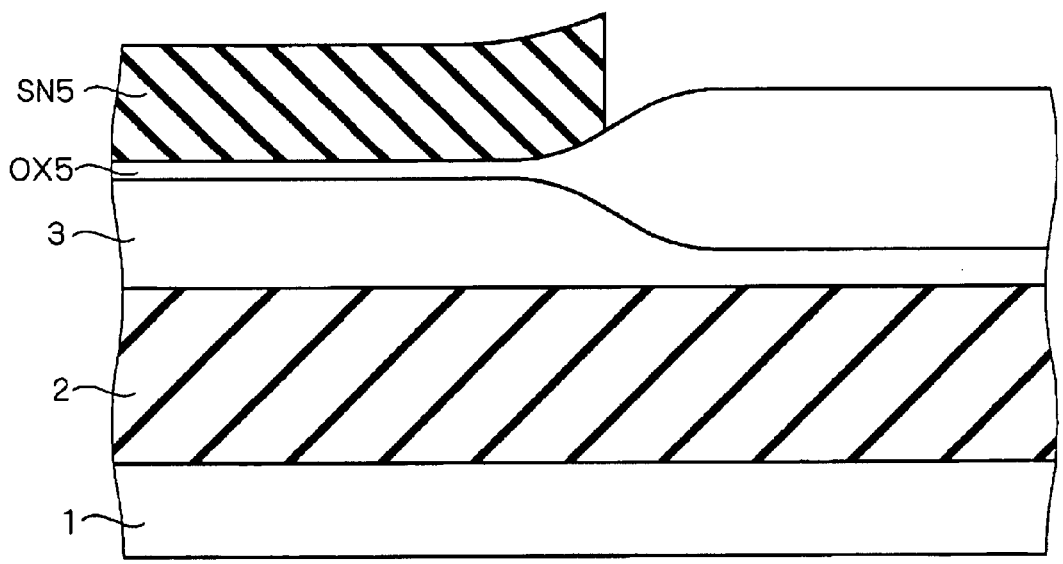

In a process shown in FIG. 56, by LOCOS (Local Oxide of Silicon) oxidation, oxide film OX5 in the portion which is not covered with nitride film SN5 is grown to thin SOI layer 3 in the portion. When the initial thickness of SOI layer 3 is 10 to 200 nm, the thickness of thinned SOI layer 3 becomes 10 to 50 nm.

Figure 57:
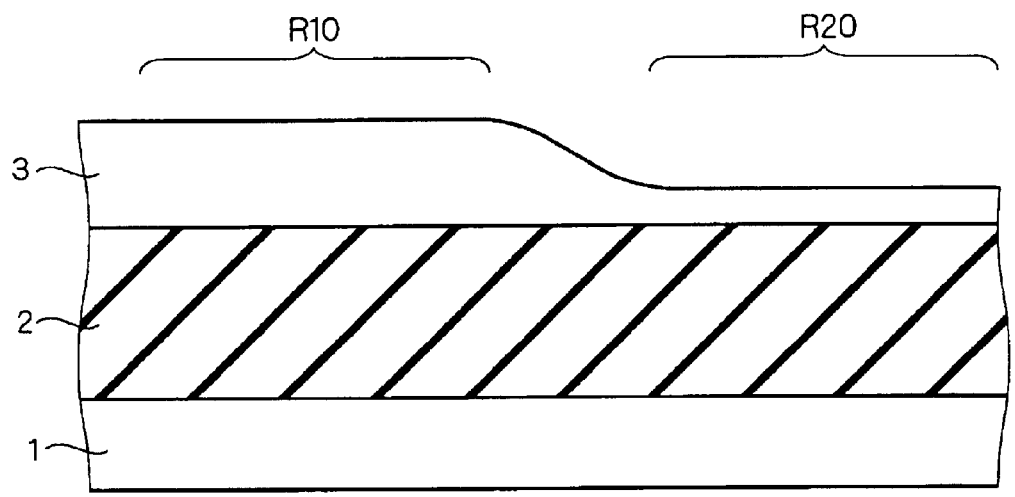

Subsequently, in a process shown in FIG. 57, nitride film SN5 and oxide film OX5 are removed. A region in which the initial thickness is maintained is called a thick film region R10, and the thinned region is called a thin film region R20.

Figure 58:
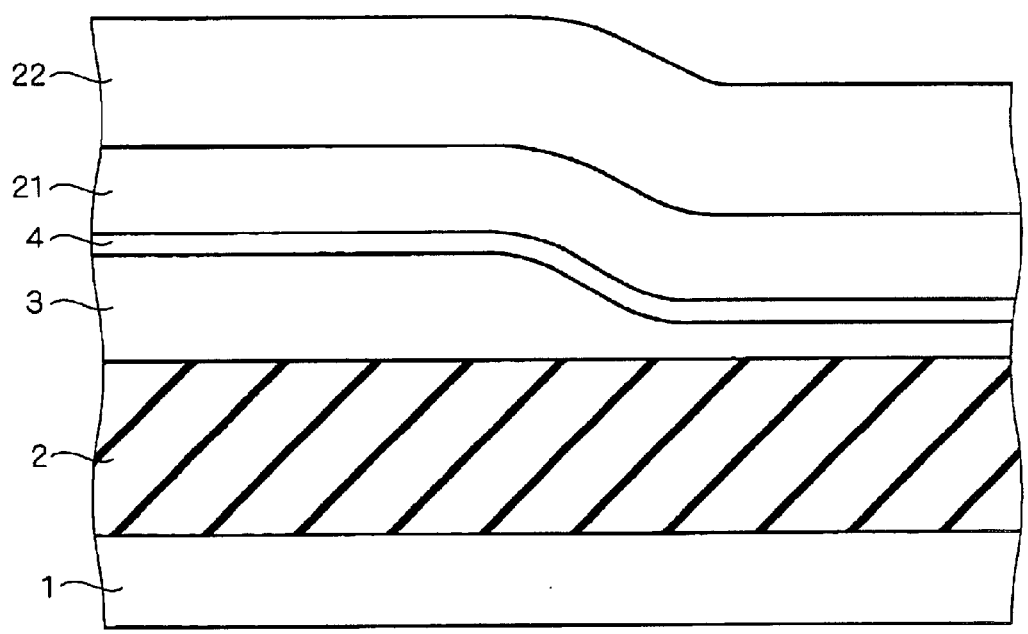

After that, in a process shown in FIG. 58, oxide film 4, polysilicon film 21, and nitride film 22 are sequentially formed on SOI layer 3. At this time, the step shape of SOI layer 3 is reflected and oxide film 4, polysilicon film 21, and nitride film 22 are formed with the step. Since those films have been described in the semiconductor device manufacturing method with reference to FIGS. 14 to 20, their description will not be repeated.

Figure 59:
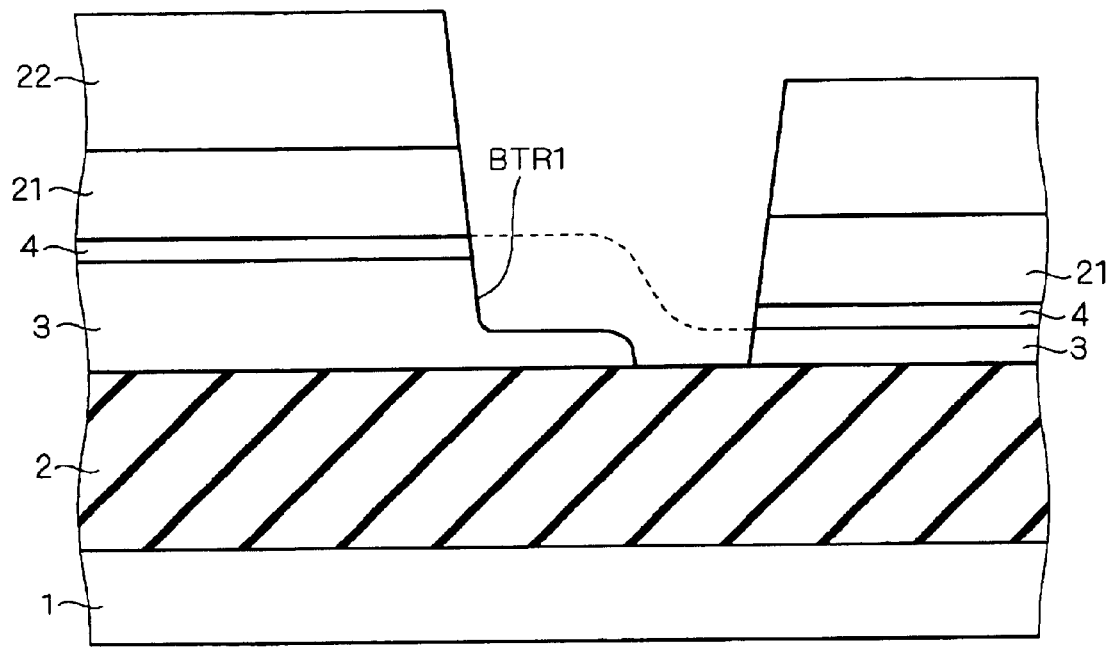

In a process shown in FIG. 59, a combined trench BTR1 is formed to form a combined isolation oxide film in the border between thick film region R10 and thin film region R20. Combined trench BTR1 includes a partial trench on the thick film region R10 side and a full trench on the thin film region R20 side.

Figure 60:
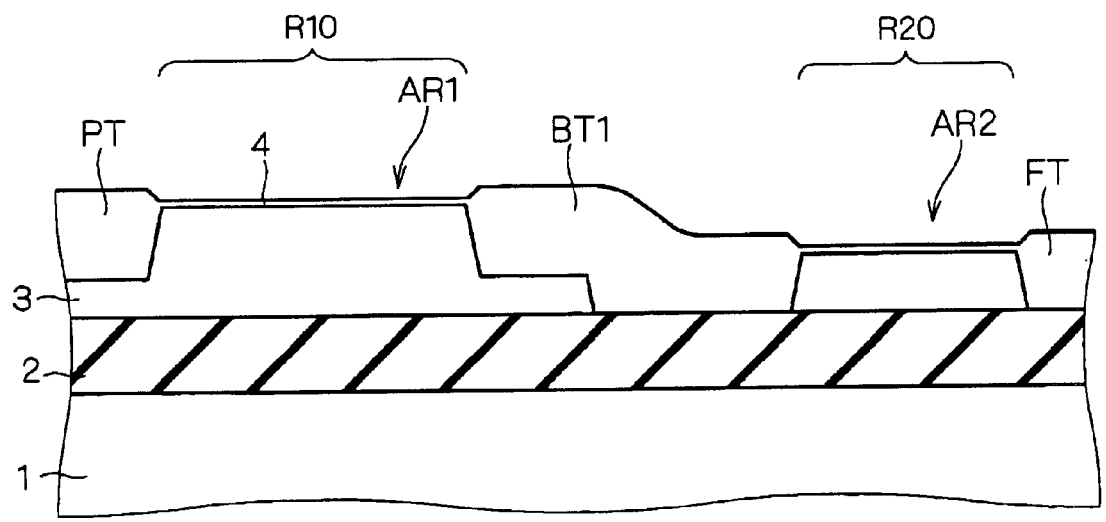

In a process shown in FIG. 60, combined trench BTR1 is buried by an HDP oxide film, the HDP oxide film is planarized, and nitride film 22 and polysilicon film 21 are removed, thereby obtaining final combined isolation oxide film BT1.

As shown in FIG. 60, simultaneously with the formation of combined isolation oxide film BT1, partial isolation oxide film PT is formed in thick film region R10, an active region AR1 is defined together with combined isolation oxide film BT1, full isolation oxide film FT is formed in thin film region R20, and combined isolation oxide film BT1 and active region AR2 are defined.

Figure 61:
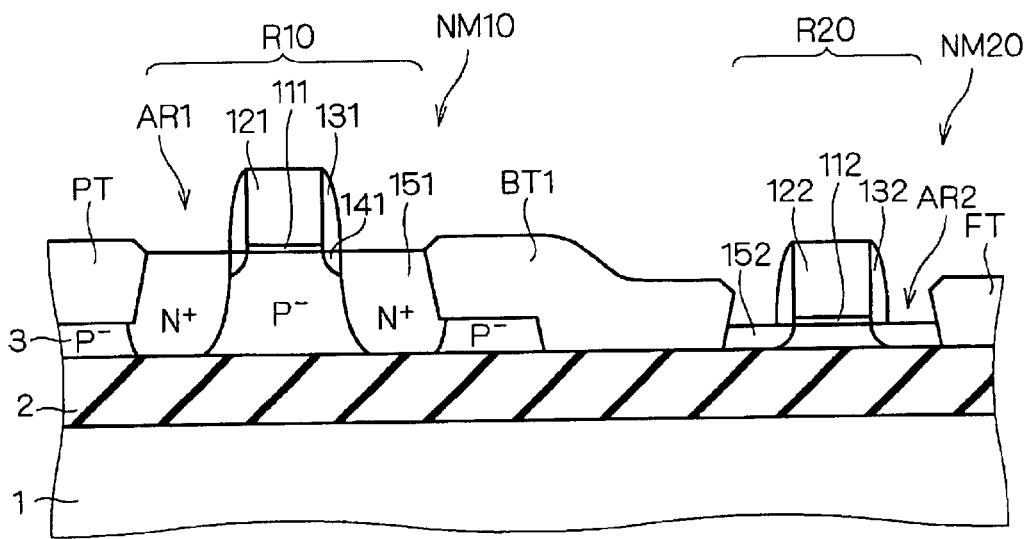

After that, as shown in FIG. 61, in active region AR1 in thick film region R10, a gate insulating film 111, a gate electrode 121, a side wall spacer 131, an (N-type) lightly doped drain layer 141, and an (N-type) source/drain layer 151 are formed, thereby forming an NMOS transistor NM10. In active region AR2 in thin film region R20, a gate insulating film 112, a gate electrode 122, a side wall spacer 132, and an (N-type) source/drain layer 152 are formed, thereby forming an NMOS transistor NM20.

Each of NMOS transistors NM10 and NM20 is a PD (Partially-Depleted) SOI-MOS transistor and has a feature that the depletion layer just under the gate electrode does not reach buried oxide film 2. Because of the feature, the PDSOI-MOS transistor has excellent controllability on the threshold voltage.

By the above processes, the analog circuit part is formed in the thick film region of the SOI layer and electrically isolated by the PTI structure, and the potential is fixed to the body contact portion. The digital circuit part is formed in the thin film region of the SOI layer and is electrically completely isolated by the FTI structure.

By employing such a configuration, in the analog circuit part, stability in operation of the MOS transistor and linearity are obtained, and the noise is reduced. Since the digital circuit part is formed in the thin film region of the SOI layer, the parasitic capacitance can be reduced, higher speed operation can be performed, and lower power consumption can be realized.

By forming the random logic part in the thick film region of the SOI layer and forming the SRAM part in the thin film region, the effects shown in the fifth embodiment can be obtained. In this case, by using the FDSOI-MOS transistor of full isolation as the MOS transistor of the SRAM part, an excellent switching characteristic is obtained and resistance to a soft error can be increased. In the case where the SRAM part is formed in the thick film region of the SOI layer and the body fixation is performed by partial isolation, by adjusting the thickness of the SOI layer, resistance to a soft error can be improved.

Figure 62:
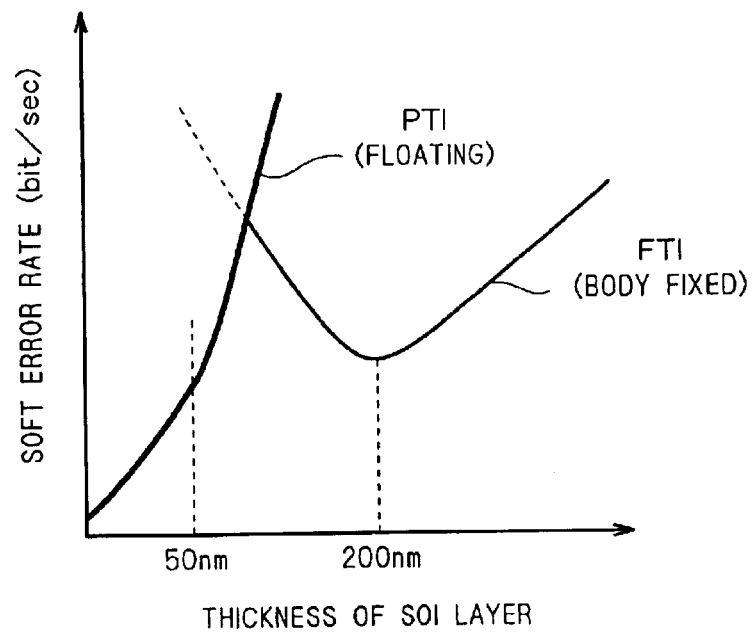
FIG. 62 is a diagram for explaining the optimum thickness of an SOI layer of the semiconductor device of the fifth embodiment according to the invention.

FIG. 62 shows dependency on thickness of the SOI layer of a soft error rate. In FIG. 62, the lateral axis indicates the thickness (nm) of the SOI layer, and the vertical axis indicates the soft error rate by the number of error bits per unit time (bits/sec).

As shown in FIG. 62, in the case where the active region is in a floating state in the PTI structure, when the SOI layer becomes thicker, the soft error rate also increases, and the rate of increase of the soft error rate increases after the thickness of 50 nm of the SOI layer. In the case where the potential of the active region is fixed to the potential of the body contact portion by the FTI structure, it is understood that the soft error rate becomes the lowest around the thickness of 200 nm of the SOI layer.

Therefore, by setting the thickness of the SOI layer in which the SRAM part is formed to 180 to 220 nm and performing the body fixation, resistance to a soft error can be improved.

F. Sixth Embodiment

F-1. Device Configuration

As described in the first to fifth embodiments, in the case of electrically isolating the MOS transistors by using the part isolation oxide film, since the SOI layer exists under the partial isolation oxide film between MOS transistors, if impurities are introduced to the SOI layer and electric resistance is lowered, there is the possibility that isolating power deteriorates.

Figure 63:
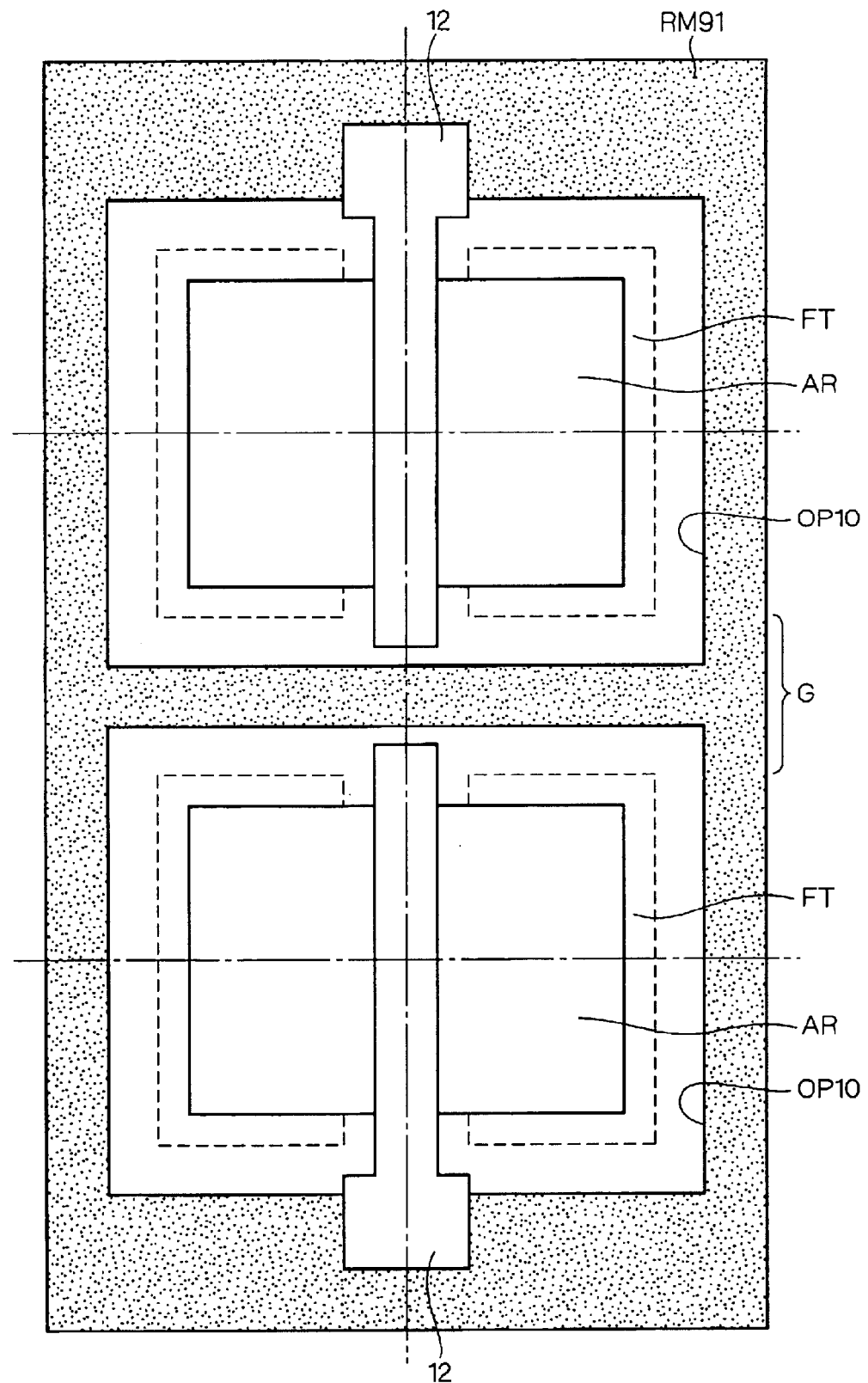
FIG. 63 is a cross section for explaining a method of manufacturing a semiconductor device of a sixth embodiment according to the invention.
Figure 64:
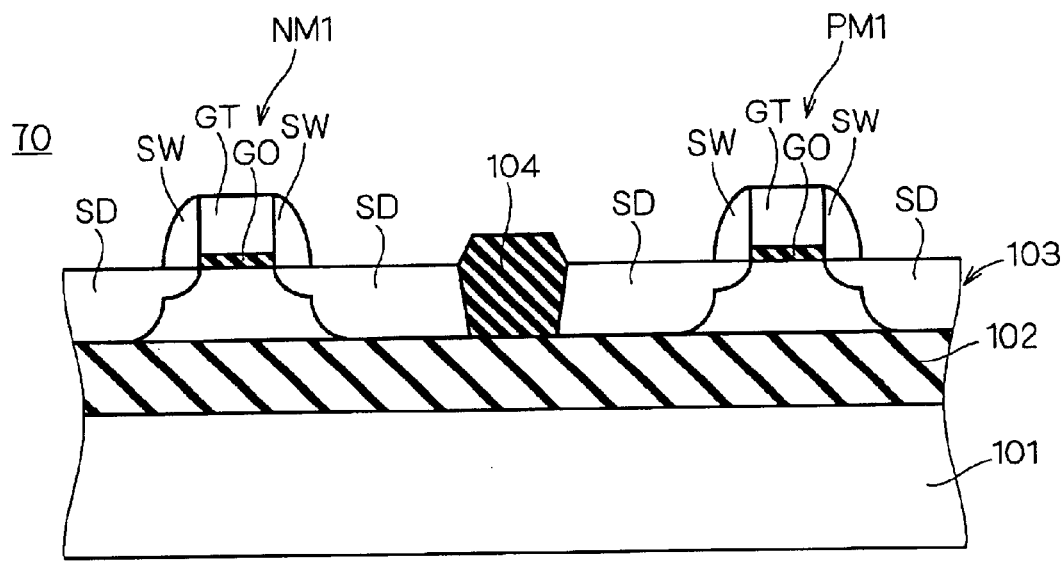
FIGS. 64 and 65 are cross sections for explaining the configuration of a conventional semiconductor device.
Figure 65:
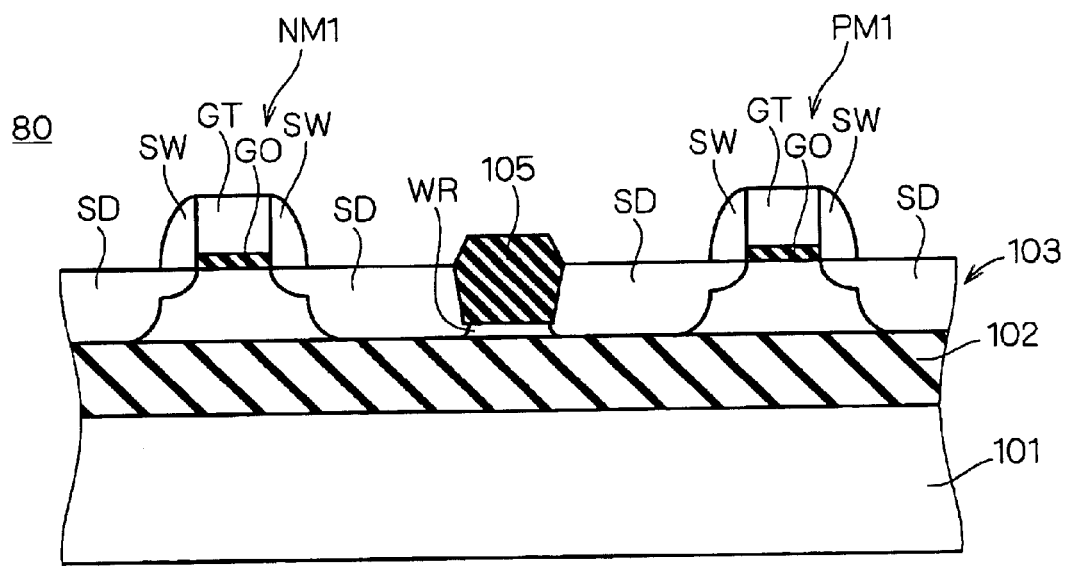
Figure 66:
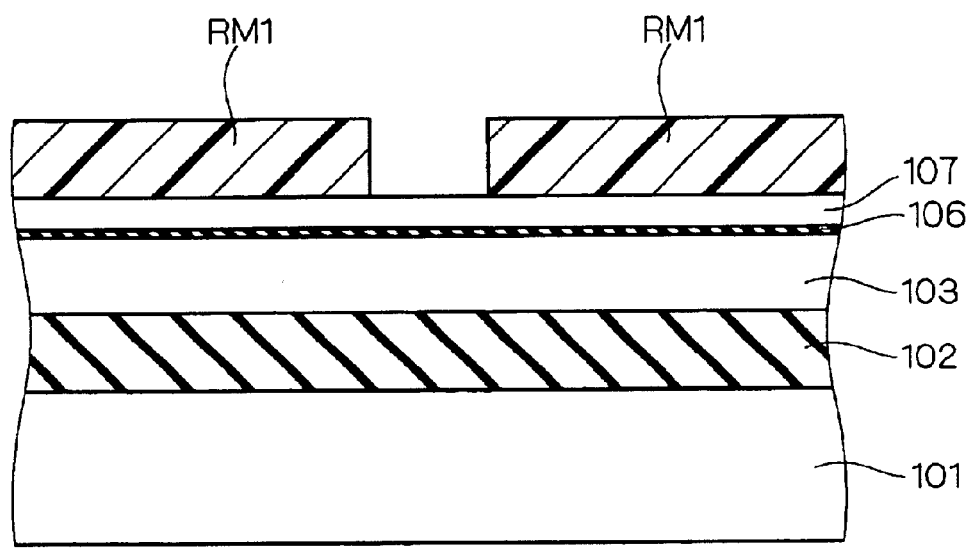
FIGS. 66 to 72 are cross sections for explaining a method of manufacturing the conventional semiconductor device.
Figure 67:
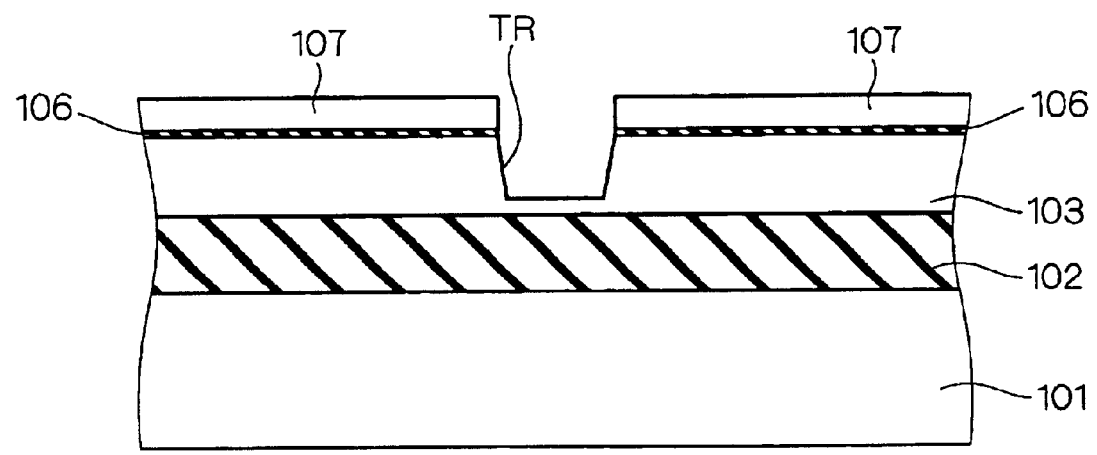
Figure 68:
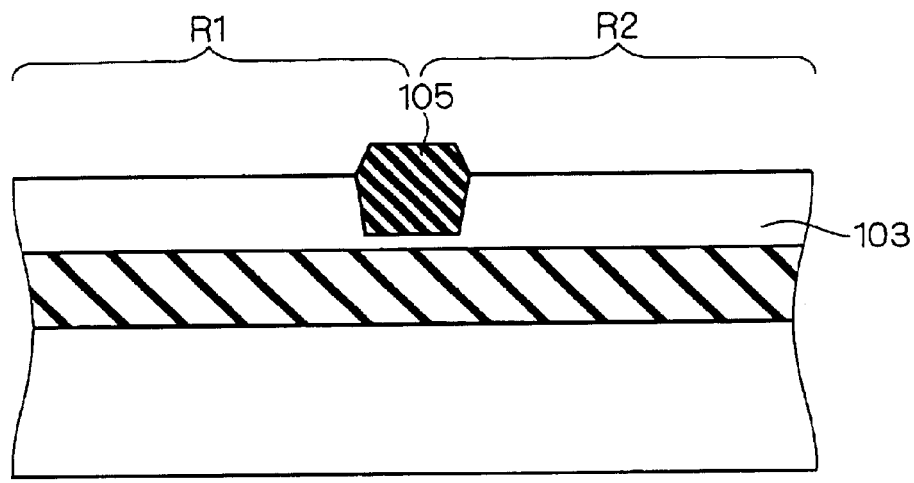
Figure 69:
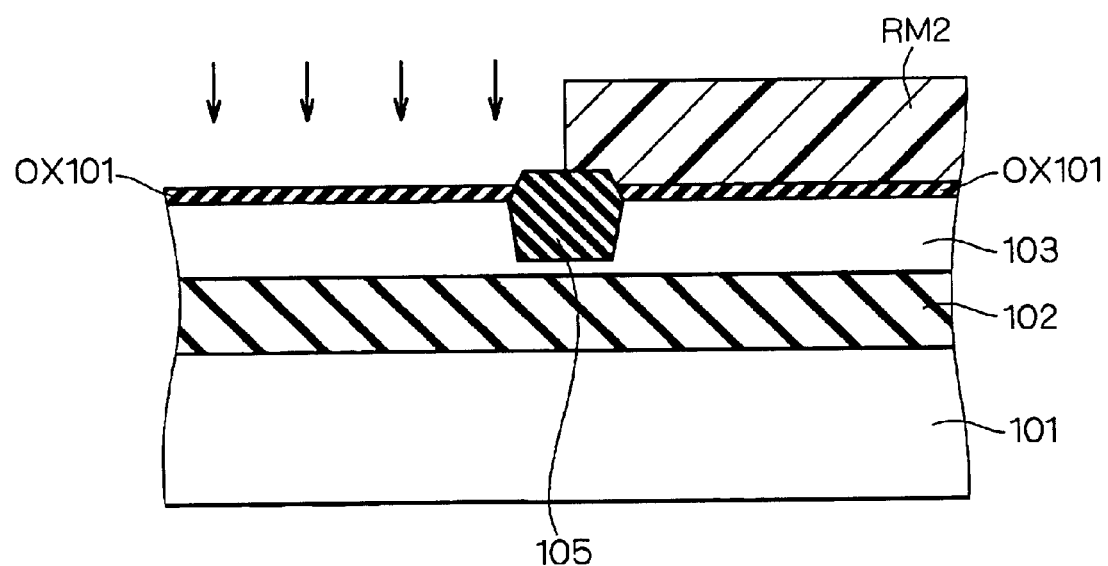
Figure 70:
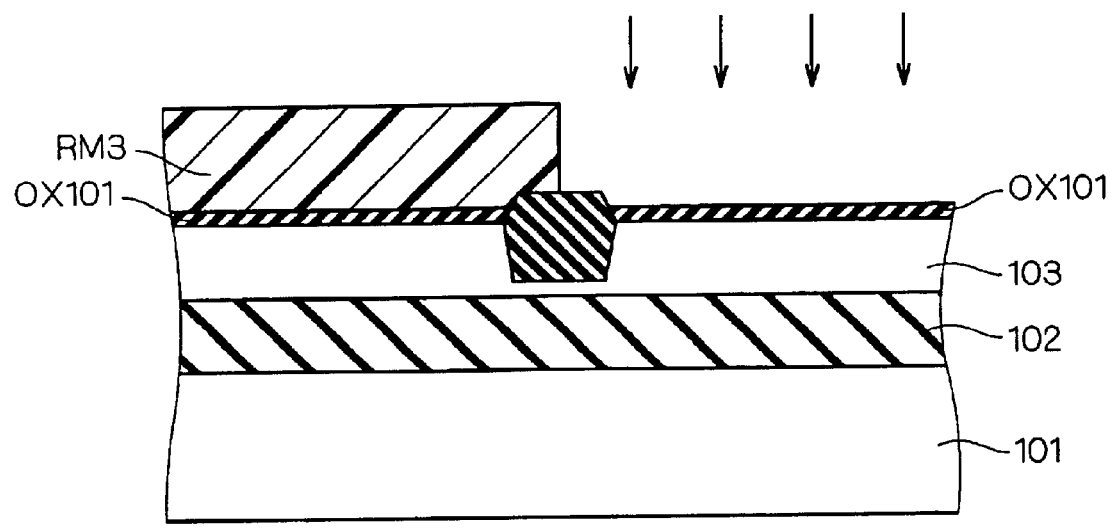
Figure 71:
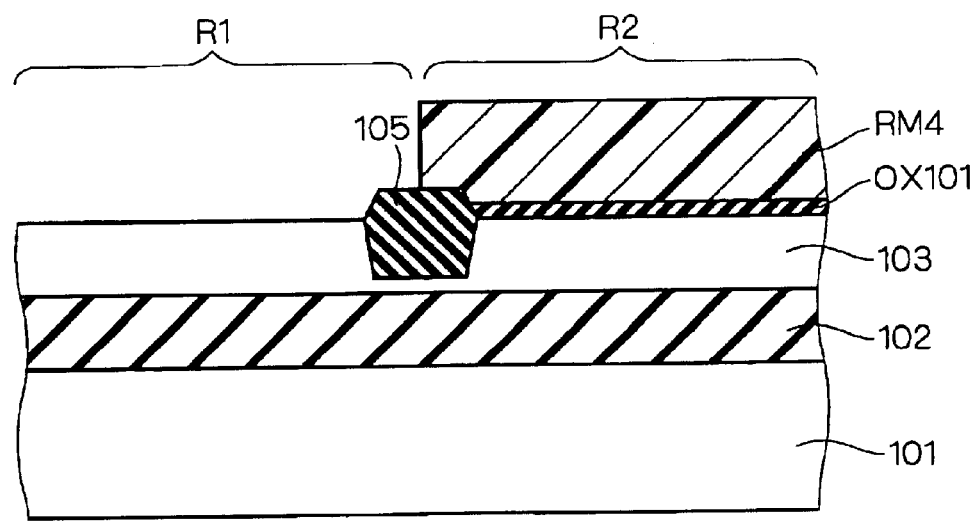
Figure 72:
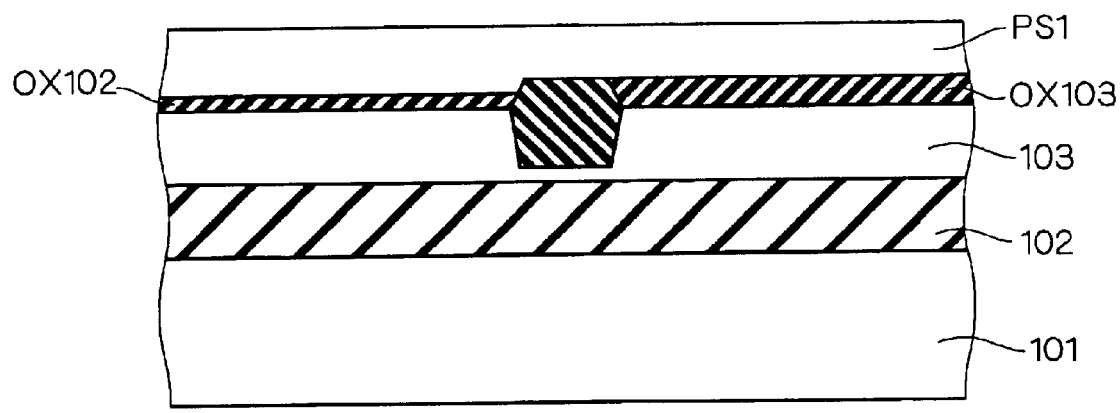
Figure 73:
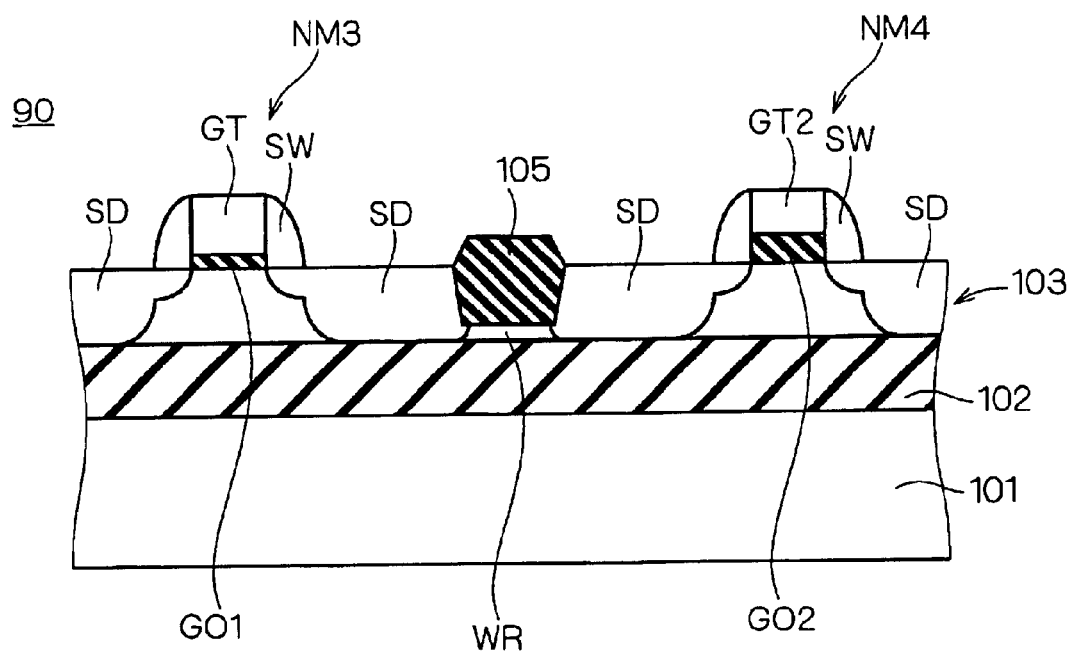
FIG. 73 is a cross section for explaining the configuration of the conventional semiconductor device.
Figure 74:
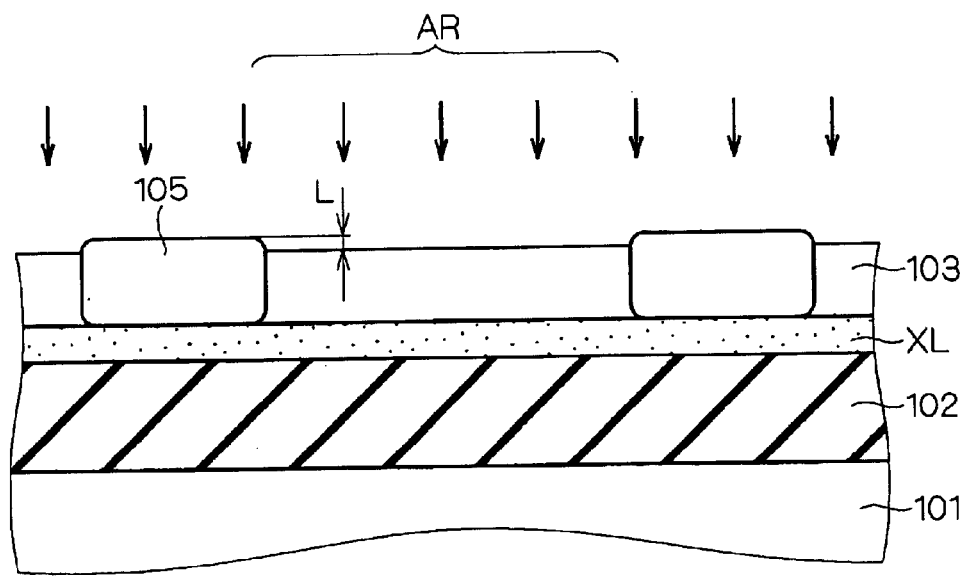
FIGS. 74 and 75 are cross sections for explaining problems of the conventional semiconductor device.
Figure 75:
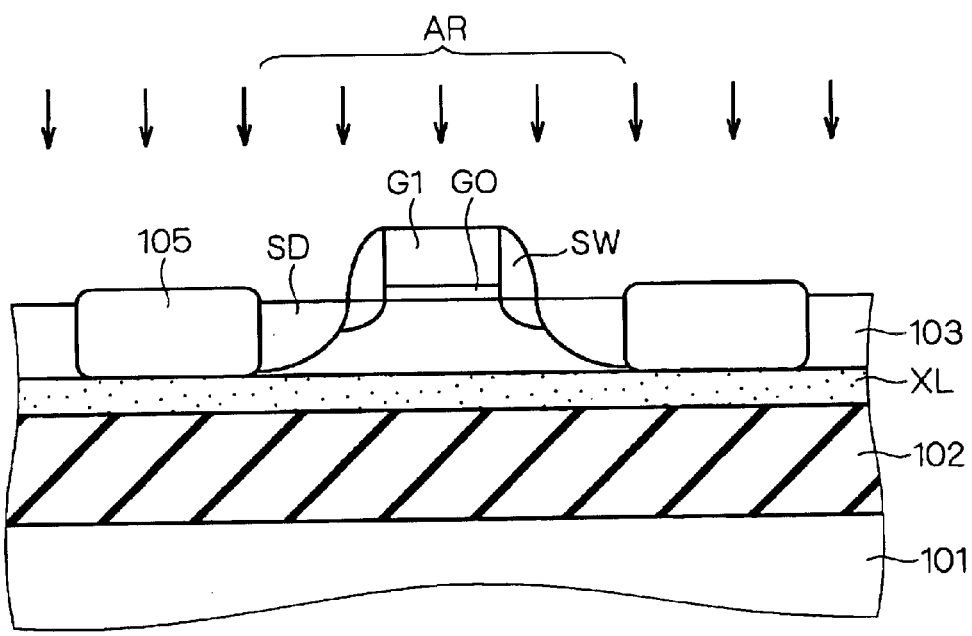

For example, as shown in FIG. 63, in the configuration where two MOS transistors are disposed adjacent to each other, the partial isolation oxide film is formed in a region G between active regions AR of the transistors. Consequently, if impurities for forming the source/drain layer are introduced into the SOI layer in the region, electric resistance deteriorates.

After designing a region to which an impurity is to be implanted by a CAD or the like, a negative mask in which the other region is a light shielding portion is generated. A positive resist is exposed to light by using the negative mask to generate an opening priority mask. At the time of source/drain impurity implantation, therefore, the source/drain impurity can be prevented from being implanted into region G between two MOS transistors.

FIG. 63 shows an example where a resist mask RM91 is provided as the opening priority mask. Through an opening OP10 in resist mask RM91, the source/drain impurity implantation is carried out. In FIG. 63, the same components as those described by referring to FIG. 31 are designated by the same reference numerals and their description will not be repeated.

Alternately, the opening priority mask may be generated by a method of designing a region to which impurities are to be implanted by a CAD or the like, generating a positive mask having a light shielding portion corresponding to the region, and exposing a negative resist to light by using the generated positive mask.

F-2. Action and Effect

As described above, by using the opening priority mask at the time of impurity implantation of a MOS transistor, impurities are prevented from being introduced into the SOI layer under the partial isolation oxide film other than the opening, electric resistance is prevented from being lowered, and isolating power can be maintained.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising a MOS transistor on an SOI layer of an SOI substrate obtained by sequentially stacking a semiconductor substrate, a buried insulating film, and said SOI layer, and a trench isolation oxide film which defines an active region serving as a region in which said MOS transistor is formed and electrically isolates said MOS transistor, the method comprising:

(a) forming an auxiliary film used for forming said trench isolation oxide film on said SOI layer; and (b) forming a trench penetrating said auxiliary film and reaching a predetermined depth in said SOI layer by trench etching, wherein said forming (b) includes measuring the thickness of said SOI layer at least once and controlling said trench etching during formation of said trench.

2. The method of manufacturing a semiconductor device according to claim 1, wherein said forming (b) includes:

(b-1) performing first etching for penetrating at least said auxiliary film, measuring a first thickness of said SOI layer remained and, on the basis of said first thickness of said SOI layer remained, determining an etching condition to reach said predetermined depth in said SOI layer by second etching; and (b-2) performing said second etching on the basis of said determined etching condition.

3. The method of manufacturing a semiconductor device according to claim 2, wherein said performing (b-1) includes calculating a etching time for said SOI layer as said etching condition, and said calculating said etching time comprises:

calculating a depth of over-etching performed by said first etching by subtracting said first thickness of the SOI layer remained from an initial thickness of said SOI layer;

calculating a depth to be etched performed by said second etching by subtracting the depth of said over-etching from a predetermined depth of said SOI layer; and dividing said depth to be etched by an etching rate for said SOI layer.

4. The method of manufacturing a semiconductor device according to claim 3, after said forming (b), further comprising:

(c) calculating the latest etching rate for said SOI layer; and (d) giving data of said latest etching rate to said performing (b-1) of a different manufacturing lot of said semiconductor device, wherein said calculating (c) further includes:

measuring a second thickness of said SOI layer remained;

calculating an etching depth by said second etching by subtracting said second thickness of the SOI layer remained from said first thickness of the SOI layer remained; and dividing said etching depth by said etching time.

5. The method of manufacturing a semiconductor device according to claim 1, wherein said forming (b) includes: after said auxiliary film is etched;

(b-1) performing first etching on said SOI layer to a depth which does not reach said predetermined depth, measuring the first thickness of said SOI layer remained and, on the basis of said first thickness, determining an etching condition used to etch said SOI layer to said predetermined depth by second etching; and (b-2) performing said second etching on the basis of said determined etching condition.

6. A method of manufacturing a semiconductor device comprising a MOS transistor on an SOI layer of an SOI substrate obtained by sequentially stacking a semiconductor substrate, a buried insulating film, and said SOI layer, and a trench isolation oxide film which defines an active region serving as a region in which said MOS transistor is formed and electrically isolates said MOS transistor, comprising:

(a) forming an auxiliary film used for forming said trench isolation oxide film on said SOI layer;

(b) forming a trench penetrating said auxiliary film and reaching a predetermined depth in said SOI layer by trench etching;

(c) measuring a thickness of said SOI layer remained after formation of said trench and, on the basis of said thickness of said SOI layer remained, calculating the latest etching rate for said SOI layer; and (d) giving data of said latest etching rate to said trench etching step of a different manufacture lot of said semiconductor device.

7. The method of manufacturing a semiconductor device according to claim 6, wherein said measuring (c) includes:

calculating an etching depth of said etching by subtracting said thickness of said SOI layer remained from an initial thickness of said SOI layer; and dividing said etching depth by etching time of said SOI layer.

* * * * *